US011975979B2

(12) United States Patent
Ren et al.

(10) Patent No.: US 11,975,979 B2
(45) Date of Patent: May 7, 2024

(54) UNUSUAL HIGH THERMAL CONDUCTIVITY IN BORON ARSENIDE BULK CRYSTALS

(71) Applicant: University of Houston System, Houston, TX (US)

(72) Inventors: Zhifeng Ren, Pearland, TX (US); Fei Tian, Houston, TX (US); Gang Chen, Carlisle, MA (US); Bai Song, Cambridge, MA (US); Ke Chen, Cambridge, MA (US); Li Shi, Austin, TX (US); Xi Chen, Austin, TX (US); Sean Sullivan, Austin, TX (US); David Broido, Needham, MA (US); Navaneetha Krishnan Ravichandran, Chestnut Hill, MA (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 657 days.

(21) Appl. No.: 17/252,360

(22) PCT Filed: Jun. 20, 2019

(86) PCT No.: PCT/US2019/038141
§ 371 (c)(1),
(2) Date: Dec. 15, 2020

(87) PCT Pub. No.: WO2020/068200
PCT Pub. Date: Apr. 2, 2020

(65) Prior Publication Data
US 2021/0269318 A1    Sep. 2, 2021

Related U.S. Application Data

(60) Provisional application No. 62/687,662, filed on Jun. 20, 2018, provisional application No. 62/717,722, filed on Aug. 10, 2018.

(51) Int. Cl.
*C30B 29/40* (2006.01)
*C01B 35/04* (2006.01)

(52) U.S. Cl.
CPC .............. *C01B 35/04* (2013.01); *C30B 29/40* (2013.01); *C01P 2004/61* (2013.01); *C01P 2006/32* (2013.01)

(58) Field of Classification Search
CPC ......... C01B 35/04; C30B 29/40; C30B 25/00; C30B 29/00; C01P 2004/61; C01P 2006/32; C01G 28/00
(Continued)

(56) References Cited

U.S. PATENT DOCUMENTS

| 4,381,214 A | 4/1983 | Christie et al. |
| 4,591,408 A | 5/1986 | Michel et al. |
| 2007/0257333 A1 | 11/2007 | Schlesser et al. |

OTHER PUBLICATIONS

T. L. Chu, A. E. Hyslop. "Crystal Growth and Properties of Boron Monoarsenide." J. Appl. Phys. Feb. 1, 1972; 43 (2): 276-279. https://doi.org/10.1063/1.1661106 (Year: 1972).*
(Continued)

Primary Examiner — Anthony J Zimmer
Assistant Examiner — Zachary John Baum
(74) Attorney, Agent, or Firm — CONLEY ROSE, P.C.

(57) ABSTRACT

A method for growing bulk boron arsenide (BA) crystals, the method comprising utilizing a seeded chemical vapor transport (CVT) growth mechanism to produce single BAs crystals which are used for further CVT growth, wherein a sparsity of nucleation centers is controlled during the further CVT growth. Also disclosed are bulk BAs crystals produced via the method.

27 Claims, 43 Drawing Sheets

(58) Field of Classification Search
USPC .......................................... 123/87, 278, 289
See application file for complete search history.

(56) References Cited

OTHER PUBLICATIONS

Bing LV, Yucheng Lan, Xiqu Wang, Qian Zhang, Yongjie Hu, Allan J. Jacobson, David Broido, Gang Chen, Zhifeng Ren, Ching-Wu Chu. "Experimental study of the proposed super-thermal-conductor: BAs." Appl. Phys. Lett. Feb. 16, 2015; 106 (7): 074105. https://doi.org/10.1063/1.4913441 (Year: 2015).*

Jessica R. Panella, Benjamin A. Trump, Guy G. Marcus, and Tyrel M. McQueen. "Seeded Chemical Vapor Transport Growth of Cu2OSeO3." Crystal Growth & Design 2017 17 (9), 4944-4948. DOI: 10.1021/acs.cgd.7b00879 (Year: 2017).*

PCT/US2019/038141 International Search Report and Written Opinion dated Apr. 14, 2020 (2483-11402) (16 p.).

Tian, Fei et al., "Seeded Growth of Boron Arsenide Single Crystals with High Thermal Conductivity," Applied Phys. Lett. vol. 112(3), pp. 3-4, Jan. 16, 2018 (2483-11402) (16 p.).

Xing, Jie et al., "Multimillimeter-Sized Cubic Boron Arsenide Grown by Chemical Vapor Transport via a Tellurium Tetraiodide Transport Agent," Applied Phys. Lett., May 30, 2018 (2483-11402) (11 p.).

Mallik, Awadesh Kumar et al., "Effect of Seed Size, Suspension Recycling, and Substrate Pre-Treatment on the CVD Growth of Diamond Coatings," Open Journal of Applied Sciences, 2015, vol. 5(12) (2483-11402) (18 p.).

Wang, Shijun et al., "Synthesis and Characterization of a p-Type Boron Arsenide Photoelectrode," Journal of the American Chemical Society, Jun. 21, 2012, vol. 134(27) (2483-11402) (10 p.).

Gamage, G.A. et al., "Effect of Nucleation Sites on the Growth and Quality of Single-Crystal Boron Arsenide," Materials Today Physics, vol. 11, Dec. 2019 (2483-11402) (2 p.).

* cited by examiner

UNUSUAL HIGH THERMAL CONDUCTIVITY IN BORON ARSENIDE BULK CRYSTALS

CROSS-REFERENCE TO RELATED APPLICATIONS

This application is a 35 U.S.C. § 371 national stage application of PCT/US2019/038141 filed Jun. 20, 2019, which claims benefit of U.S. provisional patent application Ser. No. 62/687,662, filed Jun. 20, 2018, and entitled "Unusual High Thermal Conductivity in Boron Arsenide Bulk Crystals." and U.S. provisional patent application Ser. No. 62/717,722, filed Aug. 10, 2018, and entitled "Unusual High Thermal Conductivity in Boron Arsenide Bulk Crystals," each of which is hereby incorporated herein by reference in its entirety for all purposes.

STATEMENT REGARDING FEDERALLY SPONSORED RESEARCH OR DEVELOPMENT

This invention was made with government support under MURI grant N00014-16-1-2436 awarded by the Office of Naval Research. The Government has certain rights in the invention.

TECHNICAL FIELD

The present disclosure relates to materials with high thermal conductivity; more particularly, the disclosure relates to boron arsenide bulk crystals; still more particularly, this disclosure relates to a method of forming boron arsenide bulk crystals.

BACKGROUND

Materials with high thermal conductivity ($\square$) can help to address a range of grand technological challenges, such as removing the high-density heat generated in nanoelectronic devices to keep them cool. At room temperature (RT), diamond and graphite, the two carbon allotrope bulk crystals, have a record high $\square$ of about 2000 W m$^{-1}$ K$^{-1}$. However, high quality natural diamond is scarce and expensive. While future technological advance may help to alleviate the cost of high-quality synthetic diamond, the large mismatch in the coefficient of thermal expansion between diamond and common semiconductors can introduce large thermal stresses. Meanwhile, the $\square$ of graphite is highly anisotropic with the cross-plane value being two orders of magnitude smaller than the corresponding in-plane value. The thermal anisotropy and the weak interlayer bonding have limited the use of graphite for thermal management. In addition, the electrically insulating property of diamond and semi-metallic behavior of graphite prevent their use as active electronic materials. Common electronic materials such as copper and silicon have a RT $\square$ of about 400 W m$^{-1}$ K$^{-1}$ and 150 W m$^{-1}$ K$^{-1}$, respectively, which are well below the diamond value. The highest measured RT $\square\square$ values for semiconductors are about 490 W m$^{-1}$ K$^{-1}$ in silicon carbide and 460 W m$^{-1}$ K$^{-1}$ in boron phosphide. Although these values are comparable to the highest electronic contribution to $\square$ in metals, it is desirable to discover semiconductors with $\square$ comparable to the ultrahigh value for diamond.

Accordingly, a need exists for semiconductors with thermal conductivity ($\square$) comparable to the ultrahigh value for diamond, and methods for making such semiconductors.

SUMMARY

In an embodiment, a method for growing bulk boron arsenide (BA) crystals includes utilizing a seeded chemical vapor transport (CVT) growth mechanism to produce single BAs crystals, and using at least a portion of the single BAs crystals for further CVT growth to produce a bulk BAs crystal. A sparsity of nucleation centers is controlled during the further CVT growth.

In an embodiment, a bulk BAs crystal comprises a single BAs crystal having at least one dimension greater than 2 mm.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

the average experimental data (circles). Panel (c) illustrates the additional results of directly fitting (solid line) the average experimental data (circles).

Figure 41:
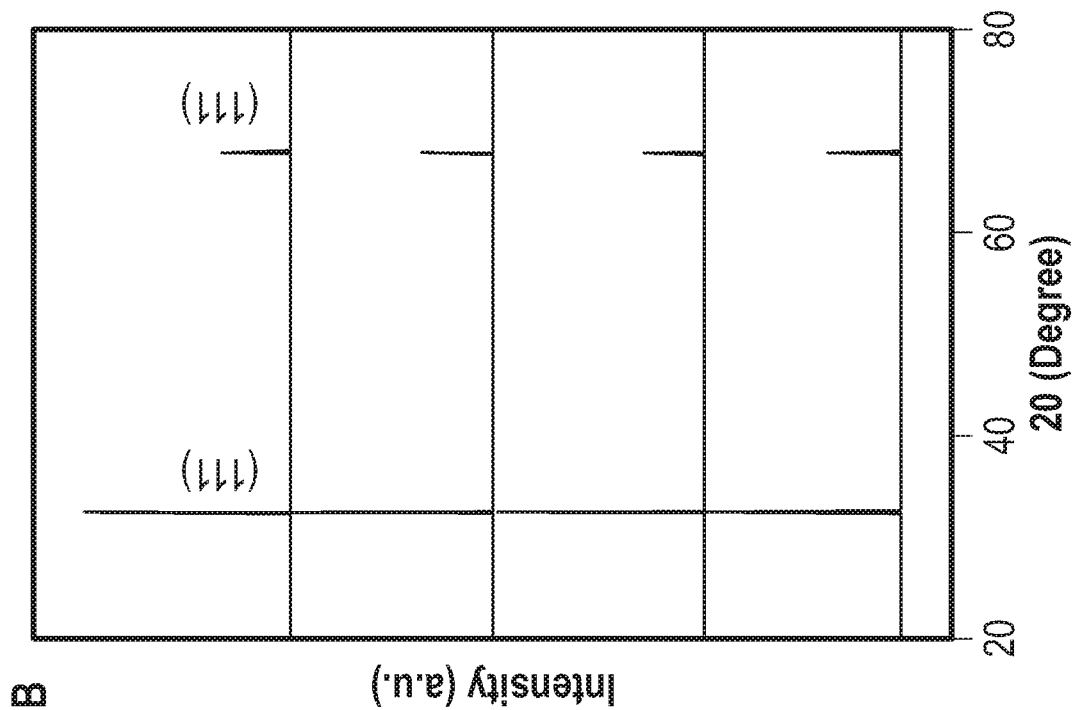

FIG. 41 illustrates BAs single crystals along with the X-ray diffraction patterns. Panel (a) illustrates the photos of the large-sized bulk BAs single crystals, and Panel (b) shows the X-ray diffraction patterns of the corresponding BAs single crystals.

Figure 42:
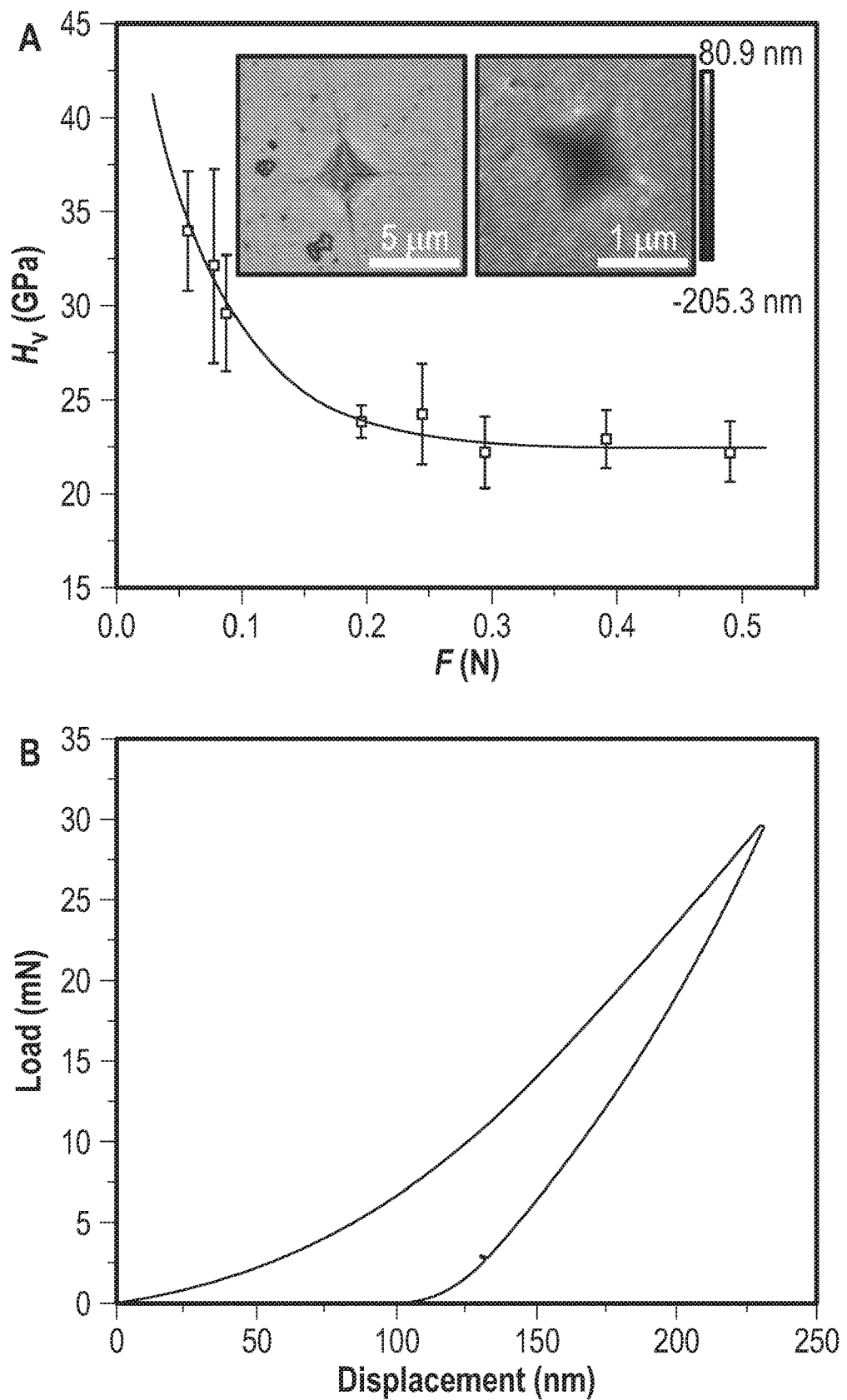

FIG. 42 illustrates the properties of BAs crystals. Panel (a) illustrates the Hv of the {111} crystal plane of a bulk BAs crystal as a function of applied load, and Panel (b) illustrates the loading/unloading displacement curves obtained from a standard Berkovish diamond indenter.

DETAILED DESCRIPTION

It should be understood at the outset that although an illustrative implementation of one or more exemplary embodiments are provided below, the disclosed compositions, methods, and/or products may be implemented using any number of techniques, whether currently known or in existence. The disclosure should in no way be limited to the illustrative implementations, drawings, and techniques illustrated hereinbelow, including the exemplary designs and implementations illustrated and described herein, but may be modified within the scope of the appended claims along with their full scope of equivalents.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

Overview

Conventional theory predicts that ultrahigh lattice thermal conductivity can only occur in crystals composed of strongly-bonded light elements, and that it is limited by anharmonic three-phonon processes. Experimental evidence that is a departure from these long-held criteria is herein disclosed. A local thermal conductivity exceeding 1000 W m$^{-1}$ K$^{-1}$ and an average bulk value reaching 900 W m$^{-1}$ K$^{-1}$ in bulk boron arsenide (BAs) crystals, where boron and arsenic are light and heavy elements, respectively, at room temperature has been unexpectedly discovered. The high values are consistent with a proposal for phonon band engineering and can only be explained with higher order phonon processes in the compound semiconductor that contains both light boron and heavy arsenic elements.

In semiconductors and non-magnetic insulators, the thermal conductivity is dominated by the phonon contribution. Thermal conductivity is typically limited by the lowest-order process arising from the anharmonicity of the interatomic potential, three-phonon scattering, at and above RT. According to the criteria established by Slack about half century ago, only crystals composed of strongly-bonded light elements would exhibit ultrahigh $\square$. However, Lindsay, Broido, and Reinecke recently proposed that ultrahigh $\square$ could be achieved in compounds that combine a light and a heavy atom if (i) the frequency gap between heat-carrying acoustic phonons and optic phonons was sufficiently large, and (ii) some of the acoustic phonons with different polarizations had regions of similar frequencies away from the Brillouin zone center. First principles calculations supported this phonon band engineering concept in predicting that cubic boron arsenide (BAs) should have a RT $\square$ of around 2000 W m$^{-1}$ K$^{-1}$ when only three-phonon interaction is considered. Subsequent theoretical calculations found that four-phonon scattering lowered the calculated RT $\square$ in BAs to about 1400 W m$^{-1}$ K$^{-1}$, which is still exceptionally high but surprising since three-phonon scattering accurately describes the measured $\square\square$ data for many semiconductors and insulators, and higher-order processes are expected to be weak at RT.

Synthesis of high-quality BAs bulk crystals has proved challenging, which has prevented experimental verification of the unusual predicted transport properties. Several measurements attained RT $\square$ values of only 200-350 W m$^{-1}$ K$^{-1}$ in small BAs particles. The inability to measure an ultrahigh $\square$ for BAs limited adoption of the phonon band engineering strategy as a viable new route for achieving ultrahigh $\square$, and the possibility of higher order processes suppressing $\square\square$ remained.

Herein-disclosed is a method of growing BAs bulk crystals from seed microparticles in a chemical vapor transport (CVT) process. Also disclosed herein is experimental evidence that clearly validates the phonon band engineering route. In embodiments, local measurements of low-defect regions indicate that the herein-disclosed method provides bulk Bas crystals have a RT u that exceeds 1000 W m$^{-1}$ K$^{-1}$, while multiple local and bulk transport measurement methods yielded average RT $\square$ values of about 800 and 900 W m$^{-1}$ K$^{-1}$ for two bulk crystal samples. The bulk BAs crystal has a high $\square$ despite twin boundaries and other defects known to decrease $\square$. Both the peak and average $\square$ values of the bulk Bas crystals grown via the herein-disclosed method show a rapid decrease with increasing temperature, which is a clear signature of lattice anharmonicity. This behavior agrees with a detailed first principles theoretical model that includes both three- and four-phonon interactions.

Previously reported synthesis efforts of BAs yielded only particles with the maximum dimension less than about 500 $\square$m. However, bulk-size crystals are required for device applications. In embodiments of this disclosure, a seeded CVT growth mechanism for the synthesis of bulk BAs crystals is provided. In embodiments, single BAs crystals are utilized as seeds to ensure that nucleation centers are sparse and under control during the growth process.

In embodiments, the seeded CVT growth mechanism comprises growing the single BAs crystals in a tube furnace with a temperature gradient for vapor transport. In embodiments, the seeded CVT growth mechanism further comprises positioning source materials comprising boron and arsenic at one end or 'source material side' of a fused quartz tube and the single BAs crystals at the other end or 'seed side' of the tube to serve as seed crystals. The source materials can comprise pure boron bulk particles, arsenic lumps, and iodine powder. In embodiments, the ratio of arsenic to iodine (As:I) is about 5:1 to 50:1; 20:1. In some embodiments, the iodine can be present at a concentration of between about 30 to 70 mg per cm$^3$ of tube volume, or about 50 mg per cm$^3$ of tube volume. In some embodiments, a ratio of As:B can be between about 1:1 and about 1.5:1, or about 1.2:1. In embodiments, the method further comprises sealing the quartz tube under vacuum and placing the sealed quartz tube in a tube furnace. In embodiments, the vacuum comprises a pressure of about 10$^{-1}$ Torr. In embodiments, the tube furnace is a horizontal tube furnace. In embodiments, the method further comprises establishing and maintaining the temperature gradient by setting the seed side of the tube at a temperature in a range of from about 650° C. to 900° C.

(e.g., 780° C.) and the source material side at a temperature in a range of from 800° C. to 1000° C. (e.g., 890° C.).

In embodiment, the CVT growth mechanism includes a first growth period for a first time duration and/or a second growth period for a second time duration. In embodiments, a first or 'seed growth' period is followed by a second or 'bulk crystal growth' period during which bulk BAs crystals are grown from seed crystals grown during the first or seed growth period. In embodiments, the first or 'seed growth' period, the second or 'bulk crystal growth' period, or both comprise a time duration of about 1-100, for example, about 14 days. In embodiments, the first time duration, the second time duration, or both comprise from about one to one hundred (1 to 100) days (e.g., fourteen (14) days).

In embodiments, the method further comprises growing the single BAs crystals during the first growth period, and utilizing the resulting BAs crystals from the seed side of the quartz tube to seed a second growth period. In embodiments, the method comprises controlling and/or optimizing seed crystal quality and distribution during the second growth period to obtain the bulk BAs crystals.

In embodiments, utilizing the resulting BAs crystals from the seed side of the quartz tube to seed the second growth period comprises removing single BAs crystals from the seed side after the first growth period, cleaning the removed BAs crystals, and selecting highest quality BAs crystals for positioning on the seed side of the quartz tube during the second growth period. In embodiments, highest quality BAs crystals are selected based on their thermal conductivities, carrier concentrations, electrical conductivities, surface conditions, colors, sizes, morphologies, and/or densities. Cleaning the BAs crystals can comprise washing with nitric acid and/or aqua regia, rinsing with an alcohol (e.g., ethanol) and/or deionized water, or both.

In embodiments, utilizing the resulting BAs crystals from the seed side of the quartz tube to seed the second growth period comprises selecting a few or less than about 5, 4, 3, 2, or 1 of the single BAs crystals from the seed side of the quartz tube as seeds during the second growth period. In embodiments, two of the single BAs crystals from the seed side of the quartz tube obtained via the first growth period are utilized as seeds for the second growth period.

In embodiments, the single BAs crystals from the seed side of the quartz tube that are utilized as seeds for the second growth period are positioned a specific distance apart on the seed side of the quartz tube for the second growth period. The specific distance apart can comprise from about 0.1 to about 10 centimeters. In embodiments, the specific distance apart can comprise about 5, 4, 3, 2, 1, or 0.5 centimeter (cm).

In embodiments, the single BAs crystals have a lateral dimension of a few micrometers, several micrometers, or less than or equal to 5, 4, 3, 2, or 1 micrometer. In embodiments, seed crystal quality and distribution are controlled/optimized to obtain large BAs crystals. In embodiments, the large BAs crystals have a size of at least about $4 \times 2 \times 1$ mm$^3$. In embodiments, the herein disclosed method provides bulk BAs crystals having a large BAs crystal size that enables utilization of transport measurement techniques established for bulk samples. In embodiments, increasing the growth time (e.g., for the second or crystal growth period) is utilized to increase the crystal size of the resulting bulk BAs crystals. In some embodiments, the BAs crystals can have a zinc-blende and/or cubic structure. In embodiments, the bulk BAs crystals have a local room temperature thermal conductivity exceeding 800 W m$^{-1}$ K$^{-1}$, 900 W m$^{-1}$ K$^{-1}$, or 1000 W m$^{-1}$ K$^{-1}$. In embodiments, the bulk BAs crystals have an average bulk thermal conductivity of about 800 W m$^{-1}$ K$^{-1}$, 850 W m$^{-1}$ K$^{-1}$, or 900 W m$^{-1}$ K$^{-1}$. In embodiments, the bulk BAs crystals exhibit peak and average thermal conductivity (K) values that show a rapid decrease with increasing temperature, evidence of lattice anharmonicity/dominant anharmonic phonon-phonon scattering.

Characterization of BAs Bulk Crystals of this Disclosure

Figure 1:
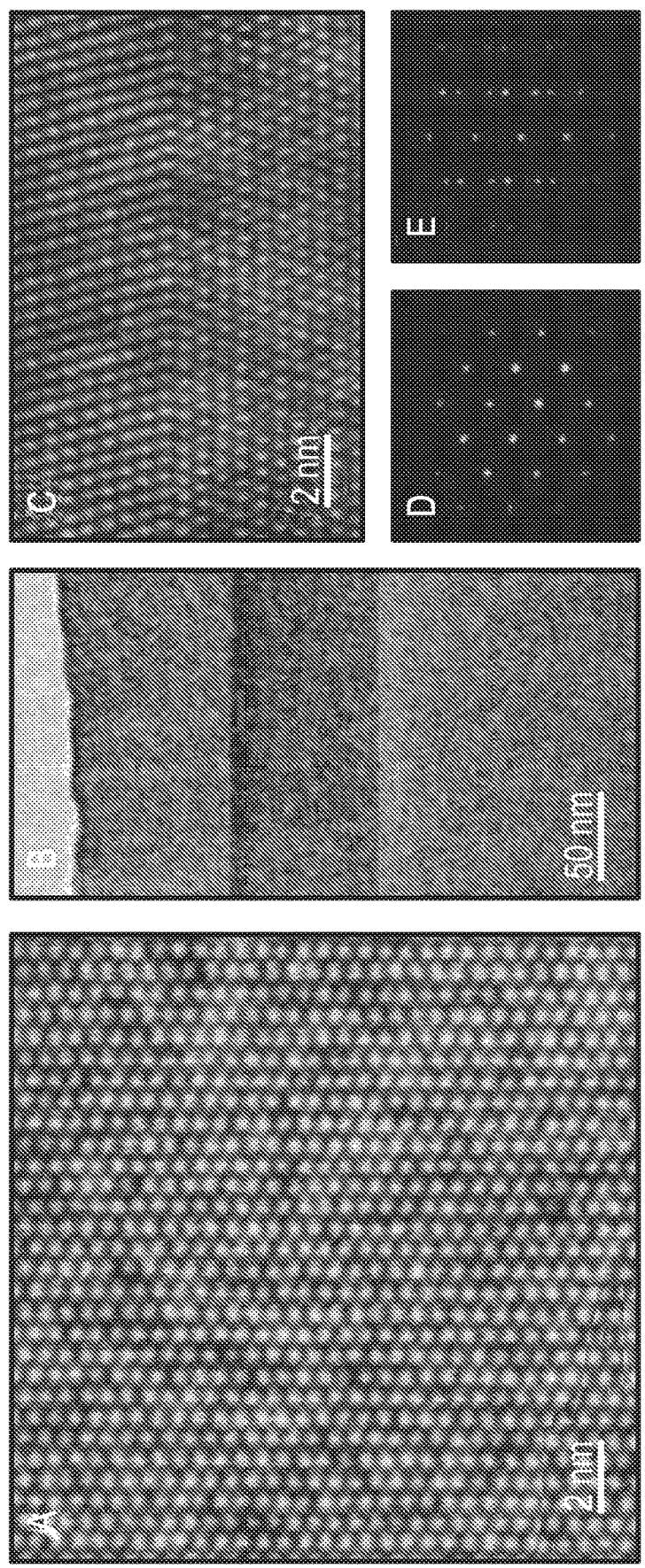
FIG. 1 is provides STEM measurements of BAs according to embodiments of this disclosure: Panel (A) Annular dark-field STEM image within one grain of BAs, looking down the [110] zone axis; Panel (B) Low-magnification bright-field TEM image near the surface of the BAs crystal (Horizontal lines indicate the locations of mirror twin boundaries); Panel (C) Annular dark-field STEM image showing the atomic structure of the mirror twin boundary from the region highlighted by the box in Panel (B); Panel (D) Electron diffraction pattern of BAs within a single grain; and Panel (E) Electron diffraction pattern of BAs across the grain boundary, showing the presence of the mirror twin.

To probe the crystal structure of the BAs produced as per this disclosure, scanning transmission electron microscopy (STEM) measurements of BAs of this disclosure were obtained. Panel (A) of FIG. 1 provides an aberration-corrected, annular dark-field scanning transmission electron microscopy (STEM) image within one grain of BAs, looking down the [110] zone axis. Panel (B) of FIG. 1 provides a low-magnification bright-field TEM image near the surface of a representative BAs crystal. In panel (B) of FIG. 1, horizontal lines indicate the locations of mirror twin boundaries. Panel (C) of FIG. 1 provides an annular dark-field STEM image showing the atomic structure of the mirror twin boundary from the region highlighted by the box in (B). Panel (D) of FIG. 1 provides electron diffraction pattern of BAs within a single grain. Panel (E) of FIG. 1 provides the electron diffraction pattern of BAs across the grain boundary, showing the presence of the mirror twin. In embodiments, the BAs crystals of this disclosure exhibit planar defects (FIG. 1, Panel (B)) that are mirror twin boundaries (FIG. 1, Panels (C)-(E)).

Figure 2:
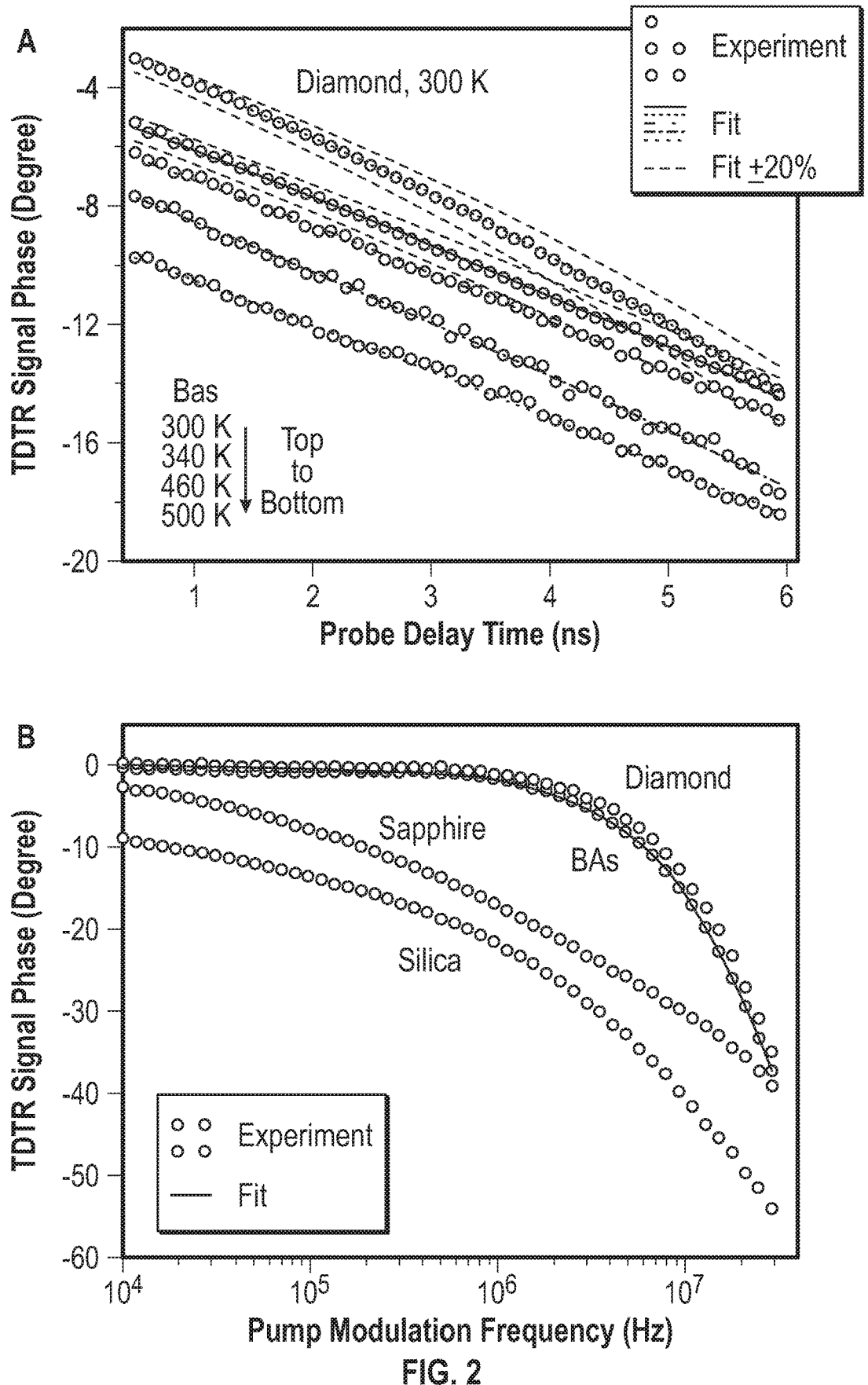
FIG. 2 provides TDTR and FDTR measurements: Panel (A) Representative TDTR phase signals and the best fitted curves for a diamond crystal acquired from Element Six and a BAs crystal of this disclosure at different temperatures; Panel (B) Representative FDTR signal phase as a function of the pump modulation frequency measured on BAs crystal of this disclosure, diamond, sapphire, and fused silica.

It was unexpectedly discovered, using time and frequency domain thermoreflectance (TDTR and FDTR, respectively) techniques with micrometer resolutions, that the BAs crystals of this disclosure comprise unusually high but non-uniformly distributed A large 58-□m-diameter pump laser spot and a small 9-□m-diameter probe laser spot were utilized in conjunction with a relatively low modulation frequency of 3 MHz to improve the TDTR measurement accuracy. The diameter quoted here is the 1/e$^2$ diameter of the Gaussian beam. For comparison and validation, the same TDTR platform and parameters were utilized to measure the □ of a synthetic diamond crystal (Panel (A) of FIG. 2 and FIG. 3). The values measured for diamond are in good agreement with theoretical calculations and literature values. FIG. 2 shows TDTR and FDTR measurements. Panel (A) of FIG. 2 provides representative TDTR phase signals and the best fitted curves for a diamond crystal acquired from Element Six and a BAs crystal of this disclosure at different temperatures. The diamond sample has the natural carbon abundance (1.1% $^{13}$C) and a low level of boron (<0.05 ppm) and nitrogen (<1 ppm) impurities. The 300 K data are averaged over 200 and 140 runs at the same location for diamond and BAs, respectively. The data for BAs at higher temperatures are averages of about 10 runs and show slightly increased noise. Panel (B) of FIG. 2 provides representative FDTR signal phase as a function of the pump modulation frequency measured on BAs crystal of this disclosure, diamond, sapphire, and fused silica. The phase lag between the probe and the pump increases with decreasing sample □.

Figure 3:
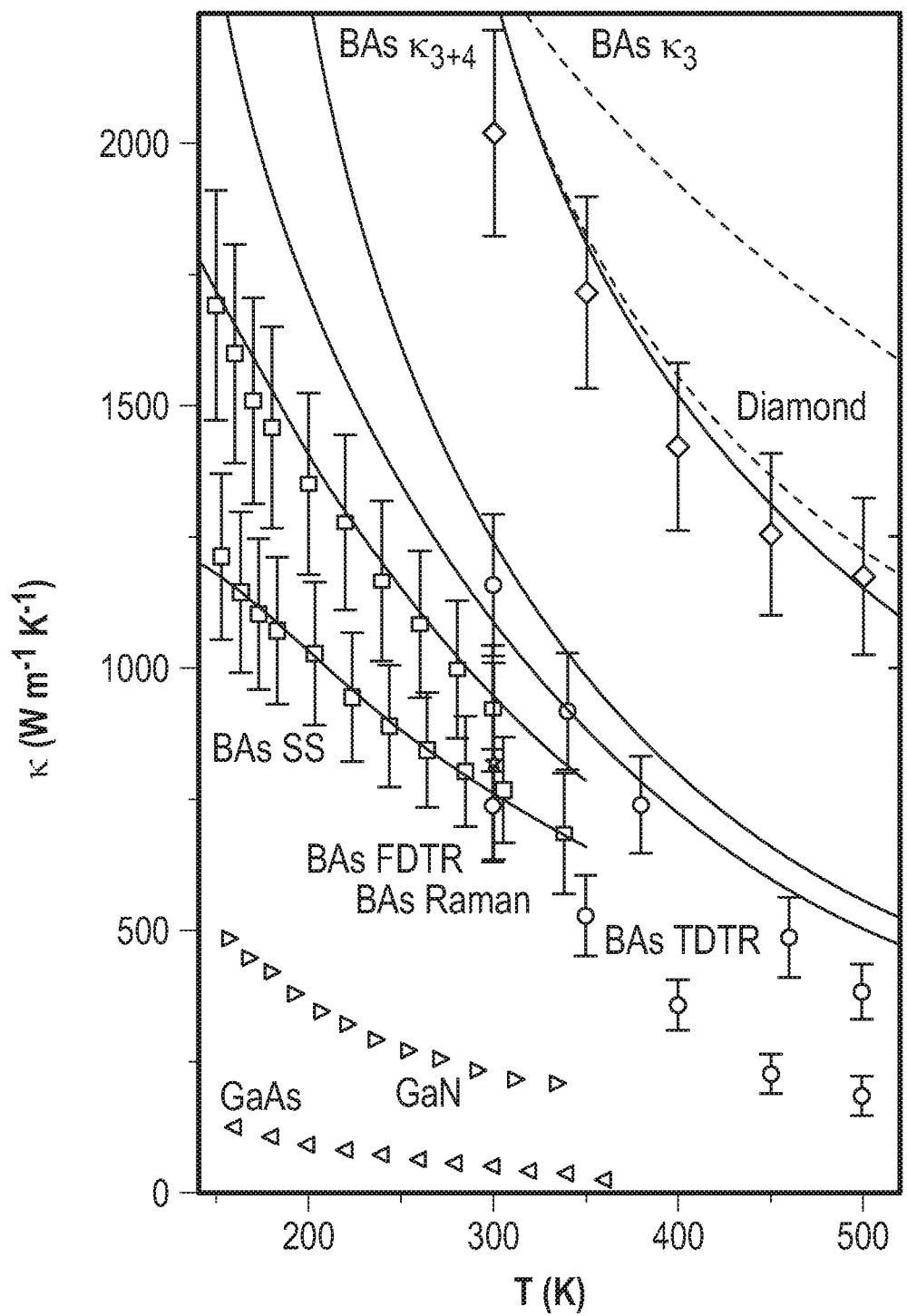
FIG. 3 provides measured thermal conductivity of BAs in comparison with theoretical calculations and other crystals.

FIG. 3 provides measured thermal conductivity of BAs of this disclosure in comparison with theoretical calculations and other crystals. Calculated □ vs. temperature for BAs and diamond including only three-phonon scattering (dashed lines) and both three- and four-phonon scattering (solid lines). Measured □ for diamond by TDTR (diamonds). Measured L for BAs Sample #1 (solid symbols) and #2 (open symbols) by TDTR, Sample #3 by FDTR (solid star for mean value), steady-state (open squares) and lock-in Raman (open square) methods, and Sample #5 by the steady-state method (solid squares). Also shown are the fits to measured steady-state and TDTR □ for BAs (solid lines, respectively), and reported measured □ for gallium nitride and gallium arsenide (GaN and GaAs, respectively; triangles). The error bars for the TDTR and FDTR data represent one standard deviation and were obtained via Monte Carlo simulations and derivative matrix-based analysis of uncertainty propagation, respectively. The error bars for the steady state and lock-in Raman measurement results were calculated by propagating random errors at 95% confidence and systematic errors.

Among the single-spot measurements at five locations of BAs Sample #1, the highest and lowest RT □□ values were 1160±130 and 640±70 W m$^{-1}$ K$^{-1}$, respectively. Among the ten single-spot TDTR measurements on Sample #2, the RT □□ value ranges from 790±100 to 450±60 W m$^{-1}$ K$^{-1}$. A sharp decrease in □□ was seen as temperature increased to 500 K at the location on Sample #1 where the maximum □ for BAs was found (FIG. 3). The same behavior is seen on a location of Sample #2 with a RT □□=740±110 W m$^{-1}$ K$^{-1}$ (FIG. 3). This temperature behavior is consistent with dominant anharmonic phonon-phonon scattering. At the same Sample #1 spot where the TDTR measurements found the highest 2, the single-spot FDTR measurements obtained 1310±740 W m$^{-1}$ K$^{-1}$, where the large uncertainty was due to the use of a small 3.36-□m-diameter pump beam and 2.60-□m-diameter probe spot to measure the high □ region. No spot-size dependence of □ was seen when the pump and probe laser spot sizes were increased to 5.60 □m and 4.80□m, respectively.

Figure 4:
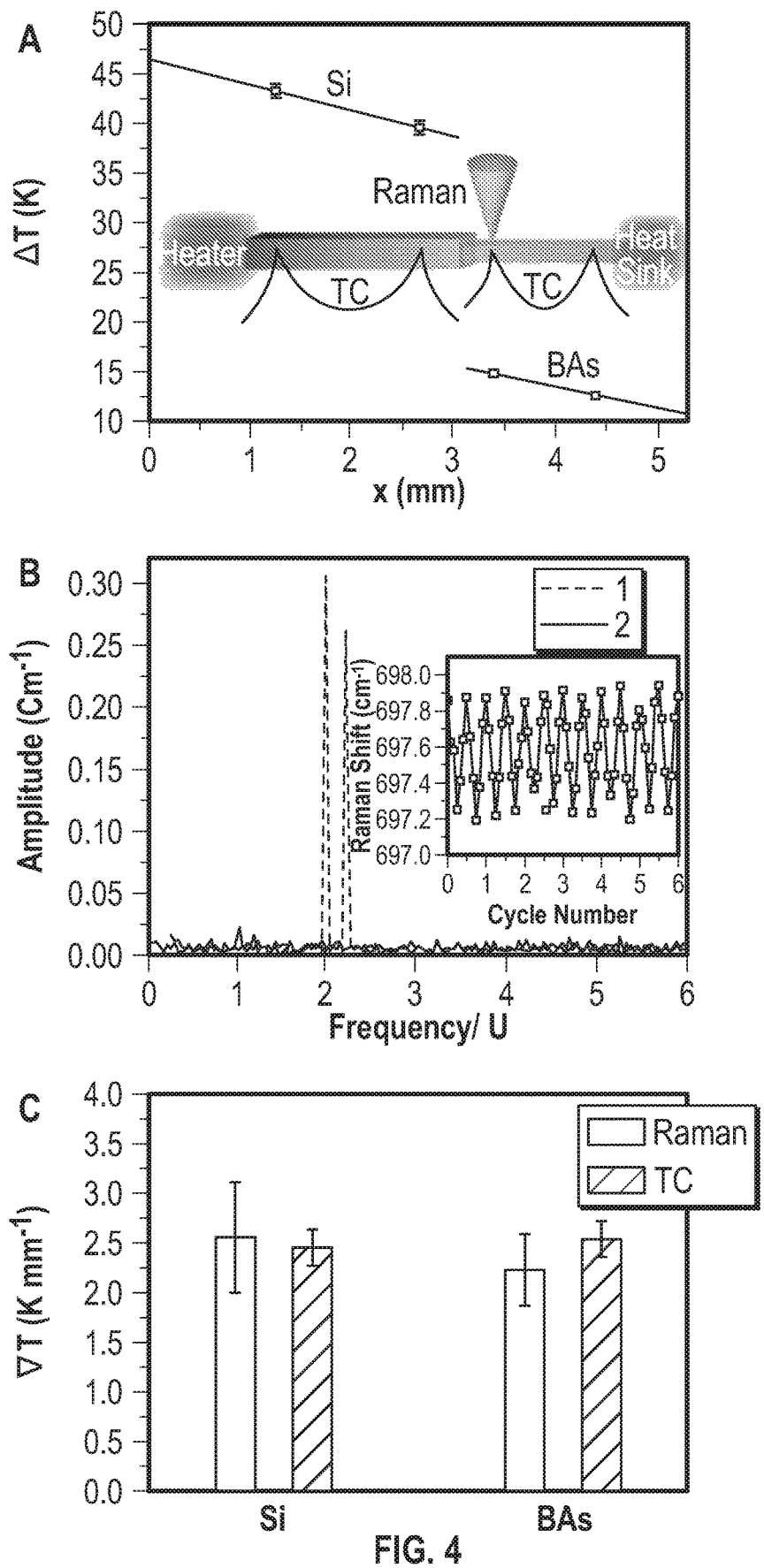
FIG. 4 provides steady-state comparative and lock-in Raman thermometry measurements: Panel (A) Temperature modulation amplitudes ($\square$T) measured by the Raman thermometry at two locations on the Si and two locations on the BAs bar. Panel (B) Amplitude spectrum of the measured Raman peak modulation for BAs at location x=3.38 mm (1) and x=4.39 mm (2); Panel (C) Temperature gradients on the Si and BAs bars obtained from TC and Raman measurements.

The large size of the bulk BAs crystals of this disclosure enables steady-state comparative measurements of the bulk □□□□ FIG. 4 provides steady-state comparative and lock-in Raman thermometry measurements. Panel (A) of FIG. 4 provides temperature modulation amplitudes (□T) measured by the Raman thermometry at two locations on the Si and two locations on the BAs bar. The lines are linear fitting to the measurement data. The inset shows the schematic diagram of the experimental set-up for thermocouple (TC) and Raman measurements. Panel (B) of FIG. 4 provides amplitude spectrum of the measured Raman peak modulation for BAs at location x=3.38 mm (1) and x=4.39 mm (2). The curve for x=4.39 mm is shifted manually by +0.2 along the x-axis so that it can be distinguished with the other curve. The inset shows the modulation of the Raman peak frequency of BAs at location x=3.38 mm as a function of the cycle number during the first 6 cycles. Panel (C) of FIG. 4 shows temperature gradients on the Si and BAs bars obtained from TC and Raman measurements. The ambient temperature was 308.9 K and the heater power amplitude was 0.081 W.

Without accounting for the contact thermal resistance errors between the thermocouples and the sample, a □ of 770±100 W m$^{-1}$ K$^{-1}$ was obtained at 305 K on a 0.1×0.2×2 mm bar cut from Sample #3. The thermal conductivity increased with deceasing temperature. In comparison, an average value of 820±140 W m$^{-1}$ K$^{-1}$ was obtained with FDTR at 14 locations on another piece cut from Sample #3 (FIG. 3). The uncertainty due to contact resistance was addressed using a unique lock-in Raman thermometry approach with sinusoidally-modulated heating current at a low modulation frequency (□) of about 1 mHz. A fast Fourier transform (FFT) of the measured Raman peak shift shows clear modulation at the second harmonic frequency corresponding to the Joule heating frequency (Panel (B) of FIG. 4), which was used to measure the temperature drops along the Si and BAs bars (Panel (A) of FIG. 4). The Raman measurements obtain similar temperature gradients in both silicon and BAs as for the thermocouple measurements (Panel (C) of FIG. 4), and a □ of 690±120 W m$^{-1}$ K$^{-1}$ at 338 K (FIG. 3). On Sample #4 (Panel B of FIG. 23) and #5 (FIG. 3), the steady state method was used to measure a bulk □ of 570±70 W m$^{-1}$ K$^{-1}$ and 920±120 W m$^{-1}$ K$^{-1}$ at 300 K, respectively, and similar temperature dependence as for Sample numbers 1-3.

The measurement results agree with first principles calculations of the □ of BAs including both three- and four-phonon scattering, scattering of phonons by the natural boron isotope mix, and phonon scattering by point defects and grain boundaries. While □ of most high-quality insulating crystals is well described by lowest-order three-phonon scattering, in BAs of this disclosure the phase space for three-phonon scattering is unusually small. Four-phonon scattering is necessary to accurately capture the intrinsic □ of BAs. In comparison to the conventional calculation, several changes were implemented in the calculation to improve the accuracy. In addition, hole scattering of phonons was found to be negligible at a hole concentration of 7.6×10$^{18}$ cm$^{-3}$ that was measured in the p-type BAs semiconductor sample.

Figure 34:
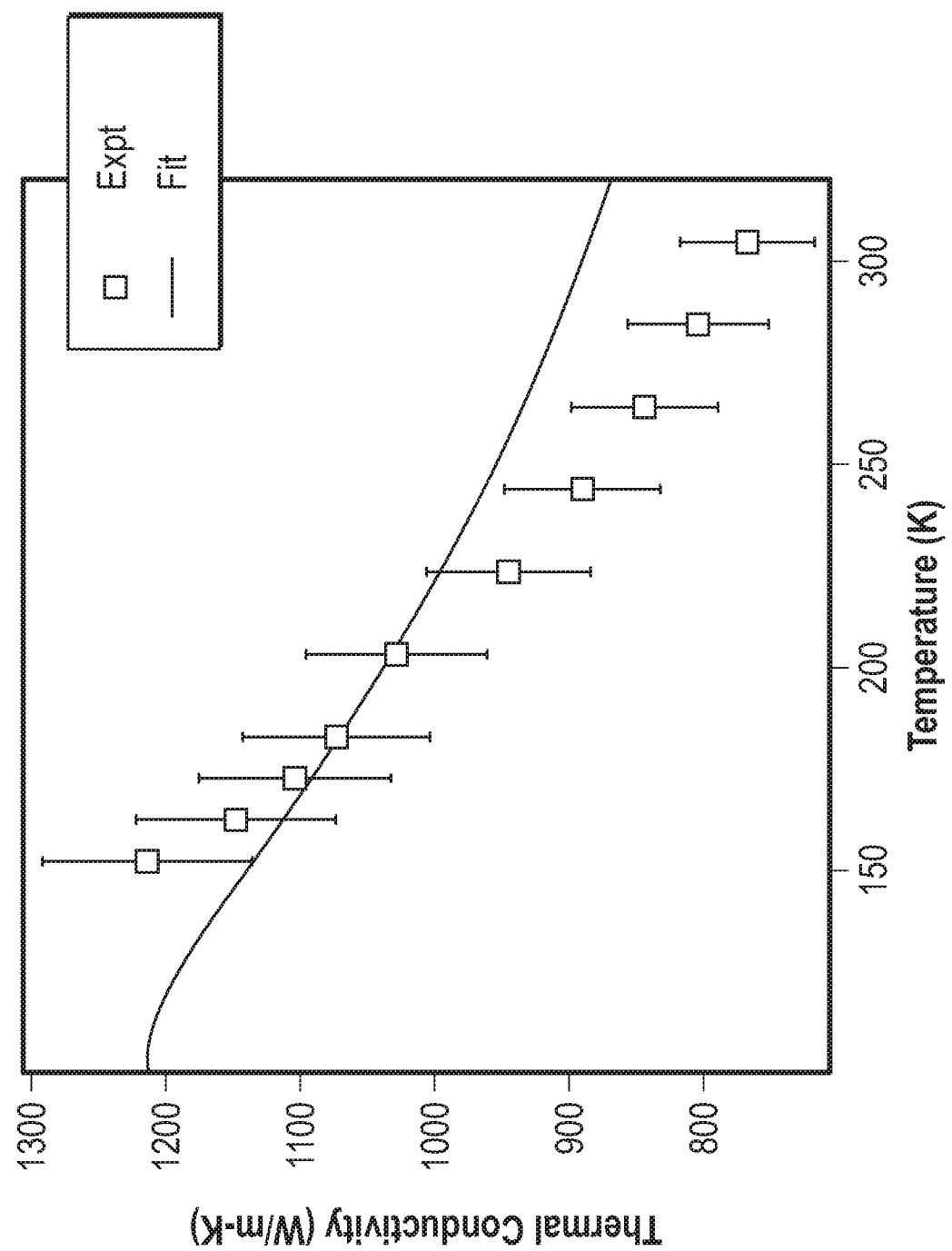
FIG. 34 provides a fit to the steady state measured data for BAs without four-phonon scattering.
Figure 35:
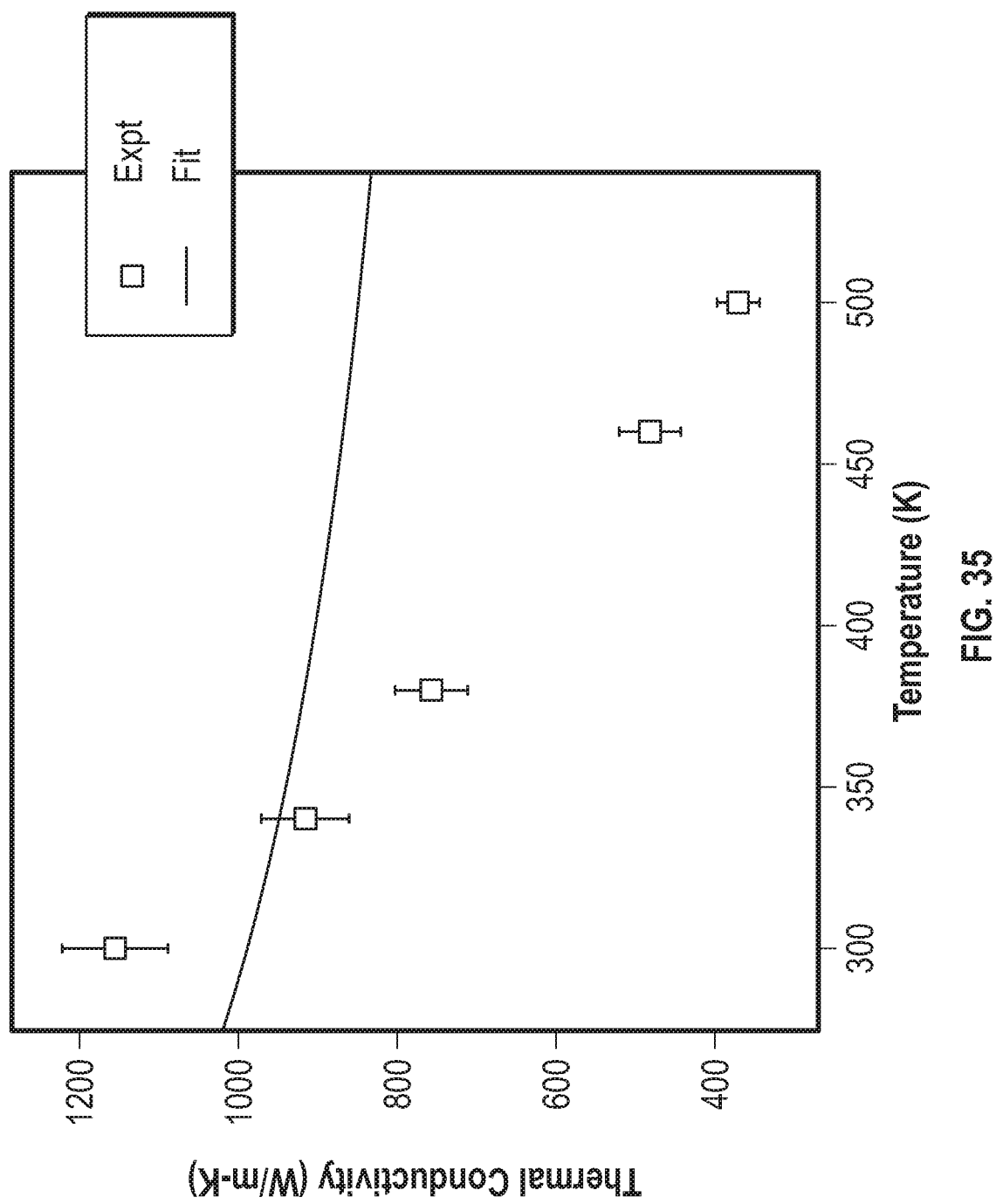
FIG. 35 provides a fit to the TDTR measured data for BAs without four-phonon scattering.

The calculated BAs □ at 300 K including three-phonon, four-phonon and phonon-isotope scattering is 1260 W m$^{-1}$ K$^{-1}$, about half that obtained without four-phonon scattering (2330 W m$^{-1}$ K$^{-1}$), and about 10% smaller than conventionally obtained. The BAs □ calculated including only three-phonon and phonon-isotope scattering, □$_3$, (dashed black curve, FIG. 3) lies well above all measured data. Including also four-phonon scattering, □$_{3+4}$, (solid black curve) suppresses □ and brings the calculation close to the measured local high TDTR values (solid circles). It also provides a strong T-dependence. Importantly, the TDTR temperature behavior follows the T-dependence of □$_{3+4}$, which is stronger than that of □$_3$. The steady-state and TDTR data were fit by including additional scattering from assumed point defects and grain boundaries (FIG. 3). Defect scattering mechanisms are typically much less sensitive to temperature change than phonon-phonon scattering, so increasing defect scattering to match the measured room-temperature value weakens the T-dependence of □□ The large defect concentrations needed to match the magnitudes of the measured data when including only three-phonon scattering cannot produce the steep observed T-dependence (FIGS. 34 and 35 hereinbelow). In contrast, the best fit of □$_{3+4}$ is excellent for the steady state data (Panel (B) of FIG. 23 hereinbelow) and reasonably good for the TDTR data.

The comparison between the measurements and theoretical calculations provides strong evidence that BAs is unique compared to other known high □ materials in achieving □ through the phonon band engineering concept and in having higher-order phonon-phonon interactions play such a large role. By breaking the conventional theoretical criteria, these findings have firmly established a different route to ultrahigh □ and highlighted the rich physics of phonons. The herein-disclosed strategy for growth of bulk BAs crystal is an important step towards implementation in future applications of BAs, which is now the only known semiconductor with a bandgap comparable to silicon and an ultrahigh room-temperature thermal conductivity.

Features and Potential Advantages

The discoveries disclosed herein yield new insight into the physics of heat conduction in solids and provide methods for growing bulk BAs that are the first known semiconductor with ultrahigh thermal conductivity. Herein-disclosed is a method of producing bulk boron arsenide crystals (and Bas produced via the method) that defy conventional theories and are validated as the first known semiconductor with ultrahigh thermal conductivity.

Examples

The embodiments having been generally described, the following examples are given as particular embodiments of the disclosure and to demonstrate the practice and advantages thereof. It is understood that the examples are given by way of illustration and are not intended to limit the specification or the claims in any manner.

Materials and Methods

Materials

Figure 5:
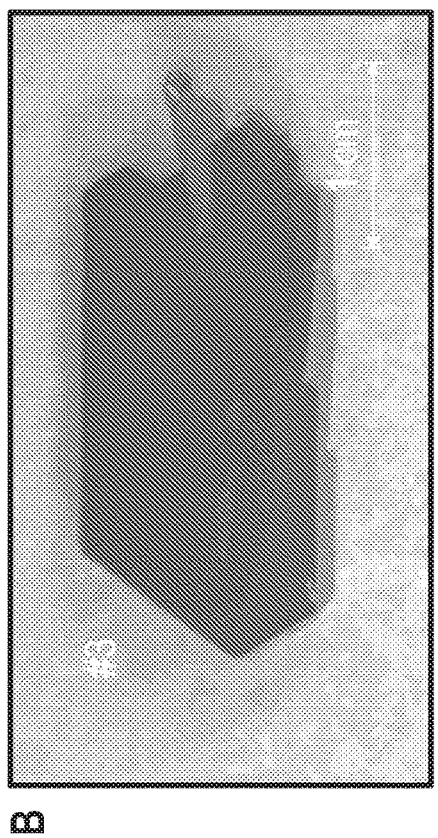
FIG. 5 shows a photo of twelve BAs crystals in Panel (A); a microscope image of a BAs crystal, labeled as Sample #3 in Panel (B); XRD on the top surface of Sample #3 used in the transport measurement in Panel (C); in the (220) pole figure of Panel (D), 6 bright spots were obtained, each rotated by 60° which indicates the high quality crystallinity and 6-fold symmetry.
Figure 5:
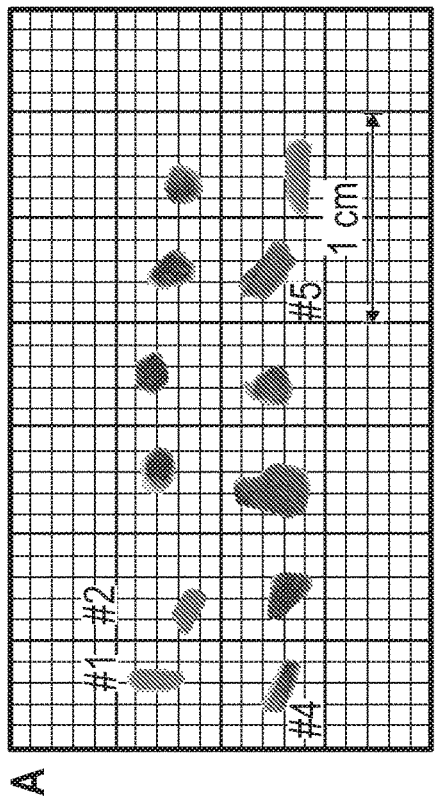
Figure 5:
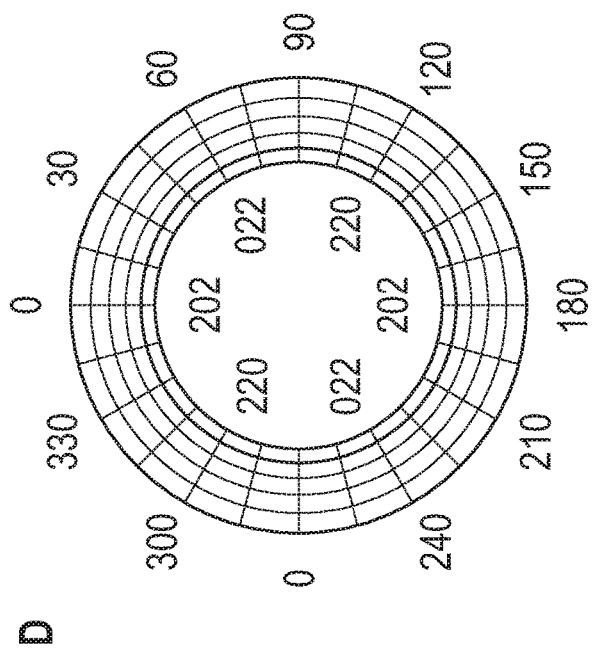
Figure 5:
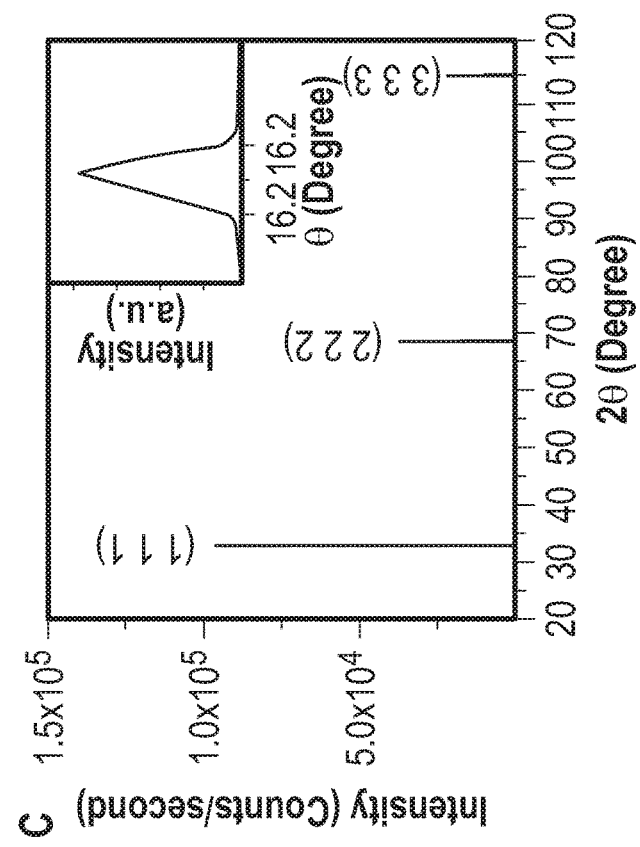

BAs single crystals were grown in a sealed quartz tube in a tube furnace with a temperature gradient for vapor transport. Pure boron bulk particles (B, Alfa Aesar, 99.9999/0), arsenic lumps (As, Alfa Aesar, >99.99999+%), and iodine powder (I2, Alfa Aesar, 99.999%), with a molar ratio of As:I=20:1, were positioned at one end of a fused quartz tube. Tiny BAs single crystals with a lateral dimension on the order of several micrometers were placed with care at the other end of the tube to serve as seeds. The fused quartz tube was then sealed under vacuum (104 Torr) and placed in a horizontal tube furnace. A temperature gradient was established and maintained by setting the seeds side at 780° C. and the source materials side at 890° C. After a growth period of 14 days, numerous BAs crystals appeared at the low temperature seed zone. These crystals were cleaned with aqua regia followed by de-ionized water rinsing. Subsequently, the crystals with the highest quality were chosen as the seeds for another round of crystal growth that lasted for 14 days. Only two seed crystals were enclosed in the same quartz tube at a distance of about 1 cm from each other. This process yielded high quality BAs crystals with a size as large as $4\times2\times1$ mm$^3$, as shown in Panels (A)-(B) of FIG. 5. This size made the steady-state thermal transport measurements of the bulk thermal conductivity possible. Panel (A) of FIG. 5 is a photo of twelve BAs crystals of this disclosure. Three crystals labeled as Sample #1, #2 and #4 were used in the transport measurements. Panel (B) of FIG. 5 is a microscope image of a BAs crystal, labeled as Sample #3. Panel (C) of FIG. 5 shows XRD on the top surface of Sample #3 used in the transport measurement. A preferred orientation of (111) is shown, which is consistent with the seed crystal. The sharp rocking curve (inset) of the (111) peak shows a full width at half maximum (FWHM) of 0.024°. In Panel (D) of FIG. 5, in the (220) pole figure, 6 bright spots were obtained, each rotated by 60° which indicates the high quality crystallinity and 6-fold symmetry.

A 3 mm×3 mm×0.3 mm diamond sample grown by chemical vapor deposition (CVD) was purchased from Element Six to serve as a reference. The sample has the natural carbon abundance (1.1% $^{13}$C) and a low level of boron (<0.05 ppm) and nitrogen (<1 ppm) impurities. Commercial sapphire and fused silica samples were also used as references for the time domain and frequency domain (TDTR and FDTR) measurements.

X-Ray Diffraction (XRD)

X-ray diffraction (XRD) pattern (Panel (C) of FIG. 5) was acquired with a Rigaku D-max IIIB X-Ray Diffractometer with a Cu Kα radiation source. Pole figure analysis (in-plane, Panel (D) of FIG. 5) was acquired with a Bruker General Area Detector Diffraction System (Bruker GADDS).

Electron Microscopy

Cross-sectional BAs specimens for transmission electron microscopy (TEM) and scanning transmission electron microscopy (STEM) study were prepared using a Helios 600i DualBeam Nanolab Focused Ion Beam (FIB), via standard lift-out procedures with a final milling step of 2 kV to reduce surface damage. Annular dark-field (ADF) STEM images in Panel (A) of FIG. 1 were acquired with an 80-kV aberration-corrected Titan Themis Z STEM. The ADF-STEM image in Panel (C) of FIG. 1 was acquired with a 200-kV aberration corrected JEOL 2200FS STEM. The bright-field TEM image in Panel (B) of FIG. 1 and electron diffraction images in Panels (D) and (E) of FIG. 1 were acquired with a 200-kV JEOL 2100cryo TEM.

Atomic Force Microscopy (AFM)

Figure 6:
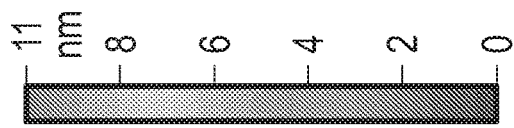
FIG. 6 provides AFM characterization of the surface roughness of the diamond and BAs samples: Panel (A) The diamond sample is a 3 mm×3 mm×0.3 mm CVD diamond crystal purchased from Element Six; Panels (B)-(D) The BAs samples were polished with 50 nm alumina particles.
Figure 6:
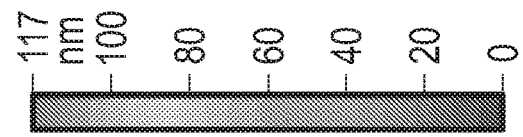
Figure 6:
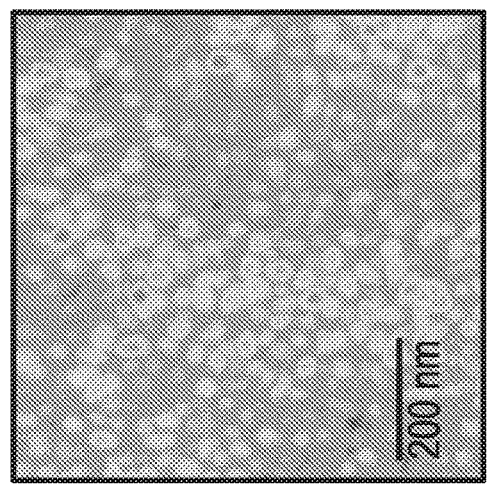
Figure 6:
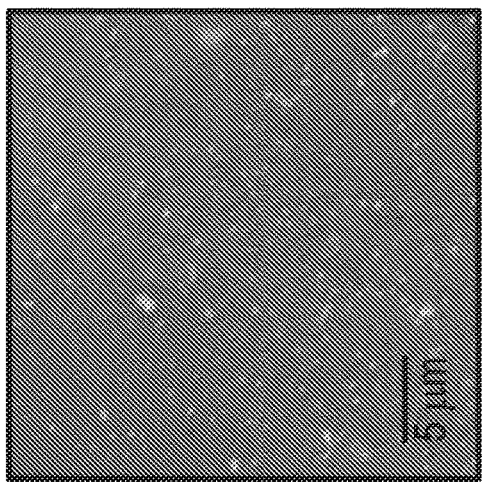
Figure 6:
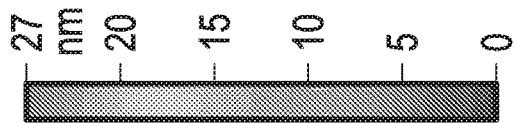
Figure 6:
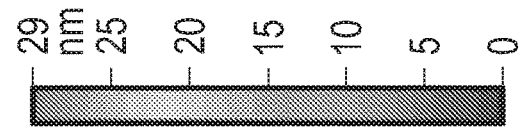
Figure 6:
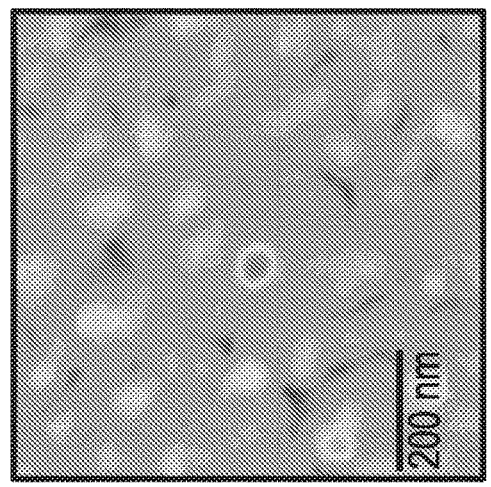
Figure 6:
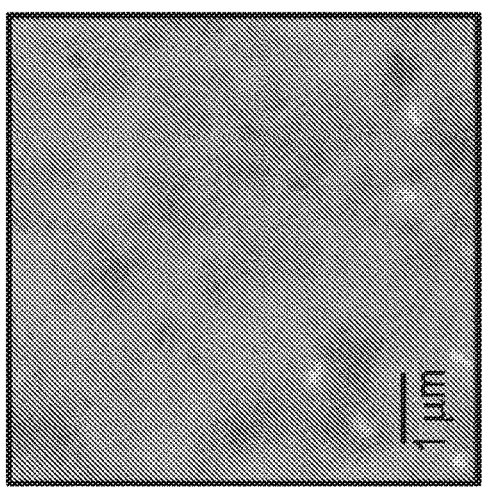

FIG. 6 provides AFM characterization of the surface roughness of the diamond and BAs samples. The diamond sample of Panel (A) is a 3 mm×3 mm×0.3 mm CVD diamond crystal purchased from Element Six. AFM scan was performed after e-beam evaporation of 80 nm Al film on the sample. The root mean-square (RMS) roughness over a 1 µm×1 µm area is 3 nm, and about 6 nm across a 10 µm×10 µm region. The BAs samples (of Panels B-D) were polished with 50 nm alumina particles. The scan was carried out after a Au transducer thin film was evaporated on the sample. The RMS roughness over a 5 µm×5 µm area is <2 nm, and about <5 nm across a 20 µm×20 µm region. Such small roughness is needed for thermal measurements using TDTR and FDTR.

Figure 7:
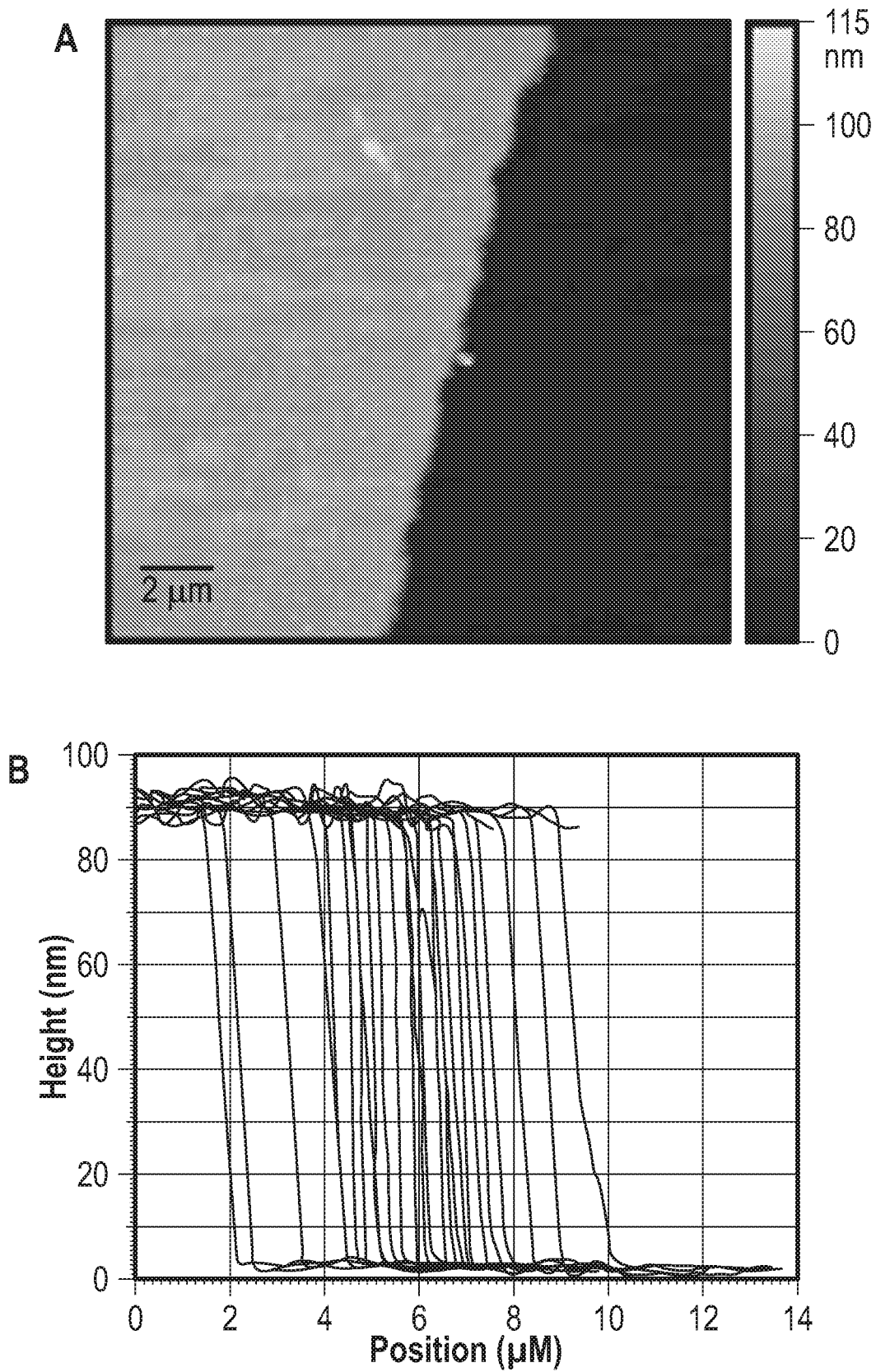
FIG. 7 provides AFM characterization of the thickness of the Au transducer film: Panel (A) large-area scan across the edge of an e-beam evaporated Au thin film on a pristine sapphire reference sample; Panel (B) Line profiles sampled from the topography image in Panel (A) that yields an average film thickness of 90 nm, which includes both the Au and the Ti layers.

Tapping-mode AFM (Bruker Dimension 3100) characterization (FIG. 6 and FIG. 7) was performed on the BAs and diamond samples after e-beam evaporation of a metal transducer layer. The BAs samples were fine polished and coated nominally with a 90 nm-thick Au film on top of a 5 nm-thick Ti adhesion layer using e-beam evaporation. The Au coating allows both TDTR and FDTR measurements to be performed on the same samples for direct comparison. The root-meansquare (RMS) roughness over a 5 µm×5 µm area is <2 nm, and about 5 nm across a 20 µm×20 µm region (Panels (B)-(D) of FIG. 6). Half of the diamond crystal was coated with an 80 nm-thick Al film while the other half was coated with Au/Ti (90 nm/5 nm) together with the BAs samples. On the Al film, the roughness over a 1 µm×1 µm area is 3 nm, and about 6 nm across a 10 µm×10 µm region. The thickness of the metal film was also measured using AFM by scanning across the edge of the metal film (FIG. 7) deposited on a pristine sapphire reference sample together with the BAs samples. FIG. 7 provides AFM characterization of the thickness of the Au transducer film: Panel (A) shows large-area scan across the edge of an e-beam evaporated Au thin film on a pristine sapphire reference sample. The sapphire sample was coated together with the BAs samples. The nominal thickness set for the ebeam evaporation was 90 nm Au on top of 5 nm Ti adhesion layer. Panel (B) of FIG. 7 shows line profiles sampled from the topography image in Panel (A) that yields an average film thickness of 90 nm, which includes both the Au and the Ti layers.

Time-Domain Thermoreflectance (TDTR)

A two-color TDTR setup was employed. Briefly, a high-power (~100 mW), 400 nm pump laser pulse (100-fs, Spectra-Physics Tsunami) was used to heat up the surface of a metal coated sample, while a probe pulse at 800 nm wavelength subsequently recorded the cooling process as a function of the delay time. The cooling curves were then fitted to a multi dimensional, multilayer Fourier heat transfer model to obtain the sample thermal conductivity and the metal/sample interface thermal conductance. The fitting error was calculated, at any given delay time, as the difference between the observed TDTR signal, and the fitted value provided by the heat transfer model. In the least-squares fitting method used here, the combination of thermal conductivity ☐ and interface thermal conductance G that minimizes the sum of squared errors (hereafter referred to as the fitting residual) was considered the best fit. The pump laser was amplitude modulated for improved signal-to-noise ratio. The probe reflection was detected by a silicon photodiode and the amplitude and phase of the complex reflectance signal were recorded by a lock-in amplifier. A cryostat (MicrostatHe, Oxford Instruments) was used for the temperature dependent measurements. The high thermal conductivity and relatively low interface thermal conductance are some of the challenges in making accurate thermal conductivity measurements. The experimental accuracy was improved here with a relatively large 58 μm-diameter pump laser beam and a relatively small 9 μm-diameter probe beam, in conjunction with a low modulation frequency of 3 MHz.

To investigate the reliability of the TDTR approach, a range of established sensitivity and uncertainty analyses approaches were applied on both diamond and BAs (FIGS. 8-24). The sensitivity was calculated defined as the derivative of an experimental observable with respect to a fitting parameter. In addition, the residual contours that reveal ranges of parameters that are equally good in terms of fitting residuals were examined. Briefly, due to the nonlinear nature of the TDTR fitting process, many combinations of ☐ and G lead to similar residuals. Mapping out the residual on the (☐, G) plane and plotting the contours of equal residuals thus facilitate the analysis of potential correlation between the fitting parameters and the experimental uncertainty. Specifically, one first computes a TDTR curve V(t, ☐₀, G₀) using a set of (☐₀, G₀) that is assumed to be exact, where V is either the phase, amplitude or other representations of the complex signal. Then alternative TDTR curves V(t, ☐, G) are generated by systematically varying ☐ and G within ranges of interest. Comparing V(t, ☐, G) to V(t, ☐₀, G₀), one can define a normalized residual as $$\frac{\sum_t [V(t, \kappa, G) - V(t, \kappa_0, G_0)]^2}{\sum_t V(t, \kappa_0, G_0)^2}.$$

Figure 9:
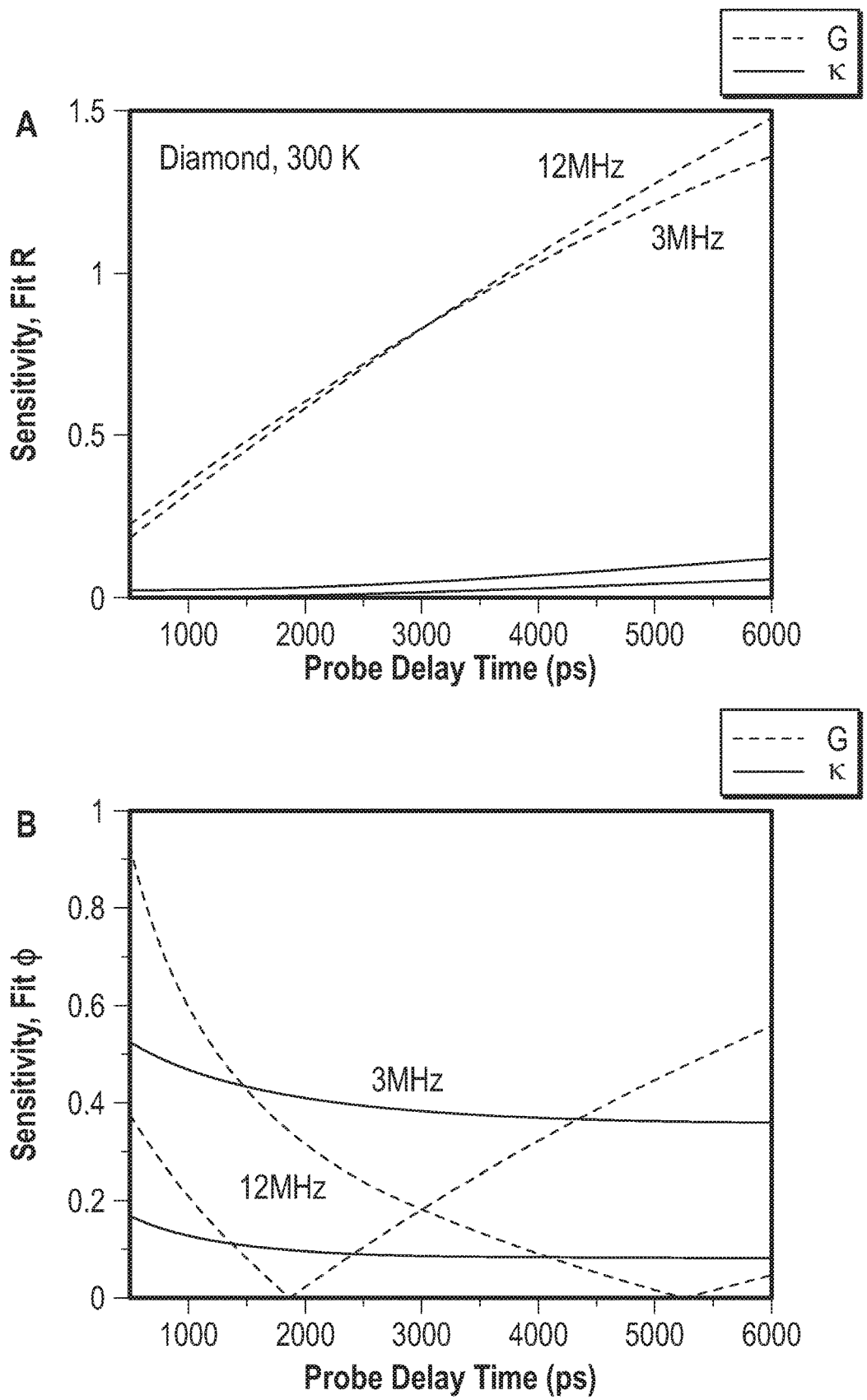
FIG. 9 shows sensitivity analysis for TDTR measurement of diamond: Panel (A) Fitting to the amplitude signal; Panel (B) fitting to the phase.
Figure 10:
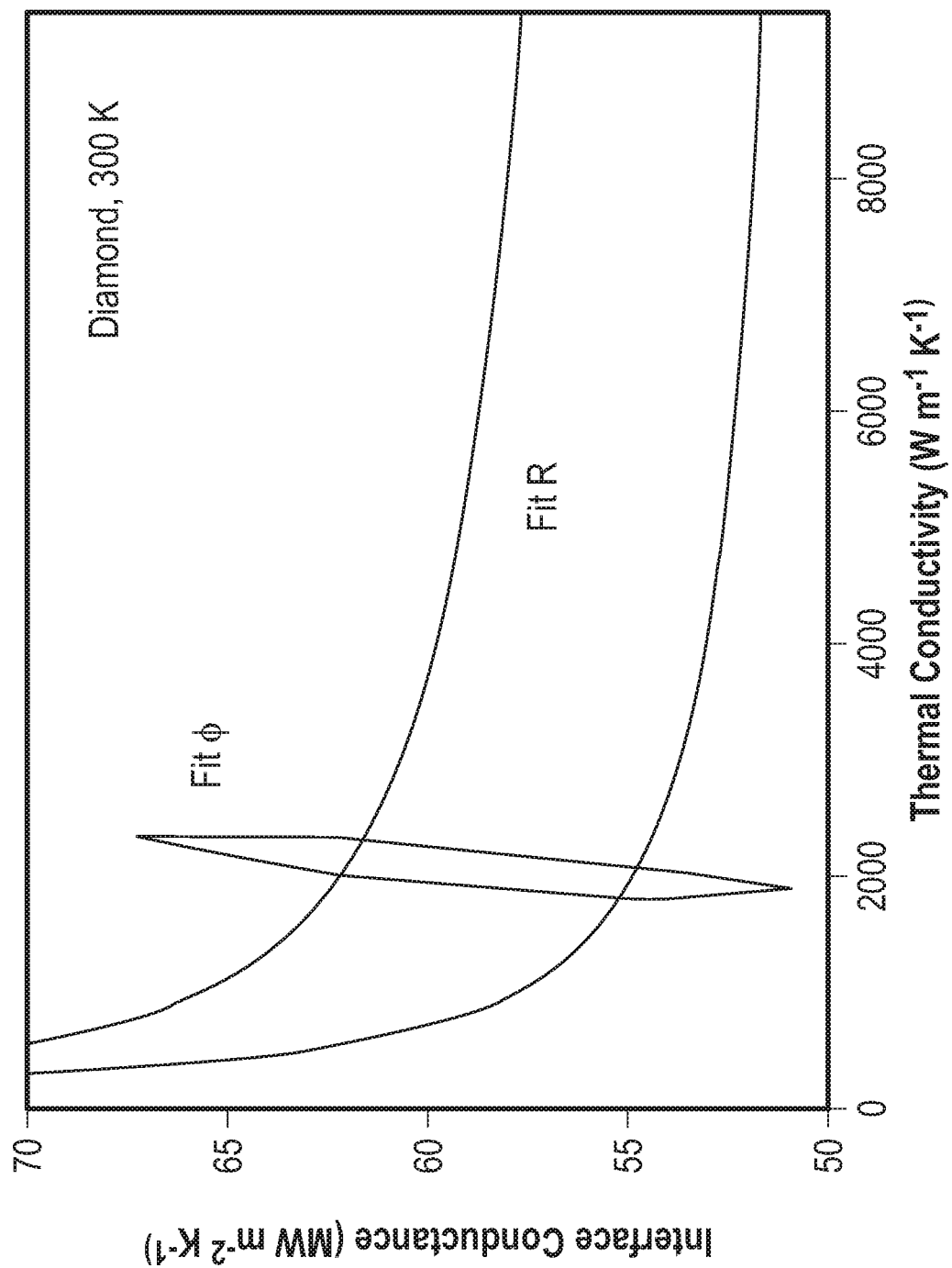
FIG. 10 shows residual contour for TDTR measurement of diamond.
Figure 16:
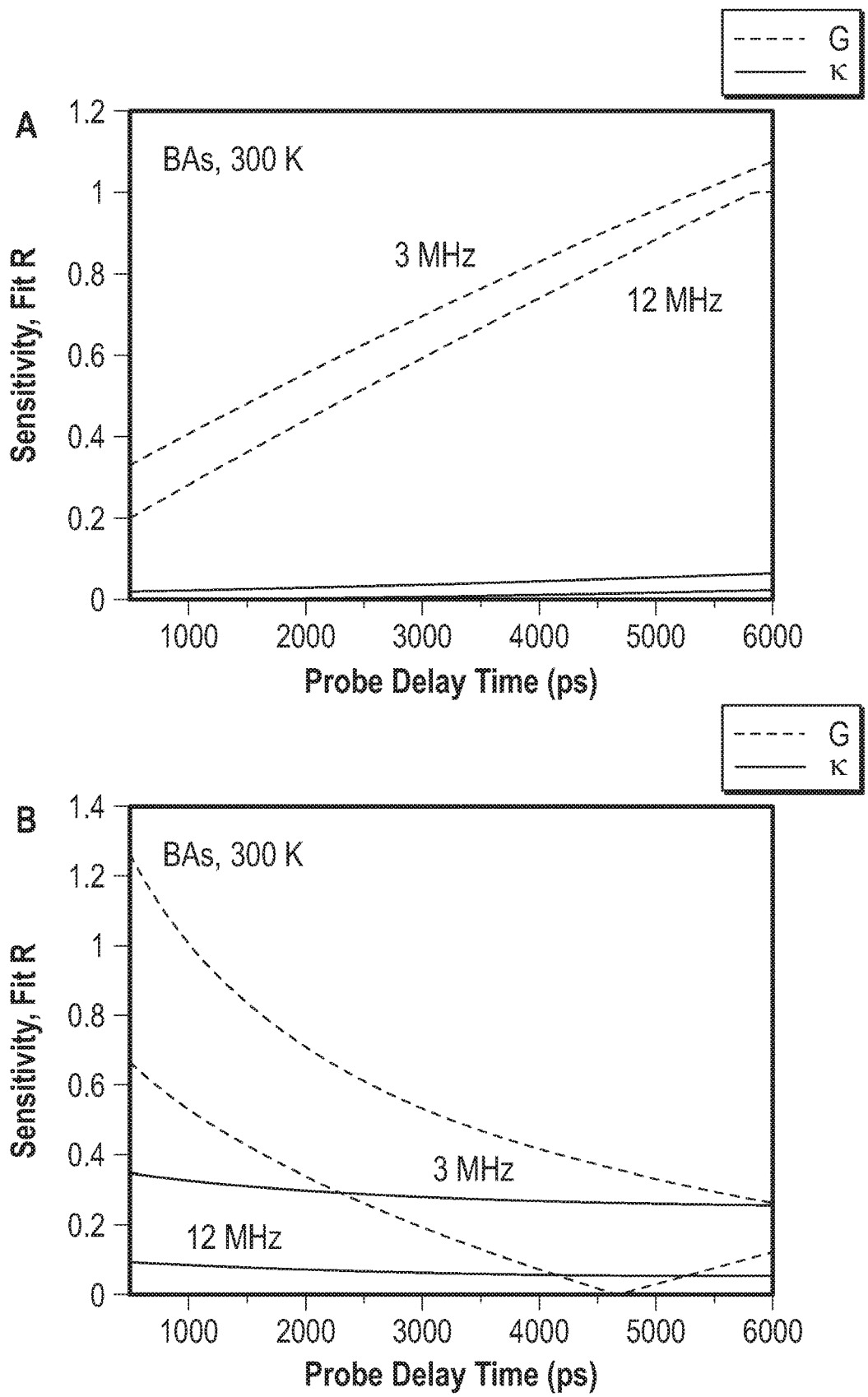
FIG. 16 shows sensitivity analysis for TDTR measurement of BAs of this disclosure: Panel (A) Fitting to the amplitude signal; Panel (B) Fitting to the phase.
Figure 17:
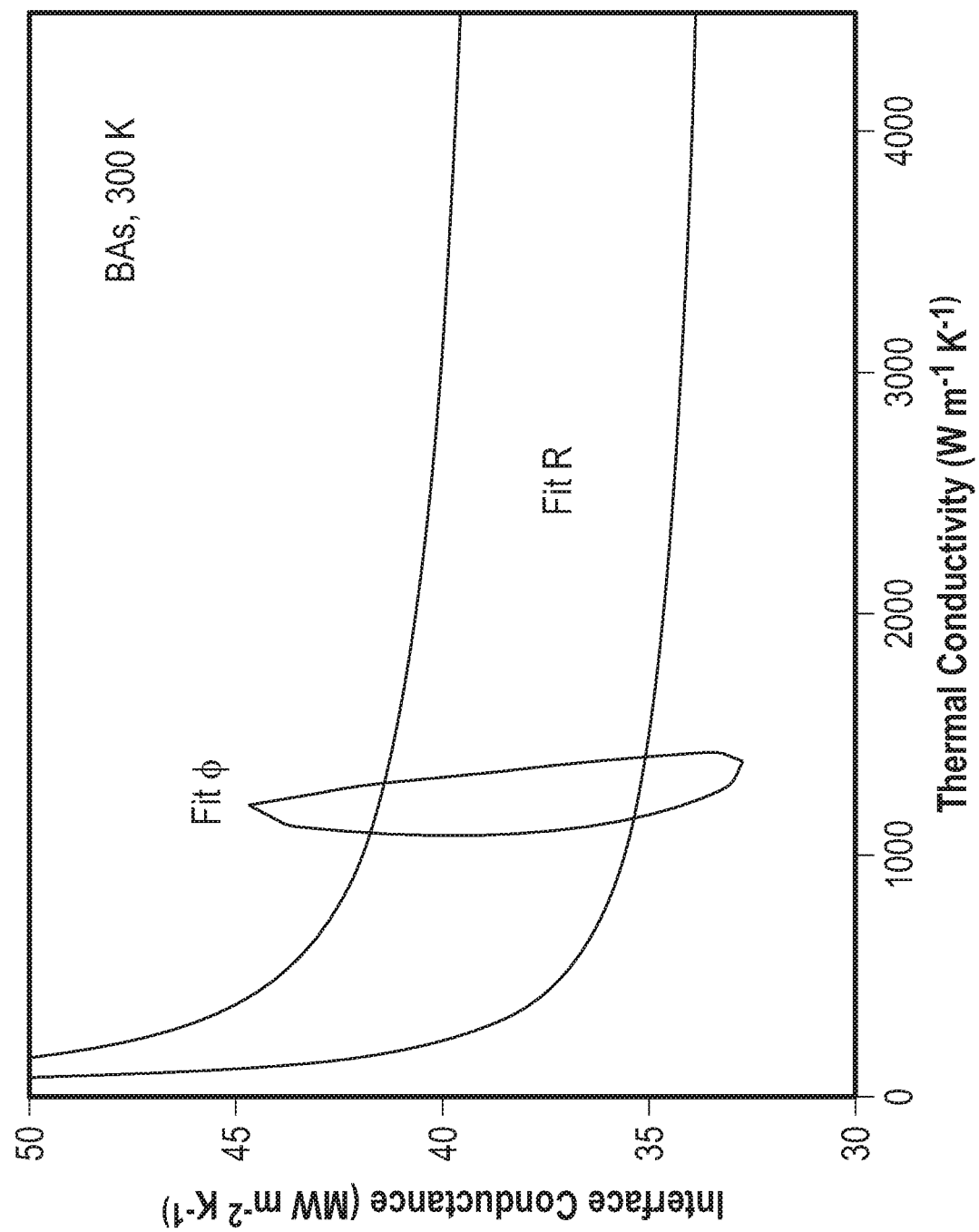
FIG. 17 shows residual contour for TDTR measurement of BAs.

In FIG. 10 and FIG. 17 are plots of the normalized residuals for the room temperature measurements of diamond and BAs, respectively, where the experimentally measured ☐ and G in each case were used as (☐₀, G₀). A contour enclosing a small range on the (☐, G) plane indicates a small fitting uncertainty. In addition, many measurements, 200 runs on diamond and 140 runs on BAs, were performed, and the average of these runs were used for the fitting. Moreover, Monte Carlo (MC) simulations were carried out with real experimental parameters and noises to evaluate the uncertainty and reliability of a TDTR measurement. In the MC simulation, a great number of TDTR curves based on measured material properties and experimental noises were first numerically generated, and then data fitting and statistical analysis were performed to obtain the mean and standard deviation of the parameters of interest. Comparing the mean values from the MC simulations with the assumed material properties is used to evaluate the precision of the measurement, while the standard deviations represent the measurement uncertainties. These three different calculations all show that fitting to phase is more reliable than fitting the amplitude. Details of the measurements and analyses can be found in the discussion of FIG. 8 to FIG. 20.

Figure 8:
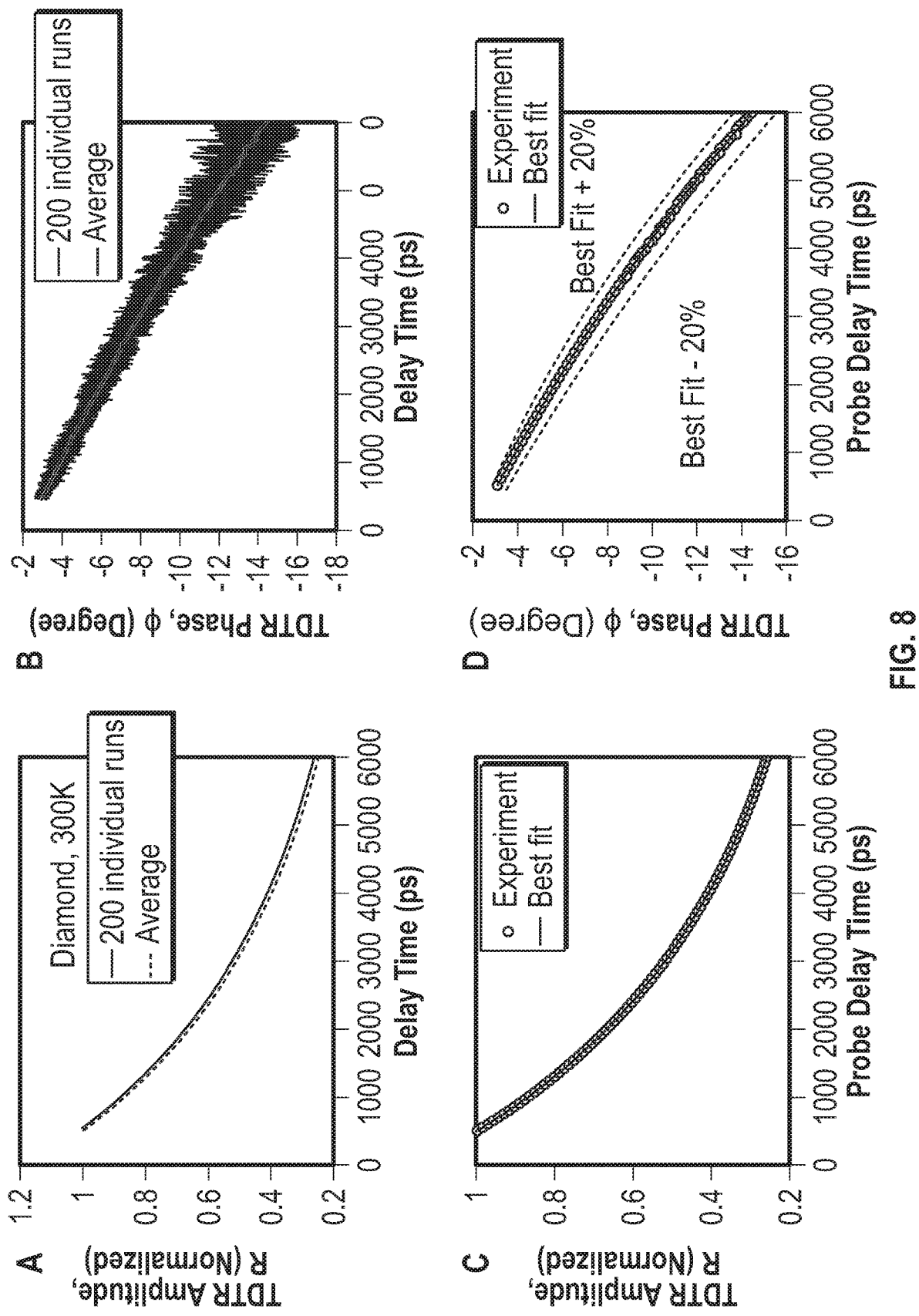
FIG. 8 provides raw data and fitting from TDTR measurement of diamond: in Panel (A) the amplitude and in Panel (B) the phase of the measured complex TDTR signal are plotted; Panel (D) Fitting to the average phase signal yields a sample thermal conductivity $\square$=2030 W m$^{-1}$ K$^{-1}$ and interface thermal conductance G=58 MW m$^{-2}$ K$^{-1}$. The yellow and purple lines in Panel (D) show the effect of reducing or increasing the best fitted thermal conductivity by 20%. Further, computing the TDTR amplitude signal based on the $\square$ and G values from fitting to the phase signal also accurately matches the measured amplitude with respect to delay time, as shown in Panel (C).

FIG. 8 shows raw data and fitting from TDTR measurement of diamond. The amplitude and phase of the measured complex TDTR signal are plotted in Panels (A) and (B), respectively. A total of 200 individual runs (black) at room temperature and their average (semitransparent gray) are shown. Fitting to the average phase signal as shown in Panel (D) yields a sample thermal conductivity ☐=2030 W m⁻¹ K⁻¹ and interface thermal conductance G=58 MW m⁻² K⁻¹. The dashed lines in Panel (D) show the effect of reducing or increasing the best fitted thermal conductivity by 20%. Further, computing the TDTR amplitude signal based on the ☐ and G values from fitting to the phase signal also accurately matches the measured amplitude with respect to delay time, as shown in Panel (C).

FIG. 9 shows sensitivity analysis for TDTR measurement of diamond. The best fitted Al/diamond interface thermal conductance and diamond thermal conductivity from FIG. 8 were assumed. Fitting to the amplitude signal as shown in Panel (A) is more sensitive to the interface thermal conductance between Al and diamond, while fitting to the phase as shown in Panel (B) is more sensitive to the thermal conductivity of diamond. Further, the measurement sensitivity to the thermal conductivity is higher at the lower 3 MHz modulation frequency than the 12 MHz case. As a result, 3 MHz modulation was used for all the TDTR measurement in this work.

FIG. 10 shows the residual contour for TDTR measurement of diamond. The best fitted Al/diamond interface thermal conductance and diamond thermal conductivity from FIG. 8 were assumed. The contours denote a typical normalized residual of 0.03. Fitting to the phase (PHI) is expected to lead to much smaller spread in the obtained thermal conductivity values. In comparison, fitting to the amplitude may suffer from coupling between the sample thermal conductivity and interface thermal conductance.

Figure 11:
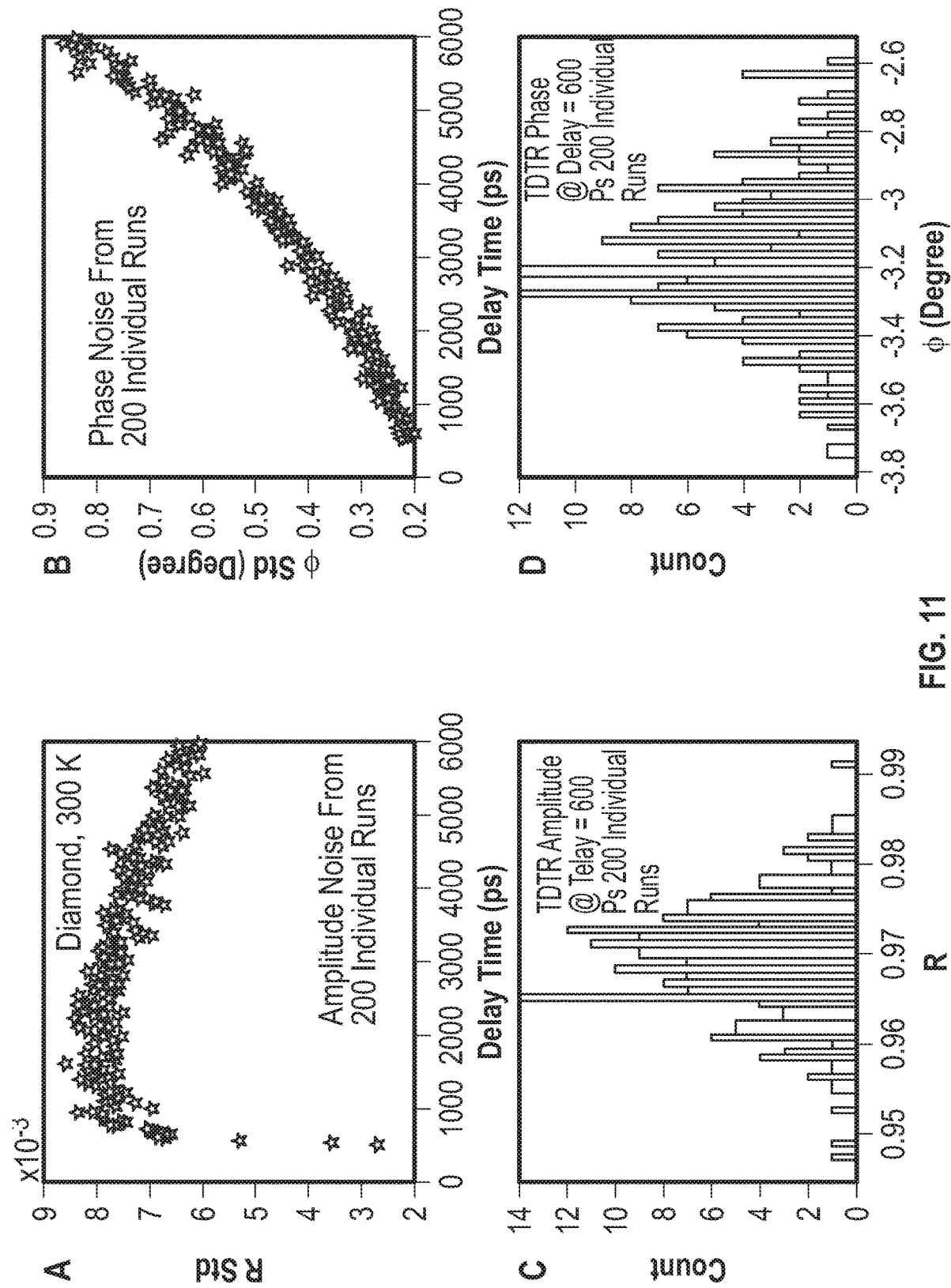
FIG. 11 Shows experimental noise obtained from 200 TDTR runs on diamond: Panels (A) and (B) show the amplitude and phase noise as a function of delay time, respectively: Panels (C) and (D) show the amplitude and phase, respectively, measured at a fixed delay time of 600 ps, which approaches Gaussian distribution.

FIG. 11 shows experimental noise obtained from 200 TDTR runs on diamond. Panels (A) and (B) show the amplitude and phase noise as a function of delay time, respectively. Panels (C) and (D) show the amplitude and phase, respectively, measured at a fixed delay time of 600 ps, which approaches Gaussian distribution. The measured noises contribute to the Monte Carlo simulations for the TDTR measurements.

Figure 12:
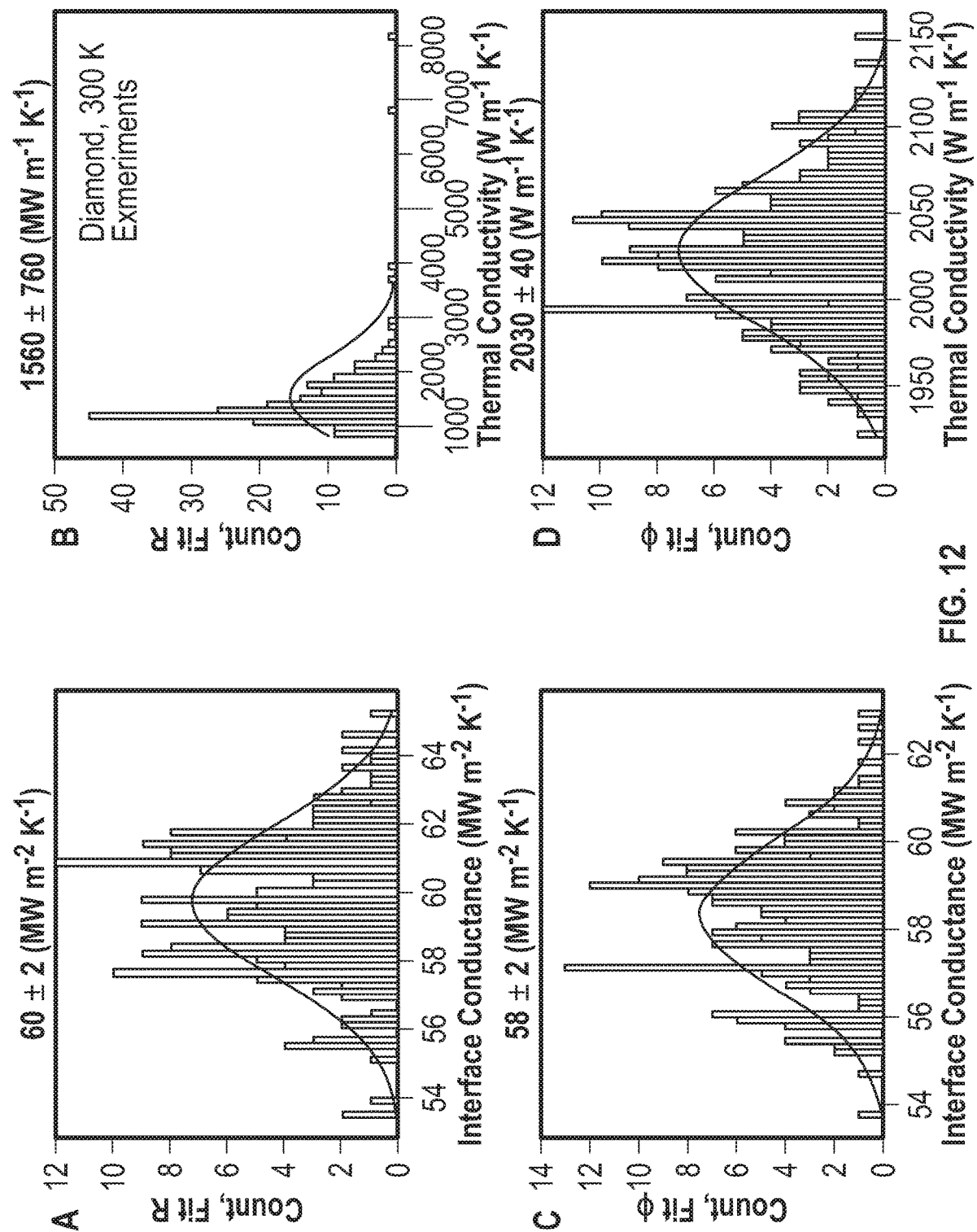
FIG. 12 shows results from fitting to 200 individual TDTR runs on diamond: Panels (A) and (B) Fitting to the amplitude signal; Panels (C) and (D) Fitting to the phase signal.

FIG. 12 shows results from fitting to 200 individual TDTR runs on diamond. The histograms are the experimental data and the lines are the best-fit normal distributions. Fitting to the phase signal (Panels (C)-(D)) from the individual runs, and then computing the average and standard deviation yields ☐=2030±40 W m⁻¹ K⁻¹ and G=58±2 MW m⁻² K⁻¹. Fitting to the amplitude signal (Panels (A) and (B)) yields a similar G of 60±2 MW m⁻² K⁻¹. However, the fitted k has a large uncertainty of about 49% and the distribution deviates largely from normal distribution. In good agreement with the sensitivity and uncertainty analyses shown in FIG. 9 and FIG. 10, in this case fitting to amplitude is not reliable for obtaining the thermal conductivity of the sample. Note that the small standard deviations here only reflect the experimental noise.

Figure 13:
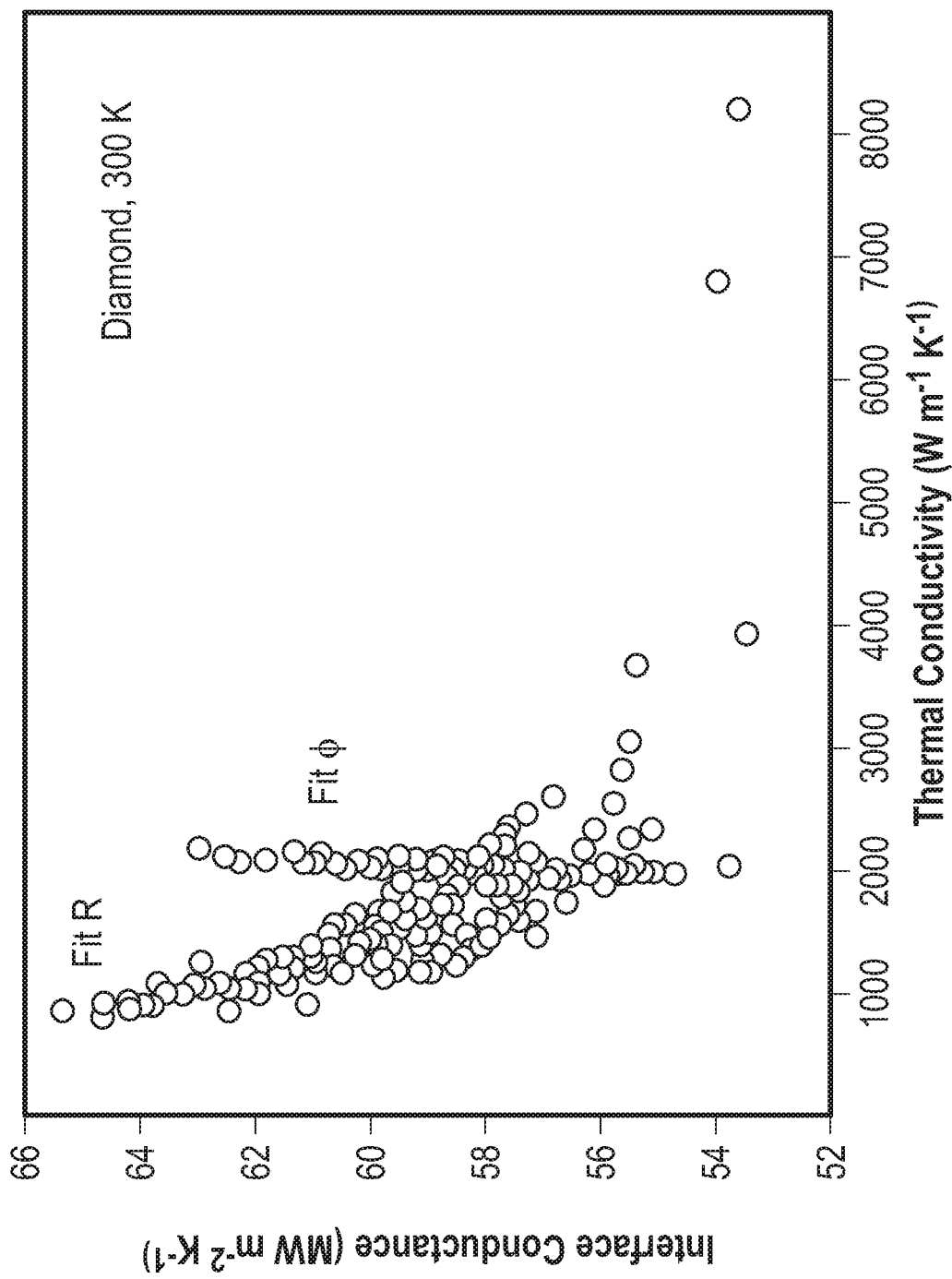
FIG. 13 shows the interface thermal conductance versus sample thermal conductivity on diamond.

FIG. 13 shows the interface thermal conductance versus sample thermal conductivity on diamond. Results from fitting to 200 individual runs. The distribution of the fitted values resembles the residual contours shown in FIG. 10.

Figure 14:
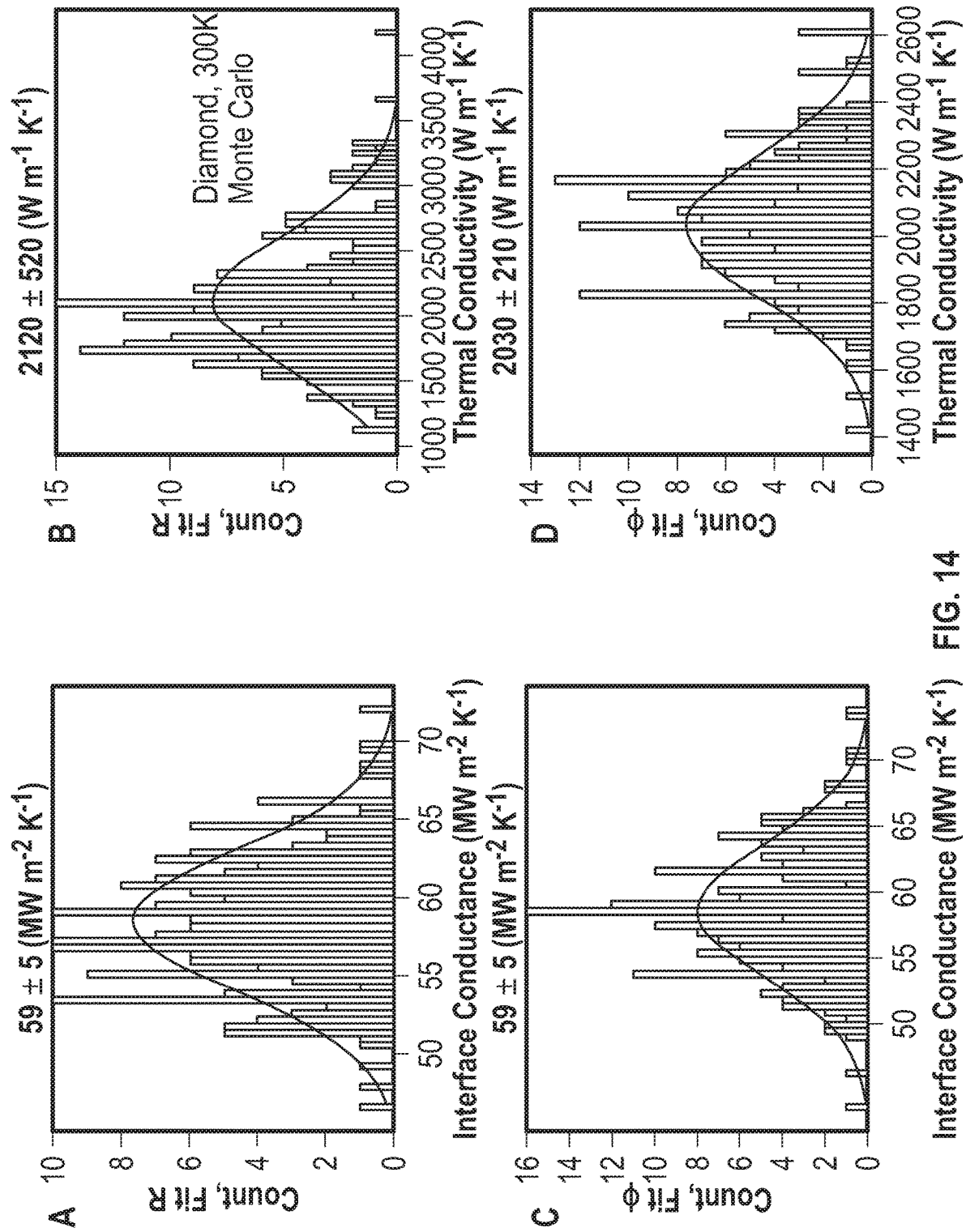
FIG. 14 shows Monte Carlo simulations for TDTR measurement of diamond.

FIG. 14 shows Monte Carlo simulations for TDTR measurement of diamond. The histograms are the experimental data and the lines are the best-fit normal distributions. The best fitted Al/diamond interface thermal conductance and diamond thermal conductivity from FIG. 8 were assumed. The key input parameters in the fitting process, including the pump and probe laser spot sizes, Au film thickness, thermal conductivity and heat capacity, as well as the heat capacity of diamond were all assumed to have a normal distribution characterized by mean values from the literature and a typical standard deviation of 5%. The experimental noise measured from the 200 individual runs, as shown in FIG. 11, was also incorporated. The simulations indicate that fitting to the phase signal leads to much smaller uncertainty in the thermal conductivity, and an uncertainty of over 10% is expected.

Figure 15:
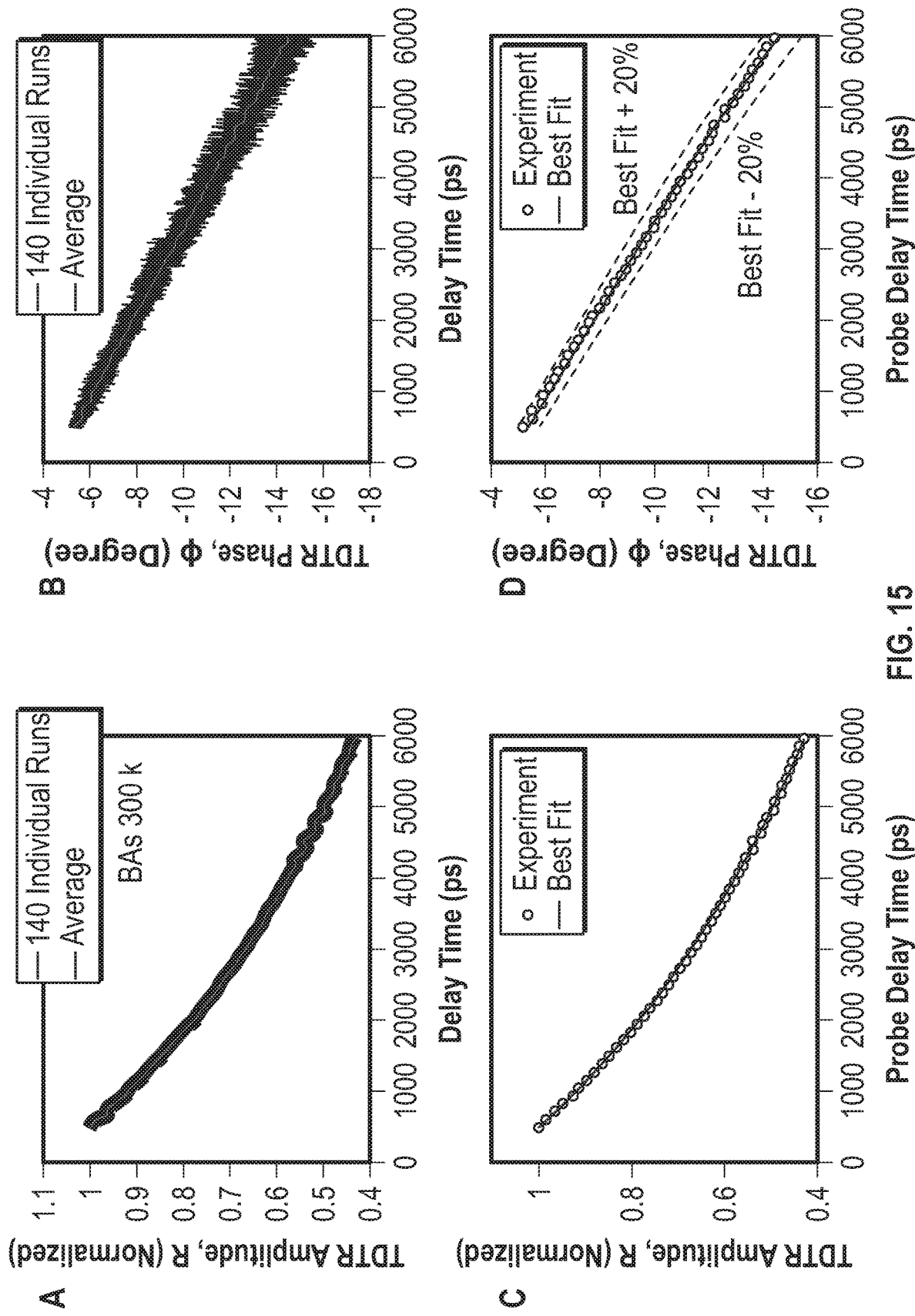
FIG. 15 provides raw data and fitting from TDTR measurement of BAs: Panels (A) and (B) show the amplitude and phase of the measured complex TDTR signal, respectively; about 140 individual runs at room temperature and their average are shown. Fitting to the average phase signal as shown in Panel (D) yields $\square$=1210 W m$^{-1}$ K$^{-1}$ and G=38 MW m$^{-2}$ K$^{-1}$. The dashed lines in Panel (D) show the effect of reducing or increasing the best fitted thermal conductivity by 20%. Further, computing the TDTR amplitude signal based on the $\square$ and G values from fitting to the phase signal also accurately matches the measured amplitude with respect to delay time, as shown in Panel (C).

FIG. 15 provides raw data and fitting from TDTR measurement of BAs. The amplitude and phase of the measured complex TDTR signal are plotted in Panels (A) and (B), respectively. About 140 individual runs (black) at room temperature and their average (semitransparent gray) are shown. Fitting to the average phase signal as shown in Panel (D) yields $\square$=1210 W m$^{-1}$ K$^{-1}$ and G=38 MW m$^{-2}$ K$^{-1}$. The dashed and lines in Panel (D) shows the effect of reducing or increasing the best fitted thermal conductivity by 20%. Further, computing the TDTR amplitude signal based on the $\square$ and G values from fitting to the phase signal also accurately matches the measured amplitude with respect to delay time, as shown in Panel (C).

FIG. 16 shows sensitivity analysis for TDTR measurement of BAs. The best fitted interface thermal conductance and diamond thermal conductivity from FIG. 15 were assumed. Fitting to the amplitude signal in Panel (A) is more sensitive to the interface thermal conductance between Al and diamond, while fitting to the phase as shown in Panel (B) is more sensitive to the thermal conductivity of diamond. Further, the measurement sensitivity to the thermal conductivity is higher at lower modulation frequency (3 MHz vs. 12 MHz). As a result, 3 MHz modulation was used for all the TDTR measurement in this work.

FIG. 17 shows residual contour for TDTR measurement of BAs. The best fitted interface thermal conductance and diamond thermal conductivity from FIG. 15 were assumed. The contours denote a typical normalized residual of 0.03. Fitting to the phase is expected to lead to much smaller spread in the obtained thermal conductivity values. In comparison, fitting to the amplitude may suffer from coupling between the sample thermal conductivity and interface thermal conductance.

Figure 18:
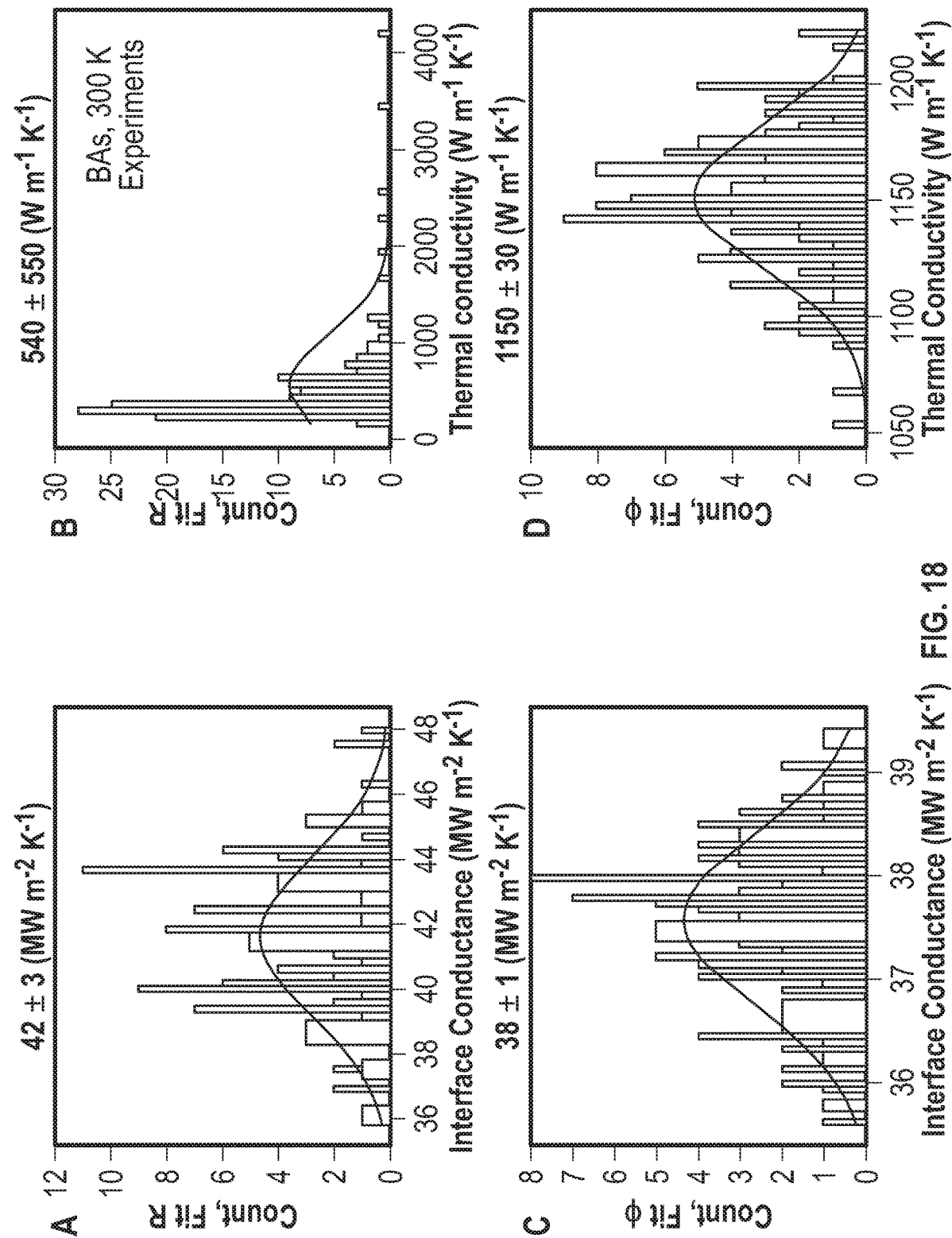
FIG. 18 shows results from fitting to 140 individual TDTR runs on BAs: Panels (A) and (B) fitting to the amplitude signal; Panels (C) and (D) fitting to the phase signal.

FIG. 18 shows results from fitting to 140 individual TDTR runs on BAs. The histograms are the experimental data and the lines are the best-fit normal distributions. Fitting to the phase signal (Panels (C) and (D)) from the individual runs, and then computing the average and standard deviation yields $\square$=1150±30 W m$^{-1}$ K$^{-1}$ and G=38±1 MW m$^{-2}$ K$^{-1}$. Fitting to the amplitude signal (Panels (A) and (B)) yields a similar G of 42±3 MW m$^{-2}$ K$^{-1}$. However, the fitted $\square$ has a large uncertainty of over 100% and the distribution deviates largely from normal distribution. In good agreement with the sensitivity and uncertainty analyses shown in FIG. 16 and FIG. 17, in this case fitting to amplitude is not reliable for obtaining the thermal conductivity of the sample. Note that the small standard deviations here only reflect the experimental noise.

Figure 19:
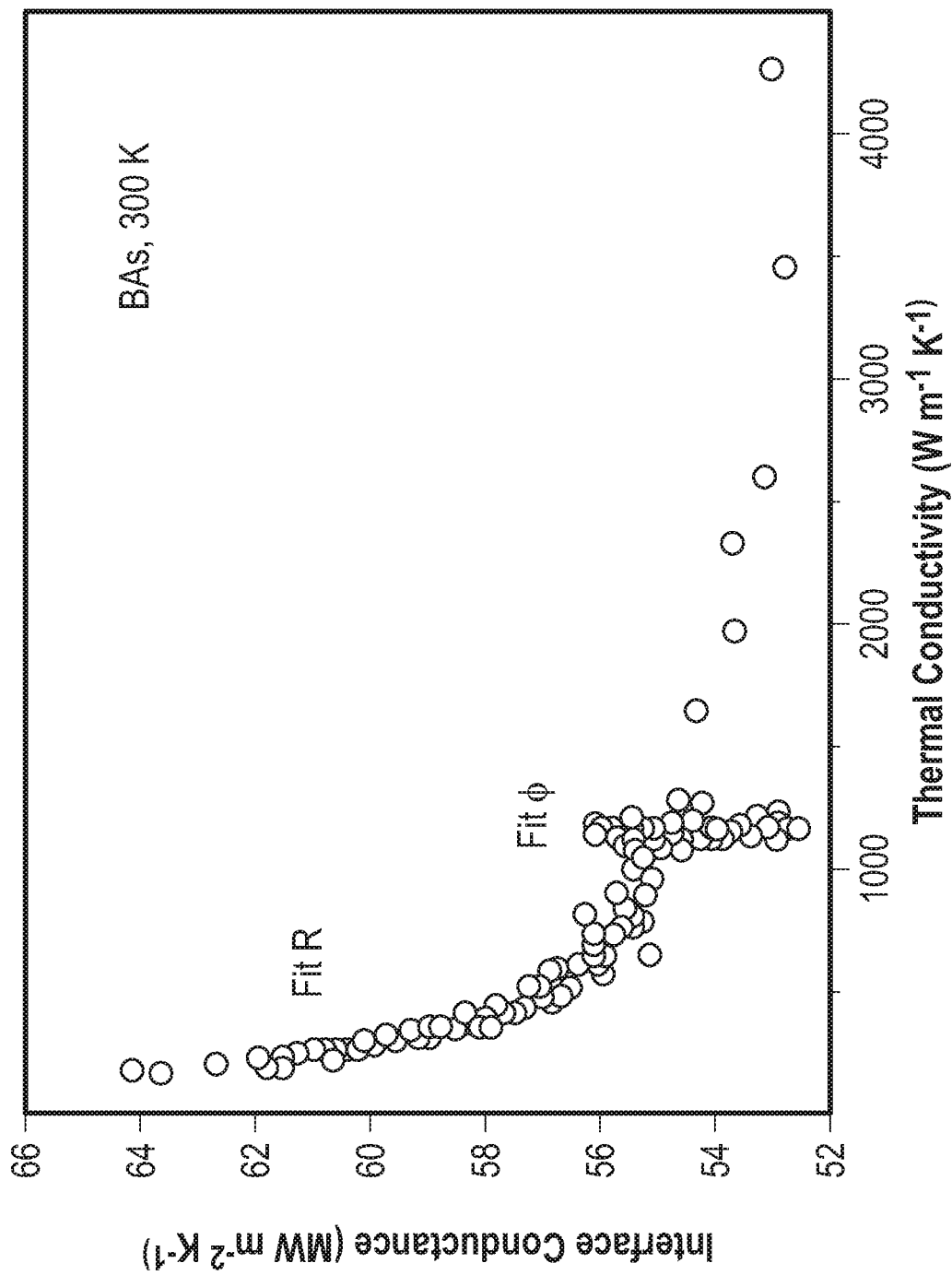
FIG. 19 shows interface thermal conductance versus sample thermal conductivity on BAs.

FIG. 19 shows interface thermal conductance versus sample thermal conductivity on BAs. Results from fitting to 140 individual runs. The distribution of the fitted values resembles the residual contours shown in FIG. 17.

Figure 20:
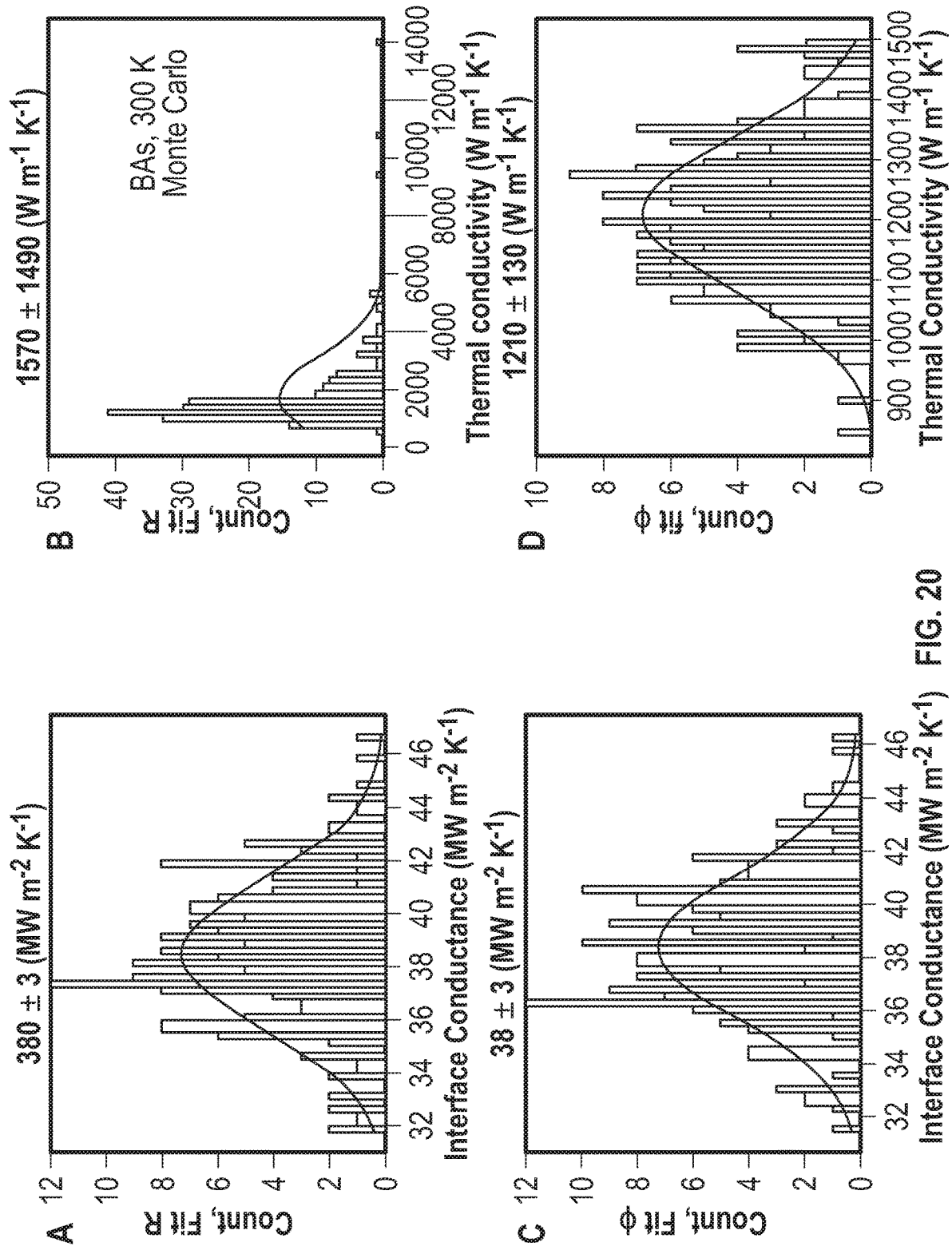
FIG. 20 shows Monte Carlo simulations for TDTR measurement of BAs: Panels (A) and (B) Fitting to the amplitude signal; Panels (C) and (D) Fitting to the phase signal.

FIG. 20 shows Monte Carlo simulations for TDTR measurement of BAs. The histograms are the experimental data and the lines are the best-fit normal distributions. The best fitted interface thermal conductance and BAs thermal conductivity from FIG. 15 were assumed. The key input parameters in the fitting process, such as laser spot size, Au film thickness, thermal conductivity and heat capacity, as well as the heat capacity of diamond were all assumed to have a normal distribution characterized by mean values from the literature and a typical standard deviation of 5%. The simulations indicate that fitting to the phase signal leads to much smaller uncertainty in the thermal conductivity, and an uncertainty of about 11% is calculated.

Figure 21:
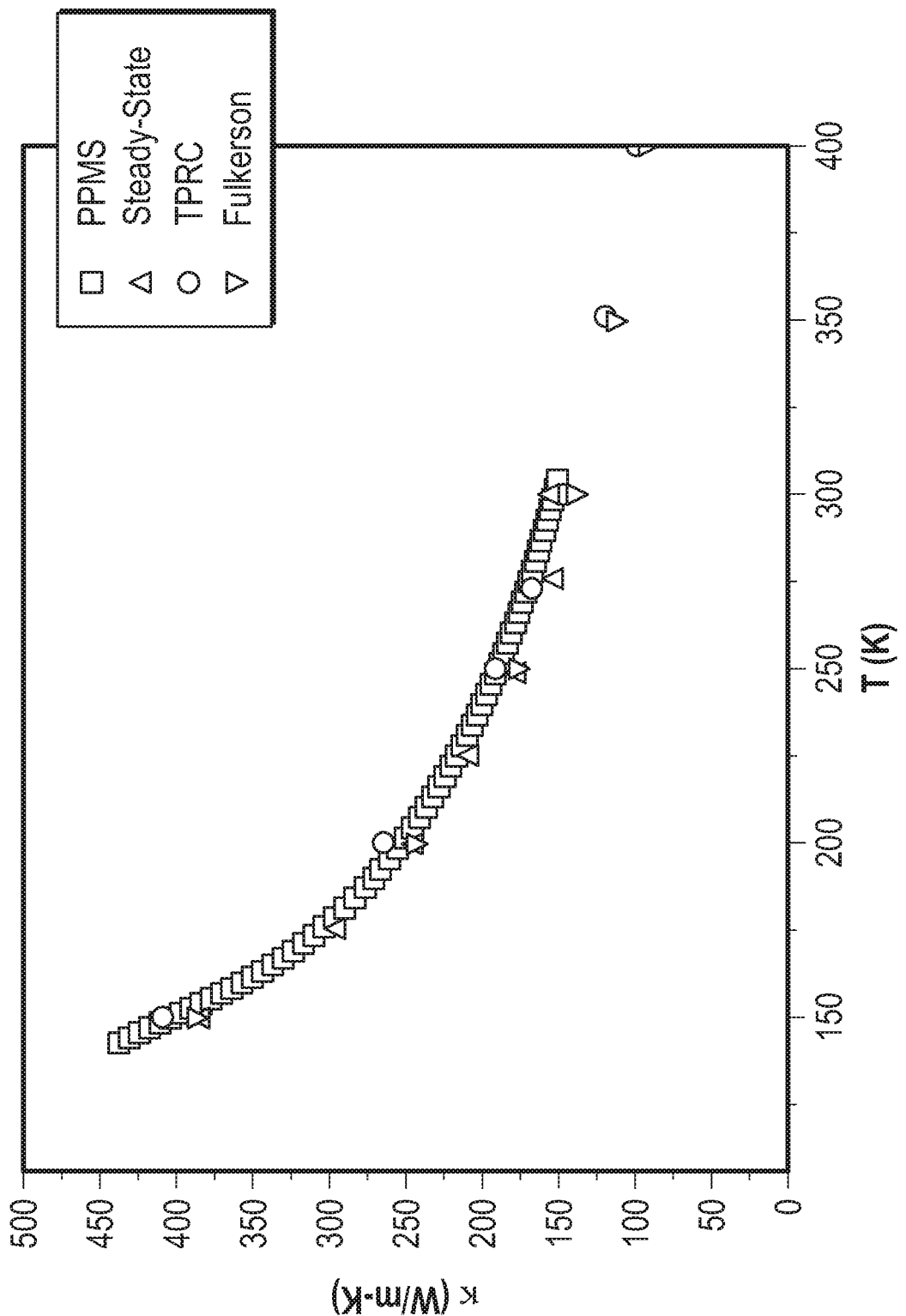
FIG. 21 shows thermal conductivity of Si measured by PPMS and steady-state method in comparison with the literature value.

FIG. 21 shows thermal conductivity of Si measured by PPMS and steady-state method in comparison with the literature value.

Figure 22:
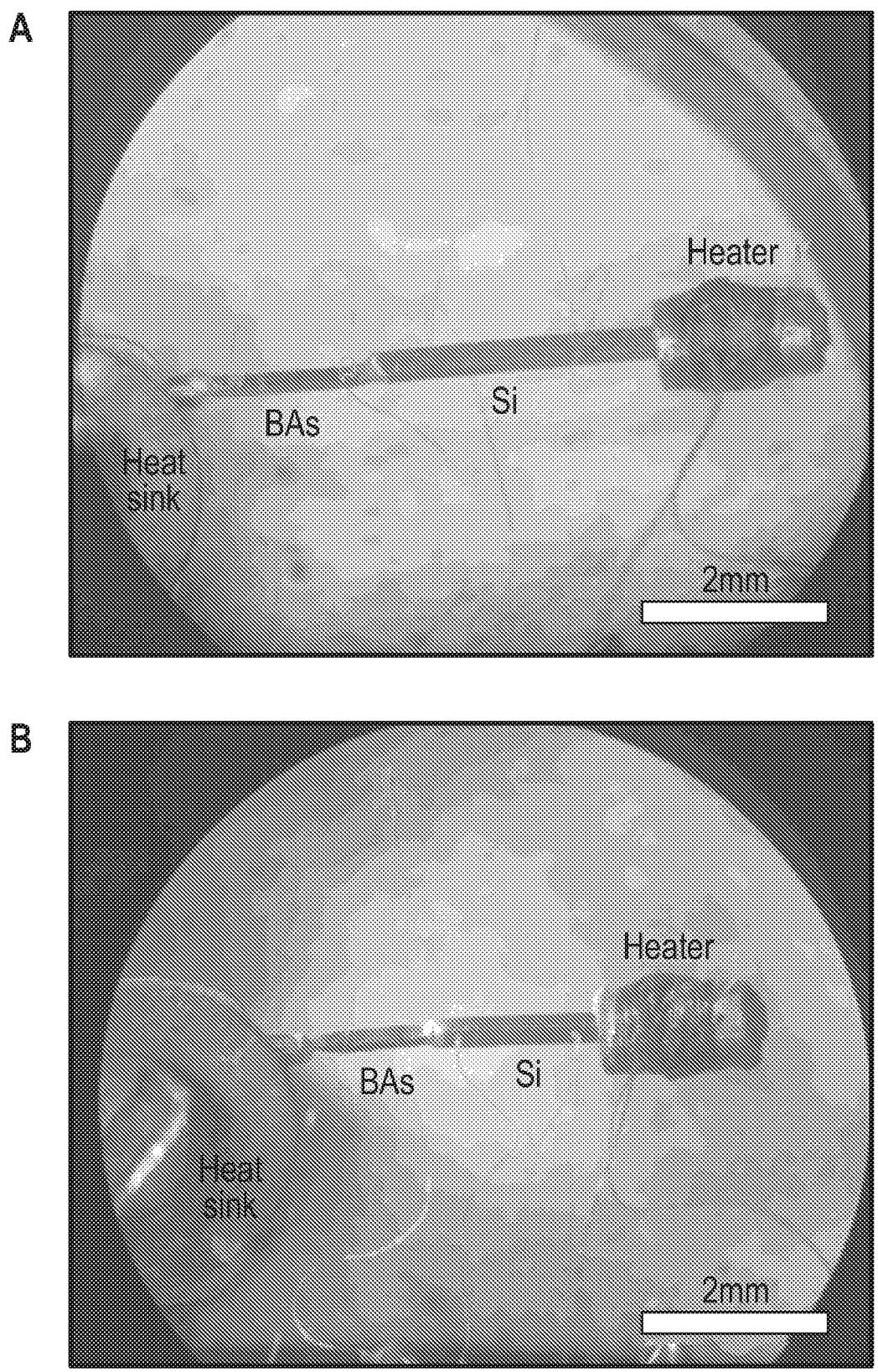
FIG. 22 is a photograph showing the suspended BAs and Si bars for the steady state thermal conductivity measurement.

FIG. 22 is a photograph showing the suspended BAs and Si bars for the steady state thermal conductivity measurement.

Figure 23:
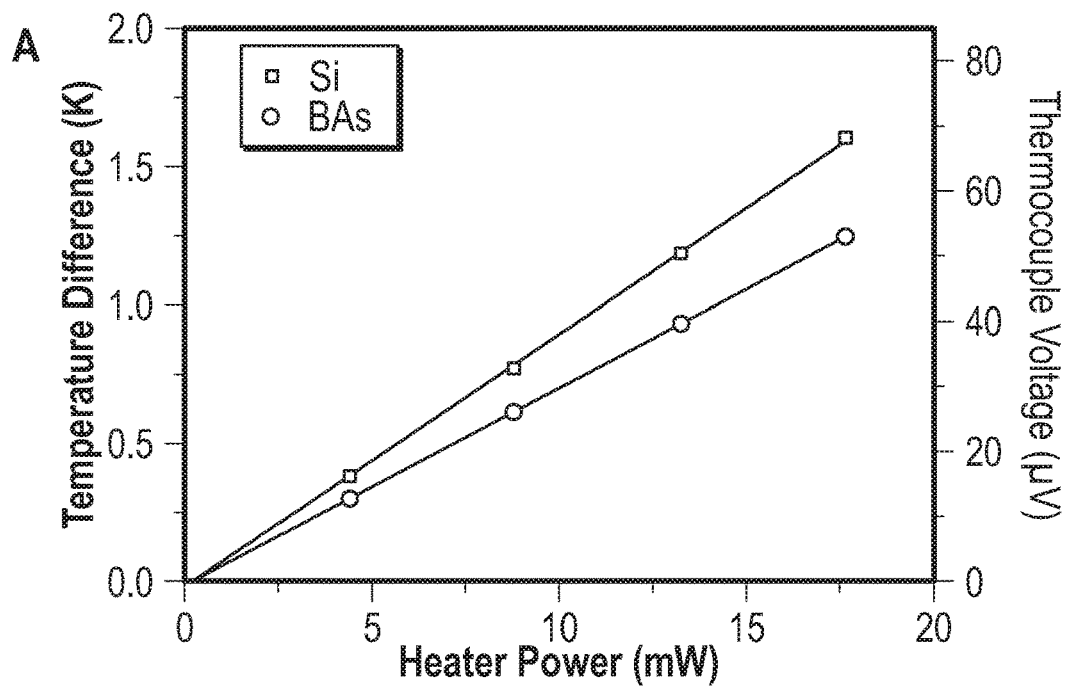
FIG. 23 shows differential thermocouple voltage readings and corresponding temperature drops on the Si and BAs bars as a function of the heater power in Panel (A), and thermal conductivity of Sample #4 measured by the steady state method in Panel (B).
Figure 23:
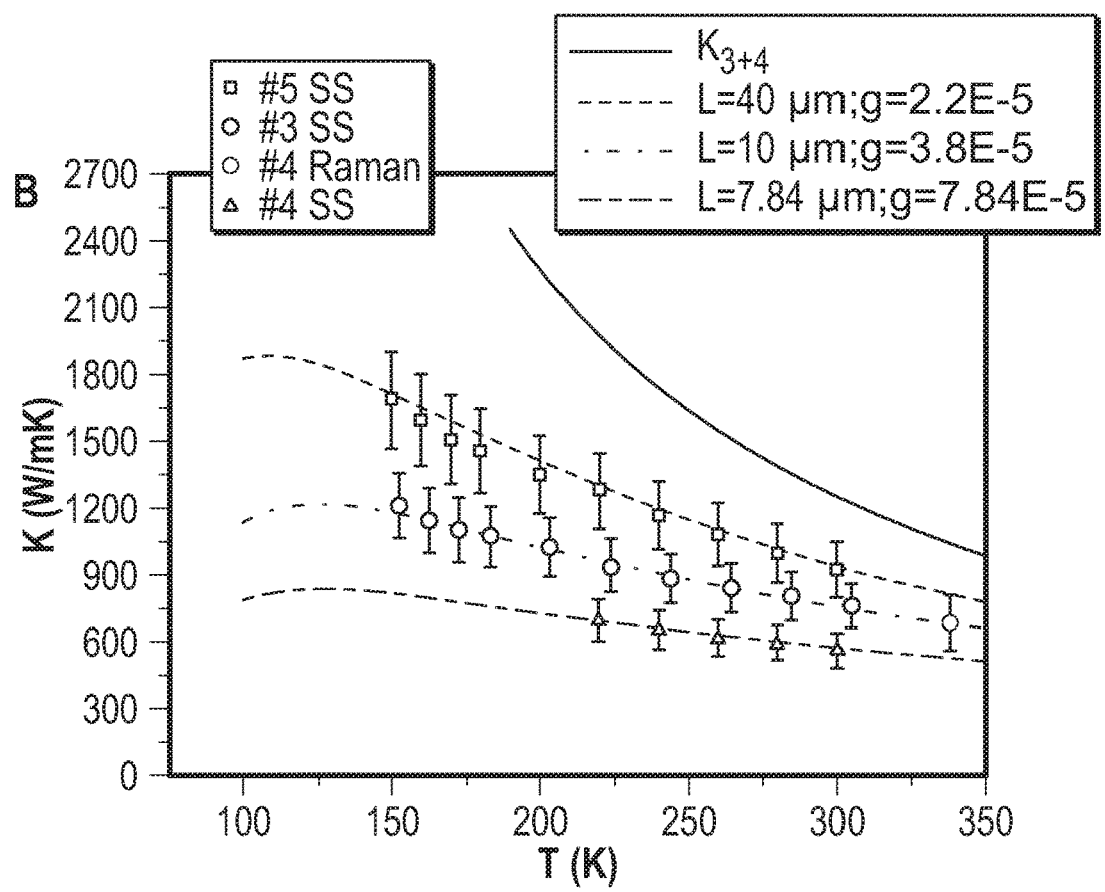

In Panel (A), FIG. 23 shows differential thermocouple voltage readings and corresponding temperature drops on the Si and BAs bars as a function of the heater power. The lines are linear fitting to the measurement data (symbols). In Panel (B), FIG. 23 shows thermal conductivity of Sample #4 measured by the steady state method.

Figure 24:
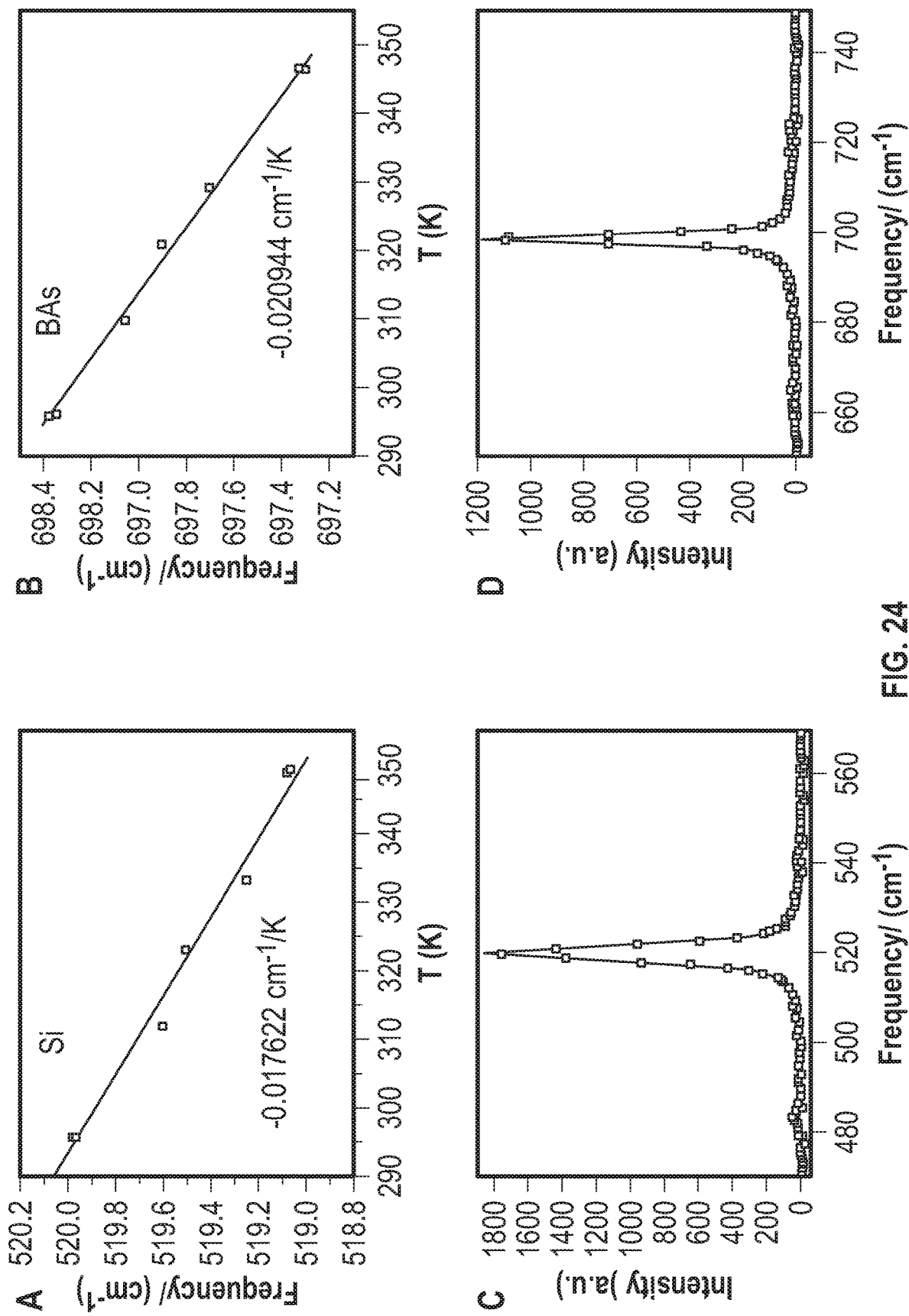
FIG. 24 shows temperature dependent Raman peak frequency for Si and BAs, in Panels (A) and (B), respectively, and Raman peaks for Si and BAs at an ambient temperature of 299.4 K, in Panels (C) and (D), respectively.

FIG. 24 shows temperature dependent Raman peak frequency for Si (Panel (A)) and BAs (Panel (B)). The lines are linear fits to the data (symbols), and the slope of the linear fits are indicated in the figure. Typical Raman peaks for Si and BAs at an ambient temperature of 299.4 K are shown in Panels (C) and (D), respectively.

Frequency-Domain Thermoreflectance (FDTR)

A FDTR platform with continuous-wave (CW) pump and probe lasers was employed. Briefly, an amplitude modulated pump laser (785 nm wavelength) heats up the sample while a probe laser (532 nm wavelength) monitors the resulting temperature change by detecting the change in the surface reflectance as a function of modulation frequency. A periodically modulated pump laser induces periodic heating (about 10 kHz to 50 MHz) in the sample, which thermally modulates the surface reflectance at the same frequency. A lock-in amplifier subsequently resolves both the amplitude and phase of the reflectance signal, which was fitted to an analytical Fourier heat conduction model to yield various sample thermal properties including the thermal conductivity and the interface thermal conductance. The pump and probe diameters used were 3.36±0.14 µm and 2.60±0.10 µm, respectively, with a 20× objective, and 5.60±0.20 µm and 4.80±0.14 µm with a 10× objective. These beam sizes and uncertainties were measured using a knife-edge technique featuring a microfabricated photomask and a piezoelectric scanning stage.

At a given modulation frequency, a larger phase lag between the probe and the pump indicates a smaller thermal conductivity. Panel (B) of FIG. 2 presents some representative FDTR phase curves measured on BAs, diamond, sapphire with a room-temperature (RT) thermal conductivity close to about 35 W m$^{-1}$ K$^{-1}$, and fused silica with the thermal conductivity about 1.4 W m$^{-1}$ K$^{-1}$. For diamond and BAs, the phase lag between heating and sensing remains close to zero degrees up to a few megahertz heating, indicating very high thermal conductivity. The high thermal conductivity, relatively low interface thermal conductance, as well as the relatively small sizes of the laser beams, are some of the challenges in accurate thermal conductivity measurement. The uncertainties of the FDTR measurements were quantified using an established derivative matrix-based approach that accounts for both the measured experimental noise and the propagation of the uncertainties in the input parameters to the heat transfer model.

Steady-State Comparative Method

The thermal conductivity of the samples was measured in the temperature range from about 150 K to 300 K by a steady-state comparative method. The bar-shaped BAs samples with a dimension of about 0.1×0.2×2 mm were cut from as-grown crystals. The reference was a bar of undoped Si with a dimension of about 0.4×0.4×4 mm, which was diced from a large Si rod with a diameter of 25.4 mm. The thermal conductivity of the large Si rod was measured with Quantum Design Physical Property Measurement System (PPMS) to be consistent with the literature value, as shown in FIG. 21. The BAs sample was joined with epoxy in series with the Si reference. They were suspended and placed between a resistive heater and a heat sink, as shown in FIG. 22. The differential thermocouple was made of a constantan wire connected with two copper wires at the two ends, with a diameter of 12.7 μm for all the wires. The thermocouple junctions were anchored on the sample surface using superglue, with the lead wires suspended in vacuum. The sample was enclosed by a Cu radiation shield and placed in a cryostat that was evacuated to about $1 \times 10^{-6}$ torr by a turbomolecular pump. At each environment temperature, the temperature drops along the Si reference and the BAs sample were measured by the two differential thermocouples at different heating powers, as shown in Panel (A) of FIG. 23, where the slopes of the linear fitting were used to calculate the ratio in the temperature gradient between the sample and the reference and obtain the sample thermal conductivity. In addition, the thermal conductivity of a 0.4×0.4×3 mm Si bar was measured by the steady-state method using another 0.4×0.4×4 mm Si bar as the reference. The obtained data agree with the measurement results by PPMS, as shown in FIG. 21. In addition, BAs Sample #4 was measured by the steady-state comparative method. The obtained thermal conductivity is about 570±70 W m$^{-1}$ K$^{-1}$ at 305 K, as shown in Panel (B) of FIG. 23.

Non-Contact Lock-In Raman Thermometry Method

In order to evaluate the error caused by the contact resistance between the thermocouple and the sample, a Raman thermometry method is employed in this work to measure the intrinsic thermal conductivity of BAs. In this measurement, a 532 nm laser was focused through a 50× objective lens in a backscattering geometry onto the silicon reference and the BAs in locations near the attached differential thermocouple junctions. Inelastically scattered light was sent to a Raman spectrometer, and the positions of silicon 520 cm$^{-1}$ band and BAs 697 cm$^{-1}$ band were used as local temperature sensors for the reference and sample, respectively. A unique lock-in detection approach was employed to improve the temperature sensitivity of the Raman thermometry in order to resolve the small temperature drop along the BAs bar. In this approach, the direct current in the heater attached to the Si reference was modulated to follow a sinusoidal pattern of the form $$I(j) = I_0 \sin\frac{2j\pi}{N} \text{ with } N = 12$$

with N=12 and the integer j increasing from 0 to 25 N. The period of each measurement cycle, roughly 1000 seconds, is longer than the thermal time constant of the setup to ensure that a steady state has been reached in the measurements. In addition to the lock-in Raman measurements of the suspended sample heated by the modulated electrical heating current, the Raman peak frequencies of both the Si reference and the BAs were also measured when the Si reference and the BAs sample were placed directly on a hot plate as a function of the hot plate temperature to obtain the temperature coefficient of the Raman peak position, as shown in FIG. 24.

Figure 25:
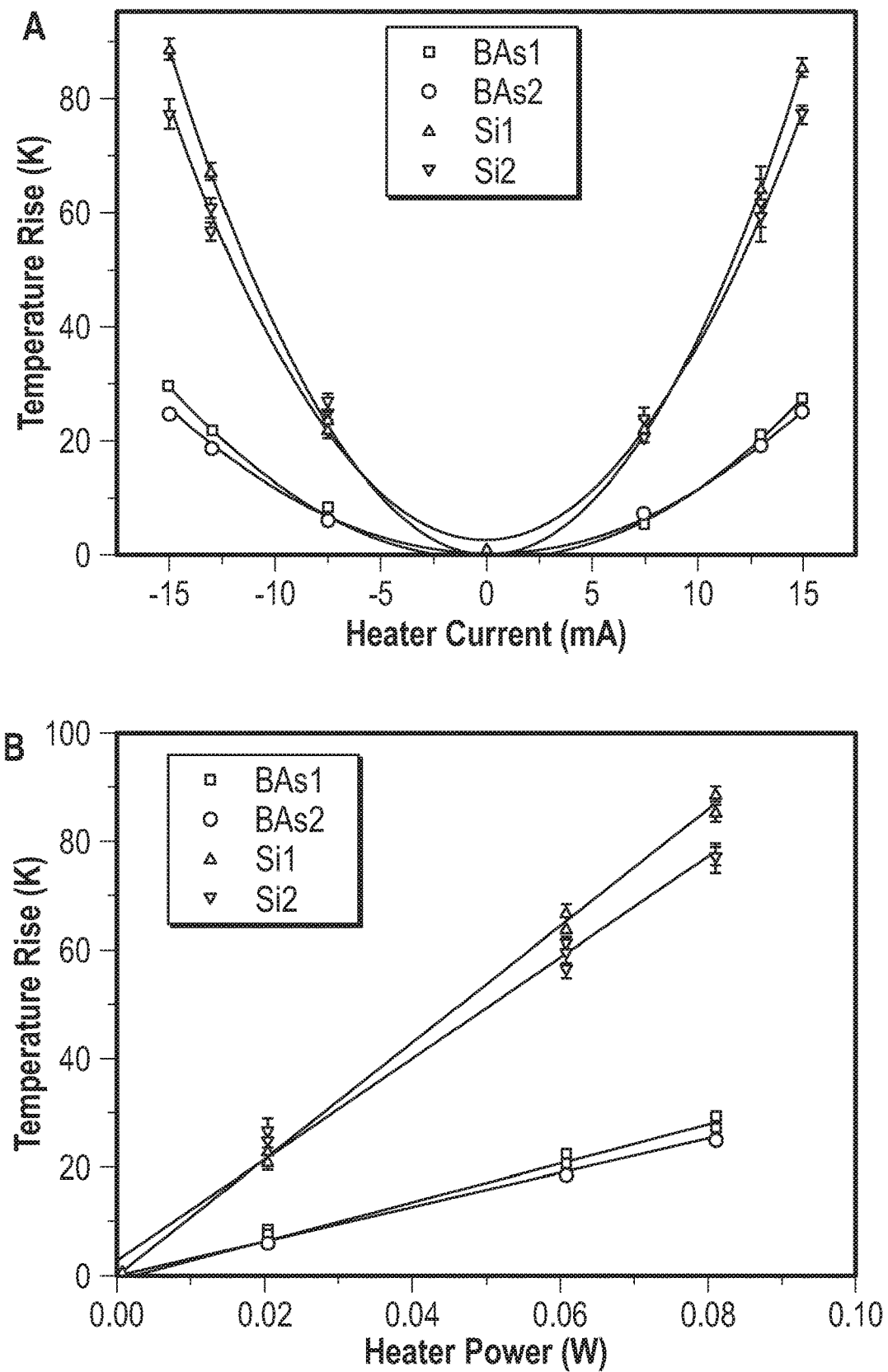
FIG. 25 shows temperature rise obtained from the Raman measurements on both Si and BAs bars as a function of heater current (Panel (A)) and heater power (Panel (B)).
Figure 26:
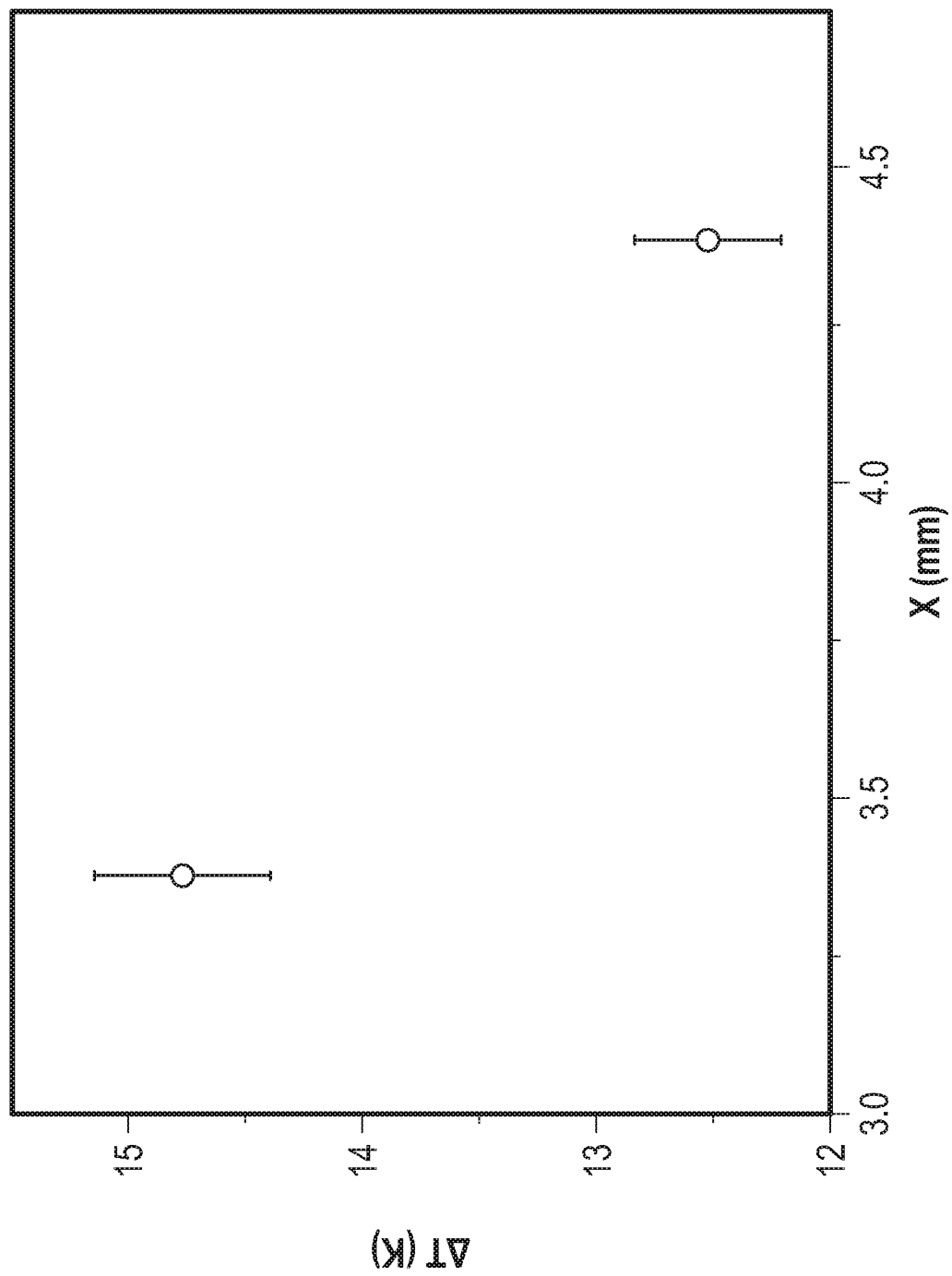
FIG. 26 shows the temperature modulations on the BAs bar obtained from Raman measurements.

FIG. 25 shows temperature rise obtained from the Raman measurements on both Si and BAs bars as a function of heater current (Panel (A)) and heater power (Panel (B)). The curves are parabolic and linear fitting to the measurement data in Panel (A) and Panel (B), respectively. The ambient temperature was 308.9 K and the heater power amplitude is 0.081 W. Each value was obtained by averaging 25 data points measured at the same heating current level during different cycles. The temperature gradients obtained from this average data were 4.0±2.1 K/mm for the Si bar and 2.4±1.7 K/mm for the BAs bar at a heater power of 0.081 W. The uncertainties in these average data are still large because the average values still contain a wide spectrum of noise.

In comparison, the uncertainty is considerably reduced by Fourier component analysis of the Raman data measured with the modulated heating approach. The obtained temperature gradients based on this approach are 2.6±0.6 K/mm across the Si bar and 2.2±0.4 K/mm across BAs bar. Here, the lock-in Raman measurement method eliminates the noise at other frequency components, isolates the signal caused by Joule heating at the second harmonic frequency, and significantly improve the signal to noise ratio at the heating frequency so as to resolve the small temperature drop across the BAs bar. In particular, the drift in the ambient temperature was eliminated by the subtraction of the Raman shift at the first point in each cycle, which no Joule heating was applied, from the other 11 points in the cycle. Taking the FFT of the obtained data yields the zero-point offset peak shift amplitude spectrum with a smaller noise floor than the amplitude spectrum of the peak shift alone, while yielding an identical peak shift amplitude value. In the FFT shown in Panel (B) of FIG. 4, the ratio between the noise floor and the second harmonic peak amplitude is below 0.7%, which represents the relative uncertainty in the peak amplitude measurement. Indicating a signal to noise ratio over 150, this noise is sufficiently small compared to the 15% difference in the peak amplitude measured at the two locations.

Uncertainty Analysis for Steady State Thermal Conductivity Measurements

In the comparative method, the thermal conductivity of the sample is obtained as $$\kappa_s = \frac{\kappa_r \nabla T_r A_r}{\nabla T_s A_s} \tag{S1}$$

in which κ is the thermal conductivity denoted by the subscript s for the BAs sample and r for the Si reference, ∇T is the temperature gradient measured by either the thermocouples or by Raman, A is the cross-sectional area. The temperature gradient is given by ∇T=ΔT F∆x where the temperature difference ΔT across the length Δx=x$_2$−x$_1$ is either measured directly by the differential thermocouples or by Raman. In the Raman measurement, the temperature drop across the sample and reference is obtained as $\Delta T=\theta_2-\theta_1$, where $\theta_i$ is the Raman-measured temperature rise at point i.

The uncertainty in $\kappa_s$ is calculated as $$\delta \kappa_s = \left[\left(\frac{\partial \kappa_s}{\partial \kappa_r}\delta\kappa_r\right)^2 + \left(\frac{\partial \kappa_s}{\nabla T}\delta\nabla T\right)^2 + \left(\frac{\partial \kappa_s}{\partial A_r}\delta A_r\right)^2 + \left(\frac{\partial \kappa_s}{\partial \nabla T_s}\delta\nabla T_s\right)^2 + \left(\frac{\partial \kappa_s}{\partial A_s}\delta A_s\right)^2\right]^{\frac{1}{2}} \quad (S2)$$

In the Raman measurements, the uncertainty in $\Delta T$ is computed by the quadrature sum of the uncertainties in $\theta_i$:

$$\delta \Delta T = \left[\left(\frac{\partial \Delta T}{\partial \theta_2}\delta\theta_2\right)^2 + \left(\frac{\partial \Delta T}{\partial \theta_1}\delta\theta_1\right)^2\right]^{1/2} \quad (S3)$$

Furthermore, the uncertainty in each Raman-measured temperature rise $\theta J$ arises from two sources. The first source is the uncertainty in the measured Raman shift, $\Delta\omega$, which is quantified by the signal-to-noise ratio (SNR) of the peak amplitude in the FFT of the zero-point offset Raman shift data (peaks in Panel (B) of FIG. 4). This random uncertainty is approximately 0.7%, which is considerably smaller than the random uncertainty in the average value of the 25 measurements of the peak shift at the same peak power. The Raman shift is then converted into a temperature rise based on the calibrated temperature-dependent Raman slope, $\chi=d\omega/dT$, which is the second source of random uncertainty. The temperature rise measured at point i is therefore $$\theta_i = \left|\frac{\Delta\omega_i}{\chi}\right|.$$

The uncertainty in $\theta_i$ is given by:

$$\delta\theta_i = \left[\left(\frac{\partial \theta_i}{\partial \Delta\omega_i}\delta\Delta\omega_i\right)^2 + \left(\frac{\partial \theta_i}{\partial \chi}\delta\chi\right)^2\right]^{1/2} \quad (S4)$$

The quantity $\chi$ is obtained as the slope in a least-squares fit to a set of N data point pairs $(T_p,\omega_p)$. The least-squares fit slope is given as:

$$\chi = \frac{N\sum_{p=1}^{N}T_p\omega_p - \sum_{p=1}^{N}T_p\sum_{p=1}^{N}\omega_p}{N\sum_{p=1}^{N}(T_p)^2 - \left(\sum_{p=1}^{N}T_p\right)^2} \quad (S5)$$

The random uncertainty in $\chi$ is therefore:

$$\delta\chi = \left[\sum_{p=1}^{N}\left(\frac{\partial \chi}{\partial \omega_p}\right)^2\delta\omega_p^2 + \sum_{p=1}^{N}\left(\frac{\partial \chi}{\partial T_p}\right)^2\delta T_p^2\right]^{1/2} \quad (S6)$$

where $\delta\omega_p$ is the random uncertainty in n measurements of the Raman shift at each temperature point $T_p$ given by:

$$\delta\omega_p = \frac{t_{n-1,95}\sigma_{\omega_p}}{\sqrt{n}} \quad (S7)$$

in which $t_{n-1,95}$ is the t-distribution value for 95% confidence and n−1 degrees of freedom, and $\sigma_{wp}$ is the standard deviation of the n measured values of $\omega_p$.

In addition, the temperature distributions in the sample, reference, and all the thermocouple wires were calculated by accounting for both heat conduction and surface radiation heat loss. In this calculation, the temperature at the hot side of the reference and that at the cold side of the sample, all the thermophysical properties including thermal conductivity, thermal contact thermal resistance, and surface emissivity were specified. Specifically, the thermal conductivity is taken as 811 W m$^{-1}$ K$^{-1}$ for the BAs sample and 140 W m$^{-1}$ K$^{-1}$ for the Si reference, the contact thermal resistance between the Si bar and the BAs bar is assumed to be 500 K W−1, and the surface emissivity is approximated as 0.2, 08, and 0.35 for silicon, BAs, and the thermocouple wires, respectively. The sample bar is divided into three segments along the length so that the two contact points with the suspended differential thermocouple are in between two adjacent segments. The reference bar is similarly divided into three segments. For each segment and for each thermocouple wire, the temperature distribution is described by the radiating fin temperature profile with proper boundary conditions, which are used to obtain a system of 26 equations. The 26 equations are solved with matrix inversion to obtain both the temperature and heat flow rate at each end of each segment or thermocouple wire.

Based on this calculation, the surface radiation heat loss from the BAs sample is calculated to be less than 0.2% of the heat conduction in the BAs. When the contact thermal resistance ($R_C$) for the thermocouple is ignored, the heat loss to the differential thermocouple is less than 0.2% of the heat conduction in the BAs, because the thermal resistance ($R_{TC}$) of the thermocouple wires is much larger than the thermal resistance of the high-thermal conductivity sample. If the calculated temperature drops along the two differential thermocouples are used to calculate the sample thermal conductivity based on the conduction analysis without accounting for the heat loss into the thermocouple and radiation heat loss, the obtained sample thermal conductivity is higher than the specified thermal conductivity by only 0.9%.

In addition, when the contact thermal resistance between the thermocouple junction and the sample surface is included, increasing the contact thermal resistance decreases the heat loss into the thermocouple wire and also increases the difference between the thermocouple junction temperature and the sample temperature. Although the heat loss into the thermocouple is much smaller than the heat conduction in the sample, the differential thermocouple measures a lower temperature drop than the sample temperature drop when the $R_C/R_{TC}$ ratio is non-negligible, and the error in the differential thermocouple measurement increases with the $R_C/R_{TC}$ ratio. The calculated relative error in the temperature drop measured by the differential thermocouple for the BAs increases from 0.4% to 6.7% when $R_C$ is increased from 500 K W$^{-1}$ to 10000 K W$^{-1}$. Because this systematic error was eliminated in the non-contact Raman thermometry method, the similar results obtained by the two methods indicate that the contact resistance error did not play an appreciable role in the thermocouple measurement.

Electrical and Thermoelectric Measurements

Figure 27:
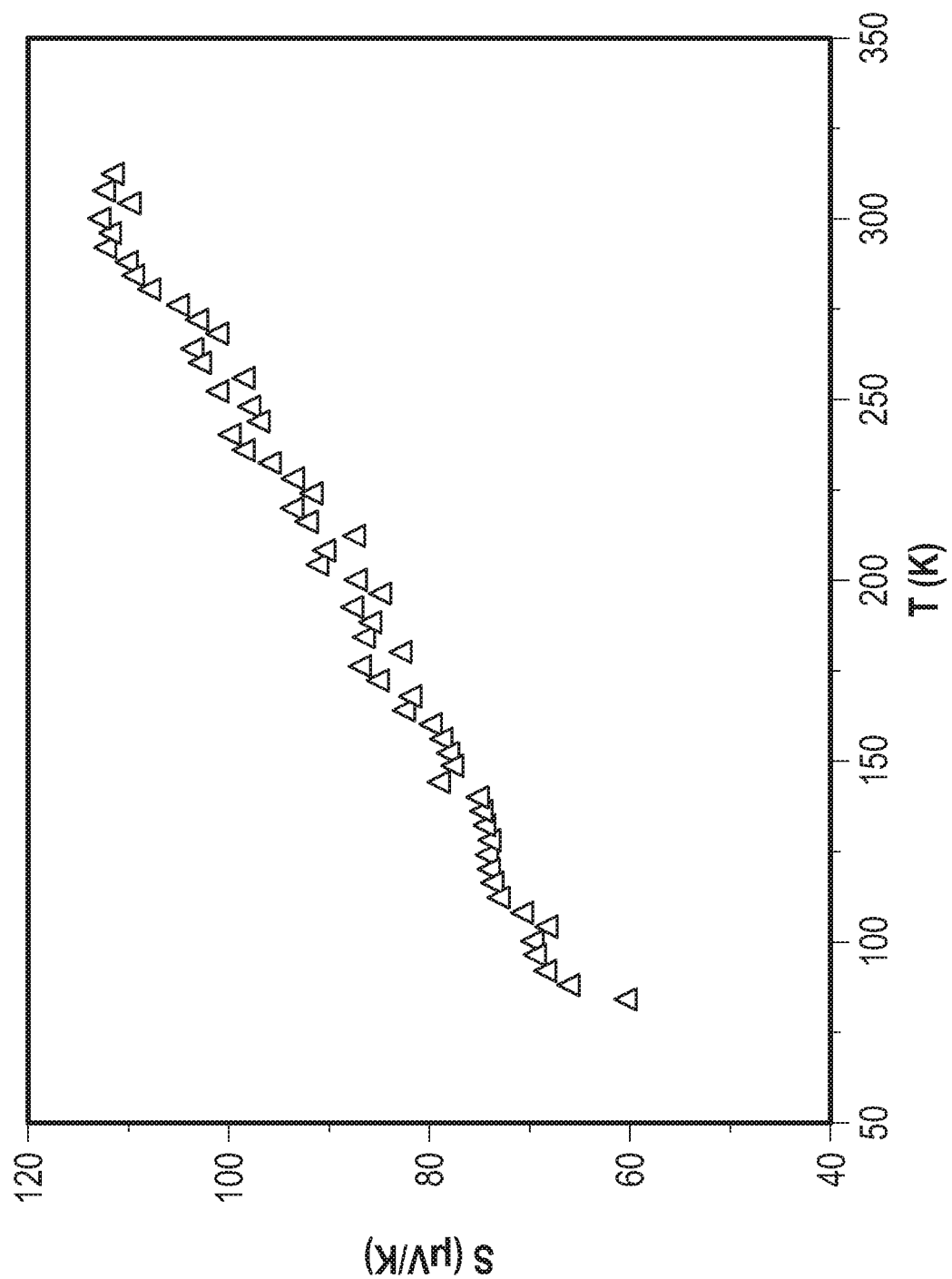
FIG. 27 shows the temperature dependence of the Seebeck coefficient (S) measured in the temperature range 80-320 K with a home-made setup.
Figure 28:
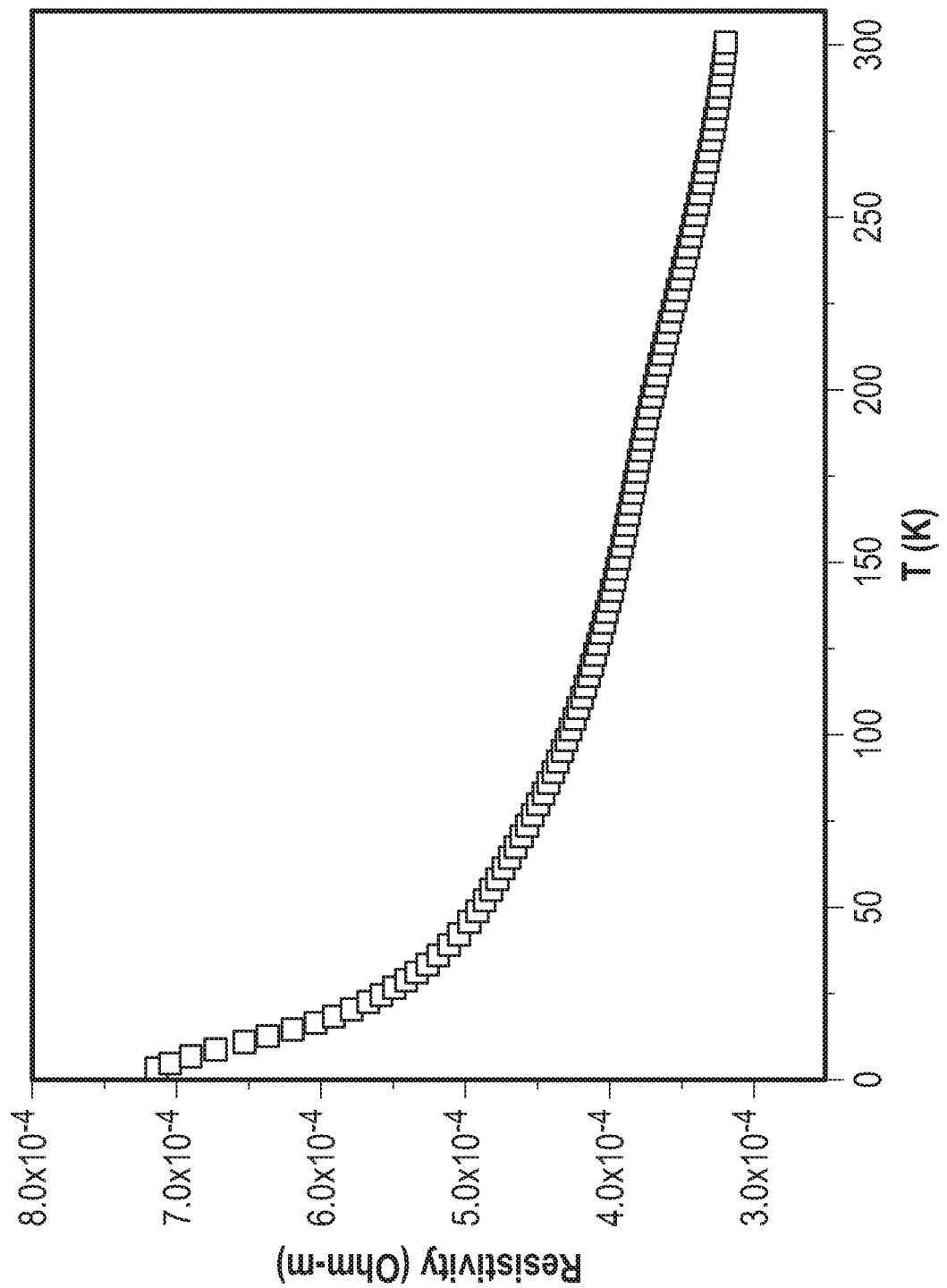
FIG. 28 shows the temperature dependence of resistivity of Sample #3.
Figure 29:
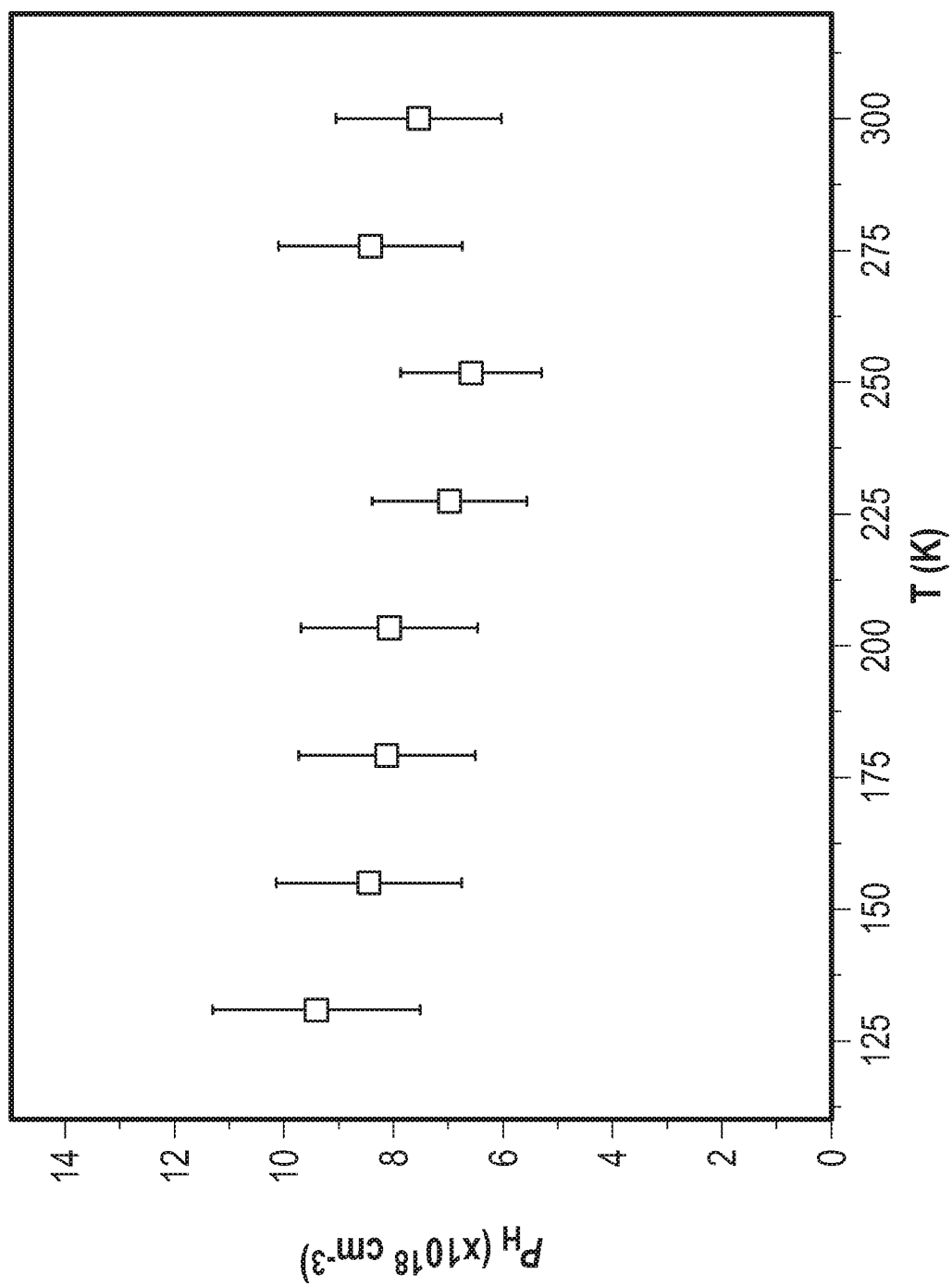
FIG. 29 shows the temperature dependence of the hole concentration of Sample #3.

Electrical and thermoelectric measurements have been carried out on the same BAs crystal used for thermal conductivity measurement. The Seebeck coefficient (S) was measured in the temperature range 80-320 K with a homemade setup. The temperature dependence of S for BAs is plotted in FIG. 27, which shows the temperature dependence of Seebeck coefficient of Sample #3. The S value is about 110 µV K$^{-1}$ at 300 K, and it decreases linearly with decreasing temperature down to 80 K. The positive S value reveals that the majority carriers are holes. The resistivity ($\rho$) of BAs was measured in the temperature range between 3 K and 300 K with a four-probe method, as shown in FIG. 28, which shows the temperature dependence of resistivity ($\rho$) of Sample #3. The room-temperature resistivity is 3.2×10$^{-4}$ Ohm m. The electronic thermal conductivity ($\kappa_e$) can be evaluated via Wiedemann-Franz Law as $\kappa_e = LT/\rho$, where L is the Lorenz number. With L=2.44·10$^{-8}$ V$^2$ K$^{-2}$, the k e is obtained as 0.02 W m$^{-1}$ K$^{-1}$ at 300 K, which is five orders of magnitude lower than the measured total thermal conductivity. The Hall coefficient measurement was carried out on the PPMS with the magnetic field sweeping between ±2 T. The room-temperature hole concentration ($p_H$) and mobility ($\mu_H$) are 7.6×10$^{-18}$ cm$^{-3}$ and 25.9 cm2 V$^{-1}$ s$^{-1}$, respectively. The pH values are almost constant in the measured temperature range, as shown in FIG. 29, which shows the temperature dependence of the hole concentration of Sample #3.

Structural Relaxation and Determination of Interatomic Force Constants

All calculations in this work were performed within density functional theory (DFT) using Norm-conserving pseudopotentials with Perdew-Zunger local density approximation (LDA) exchange correlation functional. A kinetic energy cutoff of 90 Ry, a kinetic energy cutoff for charge density and potential of 360 Ry and a 12×12×12 Γ-centered electronic k-grid provided total energy convergence of less than 10$^{-4}$ Ry and total stress convergence of less than 0.3 kbar per unit cell. The equilibrium structure of the BAs crystal at ambient pressure was determined at each temperature, T, by minimizing the Helmholz free energy, $F_{tot}(a,T) = E(a) + F_{vib}(a,T)$, where a is the lattice parameter, E(a) is the electronic energy, and $F_{vib}$ is the vibrational free energy of the atoms. The quasi-harmonic approximation (QHA) is used here to approximate $F_{vib}$:

$$F_{vib}^{QHA}(a, T) = \sum_\lambda \left[ \left( k_B T \ln(1 - \exp(-\hbar\omega_\lambda(a)/k_B T)) + \frac{1}{2}\hbar\omega_\lambda(a) \right) \right] \quad (S8)$$

Here, $\lambda\square\square\square$(q, s) designates a phonon mode with wavevector q and polarization s. Note that the zero-point motion of the atoms (last term) is explicitly included.

The harmonic interatomic force constants (IFCs) of BAs at each a(T) were calculated using density functional perturbation theory (DFPT) within the Quantum Espresso package. A 9×9×9 Γ-centered q-grid gave converged phonon frequencies and eigenvectors. Third- and fourth-order IFCs were calculated using a thermal stochastic snapshot approach similar to that described in a prior report. In this approach, atoms in a 5×5×5 supercell are thermally displaced according to the canonical ensemble. Each snapshot incorporates full quantum statistics including the zeropoint motion of the atoms. The forces on atoms due to these displacements were computed using DFT and the Hellman-Feynman theorem as implemented in the Quantum Espresso package. For these force-displacement calculations, the kinetic energy cutoffs remained the same as before, but a Γ-point electronic k-grid calculation provided a convergence of less than 10$^{-4}$ Ry/au for forces in the BAs supercell.

The generated force-displacement data were fit to an interatomic potential energy expanded to fourth order:

$$\Phi = \Phi_0 + \frac{1}{2!}\sum_{MN}\sum_{\mu\nu}\sum_{ij}\Phi_{ij}(M\mu, N\nu)U_i(M\mu)U_j(N\nu) + \quad (S9)$$

$$\frac{1}{3!}\sum_{MNP}\sum_{\mu\nu\pi}\sum_{ijk}\Phi_{ijk}(M\mu, N\nu, P\pi)U_i(M\mu)U_j(N\nu)U_k(P\pi) +$$

$$\frac{1}{4!}\sum_{MNPQ}\sum_{\mu\nu\pi\varsigma}\sum_{ijkl}\Phi_{ijkl}(M\mu, N_V, P\pi, Q\varsigma)$$

$$U_i(M\mu)U_j(N\nu)U_k(P\pi)U_l(Q\varsigma)F_i(M\mu) = \frac{\partial\Phi}{\partial U_i(M\mu)}$$

Here, $\Phi_{ij}$(Mµ,Nν), $\Phi_{ijk}$(Mµ, Nν, Pπ), and $\Phi_{ijkl}$(Mµ, Nν, Pπ,Qζ) the second, third and fourth order IFCs for atoms at lattice and basis sites, Mµ, Nν, etc. In practice, when fitting IFCs, the total second-order IFCs and the long-range contributions were subtracted, and the anharmonic IFCs fit to only the remaining forces. By enforcing point group symmetries and translational invariance conditions, the irreducible set of third- and fourth-order anharmonic IFCs was determined and fit using the force-displacement data employing a least squares technique. The fitting procedure was performed on a collection of thermal snapshots simultaneously, and convergence of the IFCs with respect to the number of snapshots was checked at each temperature (T). For BAs, the number of snapshots required to achieve a convergence of less than 0.01 eV/Å$^3$ for the third-order IFCs and less than 0.01 eV/Å$^4$ for the fourth-order IFCs varies from 75 at 100 K to 200 at 1000 K. It is noted that the number of unknown IFCs to be determined from the fit is always much smaller that the number of available force-displacement equations, thereby avoiding any over-fitting errors. Harmonic IFCs up to the tenth nearest neighbor, third order IFCs up to the seventh nearest neighbor and fourth order IFCs up to the third nearest neighbor were calculated. No significant change in the specific heat and thermal conductivity were observed when including one more shell of nearest neighbors for either third- or fourth-order IFCs.

Solution of the Phonon Boltzmann Equation for Three- and Four-Phonon Scattering

The Peierls-Boltzmann equation for phonon transport (BTE) including both three-phonon and four-phonon scattering processes, linearized for small temperature gradient, can be expressed as:

$$F_\lambda = F_\lambda^0 + \tau_\lambda^{tot}\left[\sum_{\lambda'\lambda''}\left\{W^{(+)}_{\lambda\lambda'\lambda''}(F_{\lambda''} - F_{\lambda'}) + \frac{1}{2}W^{(-)}_{\lambda\lambda'\lambda''}(F_{\lambda''} + F_{\lambda'})\right\} + \right. \quad (S10)$$

$$\sum_{\lambda'\lambda''\lambda'''}\left\{\frac{1}{6}W^{(1)}_{\lambda\lambda'\lambda''\lambda'''}(F_{\lambda'''} + F_{\lambda'} + F_{\lambda''}) + \right.$$

$$\left.\frac{1}{2}W^{(2)}_{\lambda\lambda'\lambda''\lambda'''}(F_{\lambda'''} - F_{\lambda'} - F_{\lambda''}) + \frac{1}{2}W^{(3)}_{\lambda\lambda'\lambda''\lambda'''}(F_{\lambda'''} + F_{\lambda'} + F_{\lambda''})\right\}\right]$$

$F_\lambda$ is a vector, defined in terms of the non-equilibrium distribution function that results from an applied temperature gradient, $\nabla T$: $n_\lambda = n_\lambda^0 + n_\lambda^0(n_\lambda^0+1)F_\lambda \cdot (-\nabla T)$ Here, is the Bose distribution. Also, $$F_\lambda^0 = \frac{\hbar\omega_\lambda}{k_B T^2}\tau_\lambda^{tot} v_\lambda$$

and $$\frac{1}{T_\lambda^{tot}} = \frac{1}{\tau_\lambda^{(3)}} + \frac{1}{\tau_\lambda^{(4)}} + \frac{1}{T_\lambda^{ph-iso}} \quad (S11)$$

where $$\frac{1}{\tau_\lambda^{(3)}} = \sum_{\lambda'\lambda''}\left\{W^{(+)}_{\lambda\lambda'\lambda''} + \frac{1}{2}W^{(-)}_{\lambda\lambda'\lambda''}\right\} \frac{1}{\tau_\lambda^{(4)}} = \sum_{\lambda'\lambda''\lambda'''}\left\{\frac{1}{6}W^{(1)}_{\lambda\lambda'\lambda''\lambda'''} + \frac{1}{2}W^{(2)}_{\lambda\lambda'\lambda''\lambda'''} + \frac{1}{2}W^{(3)}_{\lambda\lambda'\lambda''\lambda'''}\right\}$$

are the three- and four-phonon scattering rates, and $1/\tau_\lambda^{ph-iso}$ is the phonon-isotope scattering rate. The closed form expression as derived by Tamura for Bas was utilized. The three-phonon terms, are:

$$W^{(\pm)}_{\lambda\lambda'\lambda''} = \frac{\pi\hbar}{4N}\frac{n_\lambda^0\left(n_{\lambda'}^0 + \frac{1}{2}\mp\frac{1}{2}\right)(n_{\lambda''}^0+1)}{\omega_\lambda\omega_{\lambda'}\omega_{\lambda''}}|\Phi^{(\pm)}_{-\lambda\lambda'\lambda''}|^2\delta(\omega_\lambda\pm\omega_{\lambda'}-\omega_{\lambda''})$$

The four-phonon terms are:

$$W^{(1)}_{\lambda\lambda'\lambda''\lambda'''} = \quad (S12)$$
$$\frac{2\pi}{\hbar}\frac{\hbar^3}{16N^2}\frac{n_\lambda^0 n_{\lambda'}^0 n_{\lambda''}^0 n_{\lambda'''}^0}{n_\lambda^0}\frac{|\Phi_{-\lambda\lambda'\lambda''\lambda'''}|^2}{\omega_\lambda\omega_{\lambda'}w_{\lambda''}\omega_{\lambda'''}}\delta(\omega_\lambda-\omega_{\lambda'}-\omega_{\lambda''}-\omega_{\lambda'''})$$

$$W^{(2)}_{\lambda\lambda'\lambda''\lambda'''} = \frac{2\pi}{\hbar}\frac{\hbar^3}{16N^2}\frac{(n_{\lambda'}^0+1)(n_{\lambda''}^0+1)n_{\lambda'''}^0}{n_\lambda^0} \quad (S13)$$
$$\frac{|\Phi^{(2)}_{-\lambda-\lambda'-\lambda''\lambda'''}|^2}{\omega_\lambda\omega_{\lambda'}\omega_{\lambda''}\omega_{\lambda'''}}\delta(\omega_\lambda+\omega_{\lambda'}+\omega_{\lambda''}-\omega_{\lambda'''})$$

$$W^{(3)}_{\lambda\lambda'\lambda''\lambda'''} = \quad (S14)$$
$$\frac{2\pi}{\hbar}\frac{\hbar^3}{16N^2}\frac{(n_{\lambda'}^0+1)n_{\lambda''}^0 n_{\lambda'''}^0}{n_\lambda^0}\frac{|\Phi^{(3)}_{-\lambda-\lambda'-\lambda''\lambda'''}|^2}{\omega_\lambda\omega_{\lambda'}\omega_{\lambda''}\omega_{\lambda'''}}\delta(\omega_\lambda+\omega_{\lambda'}+\omega_{\lambda''}-\omega_{\lambda'''})$$

The three- and four-phonon matrix elements are:

$$\Phi_{\lambda\lambda'\lambda''} = \sum_\mu\sum_{N_V}\sum_{P\pi}\sum_{\alpha\beta\gamma}\Phi_{\alpha\beta\gamma}(0\mu;N_V;P\pi) \quad (S15)$$
$$\frac{\varepsilon^\lambda_{\alpha\mu}\varepsilon^{\lambda'}_{\beta v}\varepsilon^{\lambda''}_{\gamma\pi}}{\sqrt{M_\mu M_v M_\pi}}e^{iq'\cdot R(N)}e^{iq''\cdot R(P)}\Phi_{\lambda\lambda'\lambda''\lambda'''} =$$
$$\sum_\mu\sum_{Nv}\sum_{P\pi}\sum_{Q\varsigma}\sum_{\alpha\beta\gamma\delta}\Phi_{\alpha\beta\gamma\delta}(0\mu;Nv;P\pi;Q\varsigma)\frac{\varepsilon^\lambda\varepsilon^{\lambda'}\varepsilon^{\lambda''}\varepsilon^{\lambda'''}}{\sqrt{M_\mu M_v M_\pi M_\varsigma}}\times$$
$$e^{iq'\cdot R(N)}e^{iq''\cdot R(P)}e^{iq'''\cdot R(Q)}$$

In the above, $e_{\alpha\mu}^\lambda$ is the $\alpha_{th}$ component of the phonon eigenvector for atom $\mu$ in mode $\lambda$, while R(N) is the corresponding mass of that atom, and is the lattice vector for the $N^{th}$ unit cell. In the BTE, Eq. S10, the term in the first curly brackets is a three-phonon term, while the term in the second curly brackets is a four-phonon term. The BTE limited only by three-phonon scattering is obtained from Eq. S3 by removing the last term in curly brackets and removing from Eq. S11. The BTE for three-phonon scattering only is now commonly solved for many materials, as for example implemented in ShengBTE.

It is noted that a prior work also performed ab initio calculations of the effect of four-phonon scattering on the lattice thermal conductivity. However, that work did not implement a full solution of the BTE. Specifically, they did not include the last term in curly brackets in Eq. S10. This is equivalent to treating four-phonon scattering in a relaxation time approximation where momentum-conserving normal scattering processes are treated on the same footing as resistive umklapp scattering processes. More importantly, in evaluating $1/\tau_\lambda^{(4)}$, they used a non-adaptive Lorentzian scheme to represent the energy-conserving delta-functions, which is of questionable validity for coarse q-grids.

The main challenge in solving the four-phonon BTE, Eq. S10, is the computation and storage of the four-phonon matrix elements, Eq. S11. For example, even for a modest 17×17×17 q-grid, with six phonon polarizations in BAs, the number of three-phonon matrix elements in the irreducible Brillouin zone for $\lambda$, $\Phi_{\lambda\lambda'\lambda'''}$ is 175 million, while the number of four-phonon matrix elements in the irreducible grid is 5.2 trillion. Furthermore, since Eq. S3 is solved iteratively, the four-phonon matrix elements must not only be computed, but also stored on files for subsequent iterations. To mitigate this challenge, a tetrahedron scheme was utilized, which provides higher accuracy for the energy conservation than the commonly used adaptive Gaussian smearing scheme and non-adaptive Lorentzian scheme. This allows us to obtain convergence with a coarser phonon q-grid density. For example, the 300 K BAs phonon thermal conductivity limited by three- and four-phonon scattering obtained by solving Eq. S10 on a 21×21×21 q-grid was within 5% of that from that obtained for a 17×17-17 q-grid. Therefore, all the thermal conductivity results presented in this work were computed on a 17×17×17 q-grid. The computational and storage cost are reduced significantly by first computing the four-phonon scattering phase space involving the energy conserving δ-functions for each $\overline{\lambda}\lambda'\lambda''\lambda'''$ combination and then computing and storing the matrix elements only for those processes which have a large enough phase space to give non-negligible contribution.

Inclusion of Phonon-Point Defect and Phonon-Grain Boundary Scattering

Phonon-point defect scattering rates for BAs have been calculated using the closed-form expression, Eq. 6. The mass variance parameter, g, characterizes the strength of this mass disorder scattering. Grain boundary scattering is modeled using an empirical scattering rate, $1/\tau_\lambda^{(gb)}=L/v_\lambda$, where L is the characteristic size of the BAs grains. For the isotopic mass disorder on the boron atoms, $g_{iso}=1.36\times10^{-3}$. For the case including both three-phonon and four phonon scattering and phonon-isotope scattering, a best fit to the steady state data in FIG. 3 is obtained with an added point defect scattering on B and As sites of $g_{pd}=3.8\times10^{-5}$ and with grain size of L=10 μm. The fit is excellent. For the case where only three-phonon and phonon isotope scattering are included, a best fit to the steady state data is obtained with an added point defect scattering on B and As sites of $g_{pd}=5.3\times10^{-5}$ and with grain size of L=31 μm. For this case, the fit is much worse with the calculated curve falling just at the low end of the error bars at 150K and lying above them beyond around 230 K (see FIG. 34 below). Since the TDTR data is at higher temperature, using and L fit parameter has a negligible effect so only gpd is used. The fit to the TDTR data (red solid curve in FIG. 3) including three+four-phonon scattering is obtained with $g_{pd}=1.05\times10^{-5}$. The fit is reasonably good with slight overshoot of the high temperature data. Removing four-phonon scattering, a fit parameter of $g_{pd}=4\times10^{-5}$ is used, which gives a significantly worse fit to the TDTR data (See FIG. 35 below).

Phonon-Electron Interaction

Figure 30:
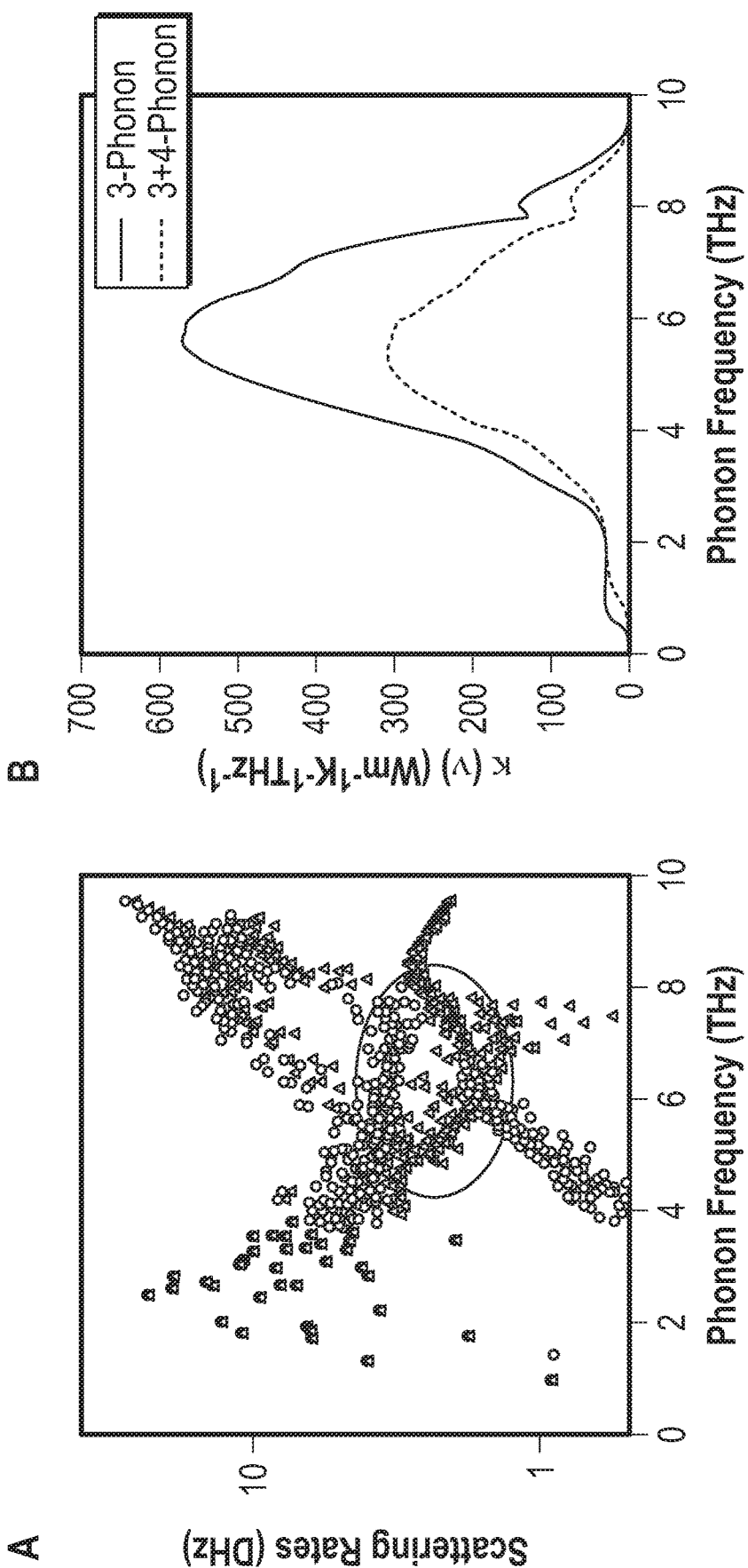
FIG. 30 shows: Panel (A) three-phonon scattering rates (triangles), four-phonon scattering rates (diamonds) and total phonon-phonon scattering rates (open black circles) in BAs at 300K in the frequency range of the acoustic phonons; Panel (B) spectral contribution to the BAs thermal conductivity at 300K when neglecting four-phonon scattering (black curve) and including it (curve).

The phonon-electron interaction becomes significant at high carrier concentration. The phonon scattering rate can be evaluated based on Fermi's golden rule, which is given by, $$\frac{1}{\tau_{pq}^{ph-e}} = \frac{2\pi g_e}{\hbar}\sum_{m,n}\int\frac{dk}{\Omega_{BZ}}|M_{nk,pq}^{mk+q}|^2[(f_{nk}-f_{mk+q})\delta(\hbar\omega_{pq}+\varepsilon_{nk}-\varepsilon_{mk+q})] \quad (S16)$$

where $M_{nk,pq}^{mk+q}$ is the coupling matrix between electrons and phonons. ge denotes the degeneracy of electron. $\varepsilon_{nk}$ and $f_{nk}$ are electron energy and Fermi-Dirac distribution function, and $\omega_{pq}$ and $n_{pq}$ are phonon frequency and Bose-Einstein distribution function. All the inputs in Eq. S16 are given by DFT and DFPT calculations using Quantum ESPRESSO package. A norm-conserving pseudopotential with Perdew-Zunger parameterization of exchange-correlation functional including fully relativistic effect is employed. The cutoff energy of the plane wave is 80 Ry, and the convergence threshold for energy is set to be $10^{-12}$ Ry. The calculations of electron and phonon part are, respectively, performed on the uniform 12×12×12 k-mesh and 6×6×6 q-mesh. Once the electron energy, phonon frequency and phonon perturbed potential on the coarse meshes are obtained, the EPW code is then used to interpolate them to fine meshes. The phonon-electron scattering rates are calculated computed on a 30×30×30 q-mesh associated with a 60×60×60 k-mesh with different carrier concentrations. In Panel (A), FIG. 30 shows three-phonon scattering rates (triangles), four-phonon scattering rates (diamonds) and total phonon-phonon scattering rates (open black circles) in BAs at 300K in the frequency range of the acoustic phonons. Note that the total scattering rates are much larger than the smallest three-phonon scattering rates (circled region) indicating thermal conductivity suppression, as shown in Panel (B). Panel (B) of FIG. 30 shows spectral contribution to the BAs thermal conductivity at 300K when neglecting four-phonon scattering (black curve) and including it (curve). The strong suppression in the 4-8 THz region corresponds to the increase in total scattering rates seen in the circled region of Panel (A).

Figure 31:
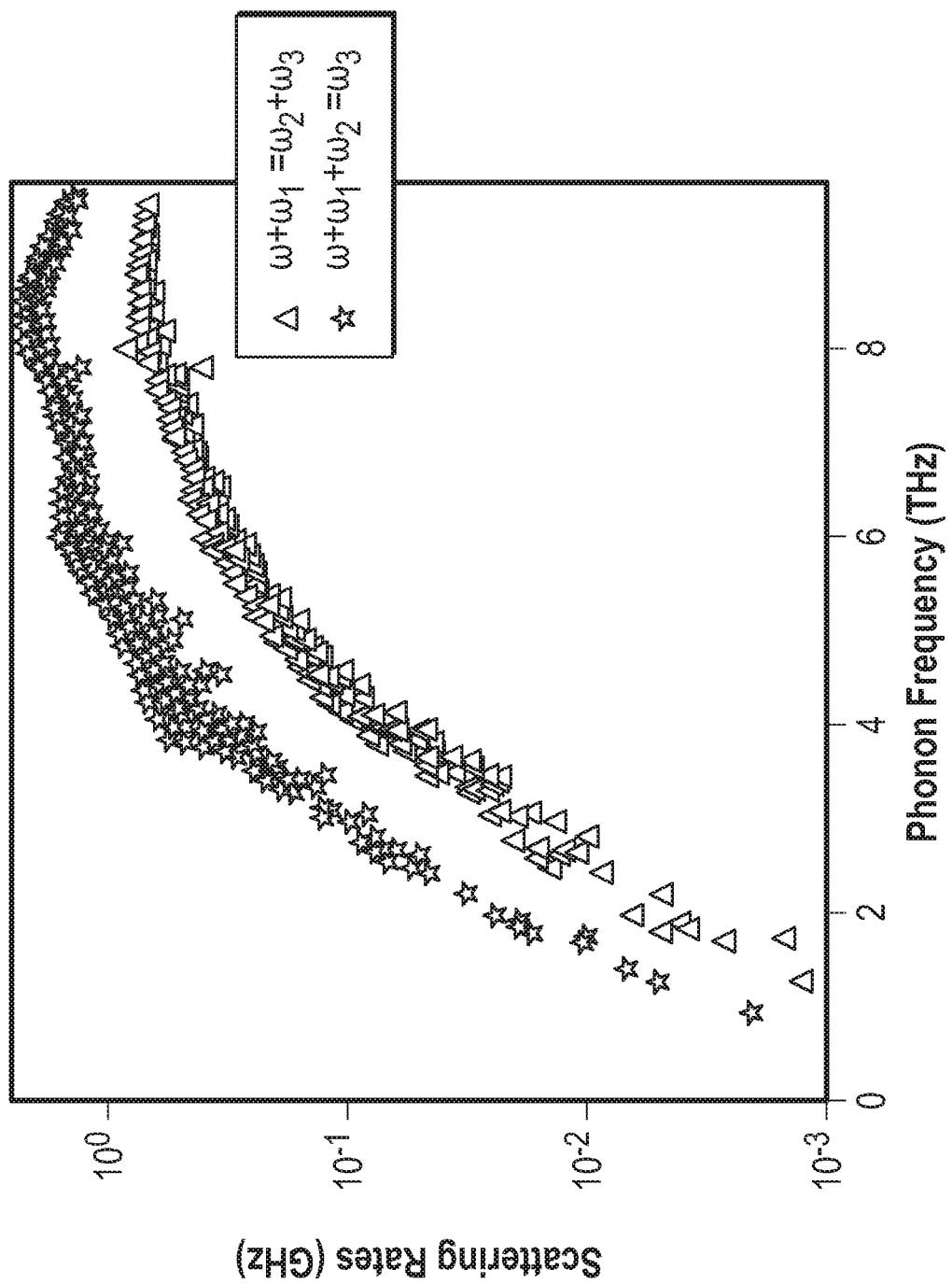
FIG. 31 shows term-wise contribution of four-phonon scattering in BAs at 300 K. Among the three terms contributing to four-phonon scattering (Eq. S12-S14), the dominant one is the third term (Eq. S14). The second term (Eq. S13) is much larger than the third term. For acoustic phonons, the first term (Eq. S12) is negligible since it involves decay of a single low-frequency acoustic phonon into three different phonons while conserving momentum and energy.

FIG. 31 shows term-wise contribution of four-phonon scattering in BAs at 300 K. Among the three terms contributing to four-phonon scattering (Eq. S12-S14), the dominant one is the third term (Eq. S14). The second term (Eq. S13) is much larger than the third term. For acoustic phonons, the first term (Eq. S12) is negligible since it involves decay of a single low-frequency acoustic phonon into three different phonons while conserving momentum and energy.

Figure 32:
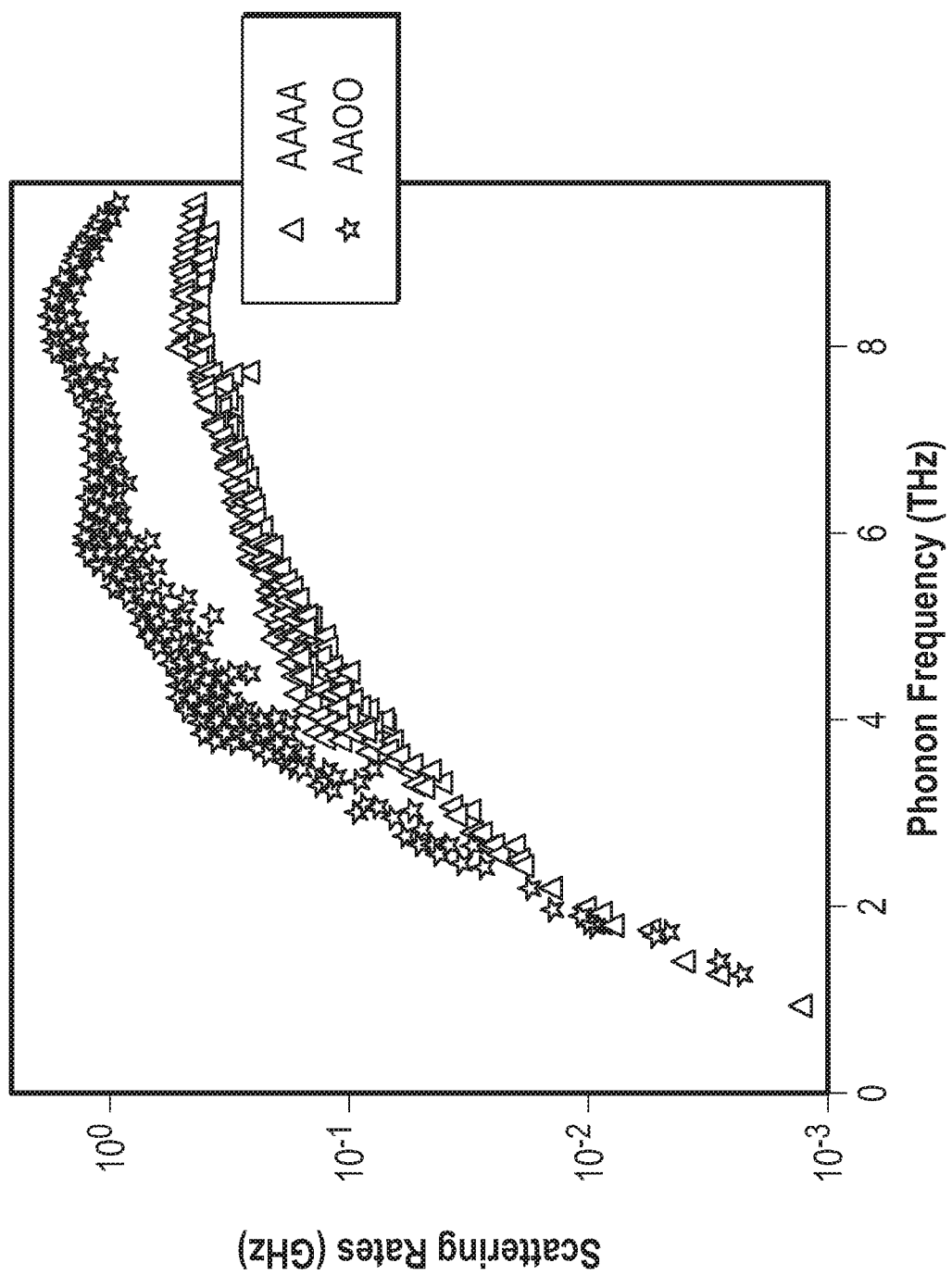
FIG. 32 shows the process-wise breakdown of the third term (Eq. S14) for four-phonon scattering in BAs at 300 K.

FIG. 32 shows the process-wise breakdown of the third term (Eq. S14) for four-phonon scattering in BAs at 300 K. Among the possible AAAA, AAAO, AAOO and AOOO four-phonon processes involving an acoustic phonon, where A represents an acoustic phonon and O represents an optic phonon, the dominant process is the AAOO process, where an acoustic-optic phonon pair combine to give another acoustic-optic phonon pair. All acoustic AAAA processes are weaker than AAOO process, AOOO is forbidden by energy conservation for all acoustic phonons, and AAAO processes are forbidden for all but the highest frequency acoustic phonons, where they are still negligible.

Figure 33:
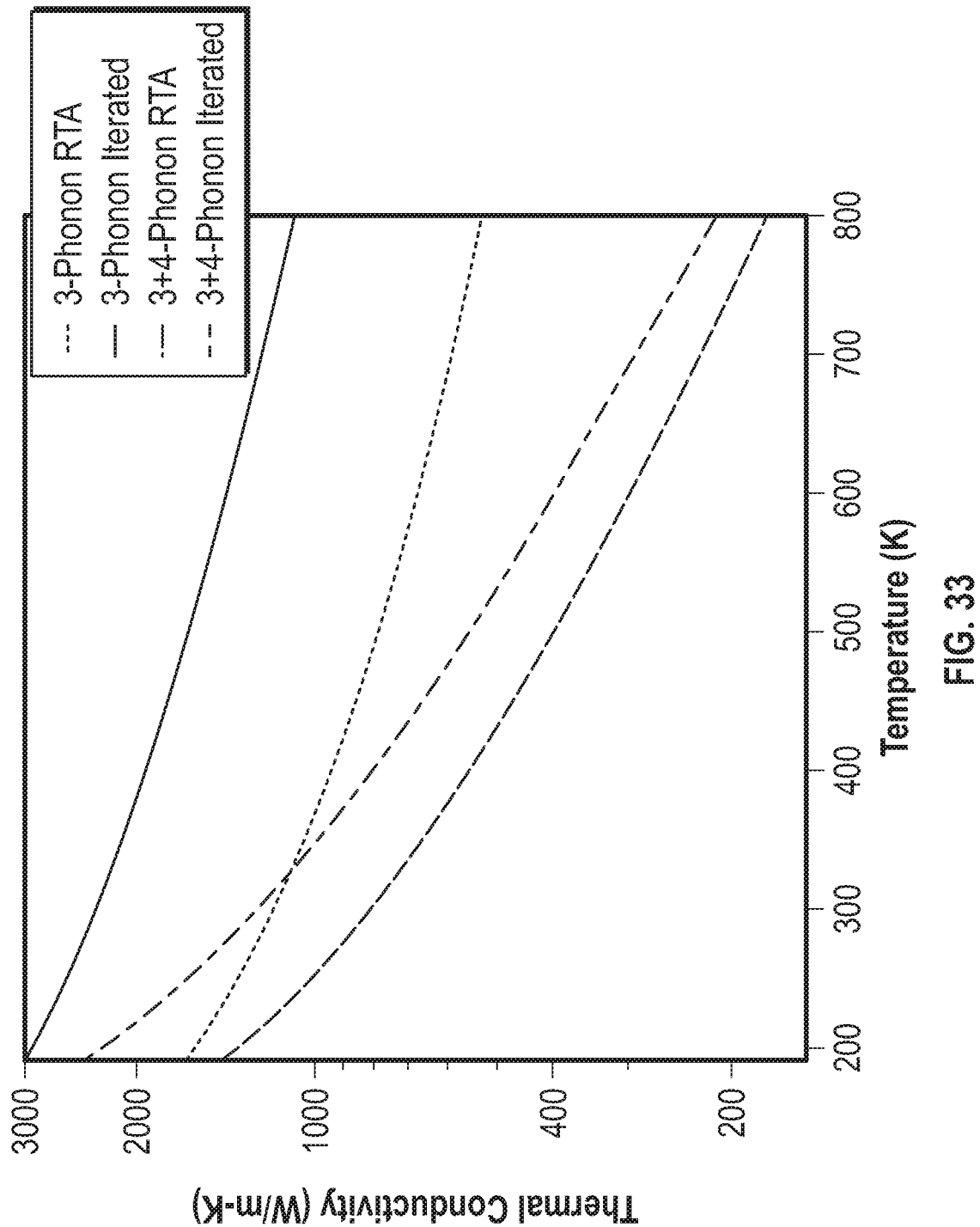
FIG. 33 shows a comparison of three-phonon and three+four-phonon limited thermal conductivity of BAs as a function of temperature using the relaxation time approximation and the fully iterated solution of the three+four-phonon BTE.

FIG. 33 shows a comparison of three-phonon and three+ four-phonon limited thermal conductivity of BAs as a function of temperature using the relaxation time approximation and the fully iterated solution of the three+four-phonon BTE. The four-phonon scattering process significantly reduces the predicted three-phonon limited thermal conductivity of BAs, particularly above room temperature. Even after including four-phonon scattering, the fully iterated solution of the BTE, where the normal and umklapp processes are treated separately, is required for all temperatures, since the RTA approximation significantly underpredicts the thermal conductivity. The stronger temperature dependence for four-phonon scattering is explained hereinabove. It is noted that both RTA and iterated 3+4 phonon thermal conductivities are somewhat smaller than conventionally determined.

FIG. 34 provides a fit to the steady state measured data for BAs without four-phonon scattering. The curve gives a fit to the steady state measurement data (solid squares) for the case of three-phonon and phonon-isotope scattering. Fit is done by adjusting the strengths of additional assumed mass defect and boundary scattering. The fit is not able to accurately capture the data without four-phonon scattering.

FIG. 35 provides a fit to the TDTR measured data for BAs without four-phonon scattering. The curve gives a fit to the TDTR measurement data for the case of three-phonon and phonon-isotope scattering. Fit is done by adjusting the strength of additional assumed mass defect scattering. The strong defect scattering required gives an almost temperature independent curve, contrary to the measured data.

Figure 36:
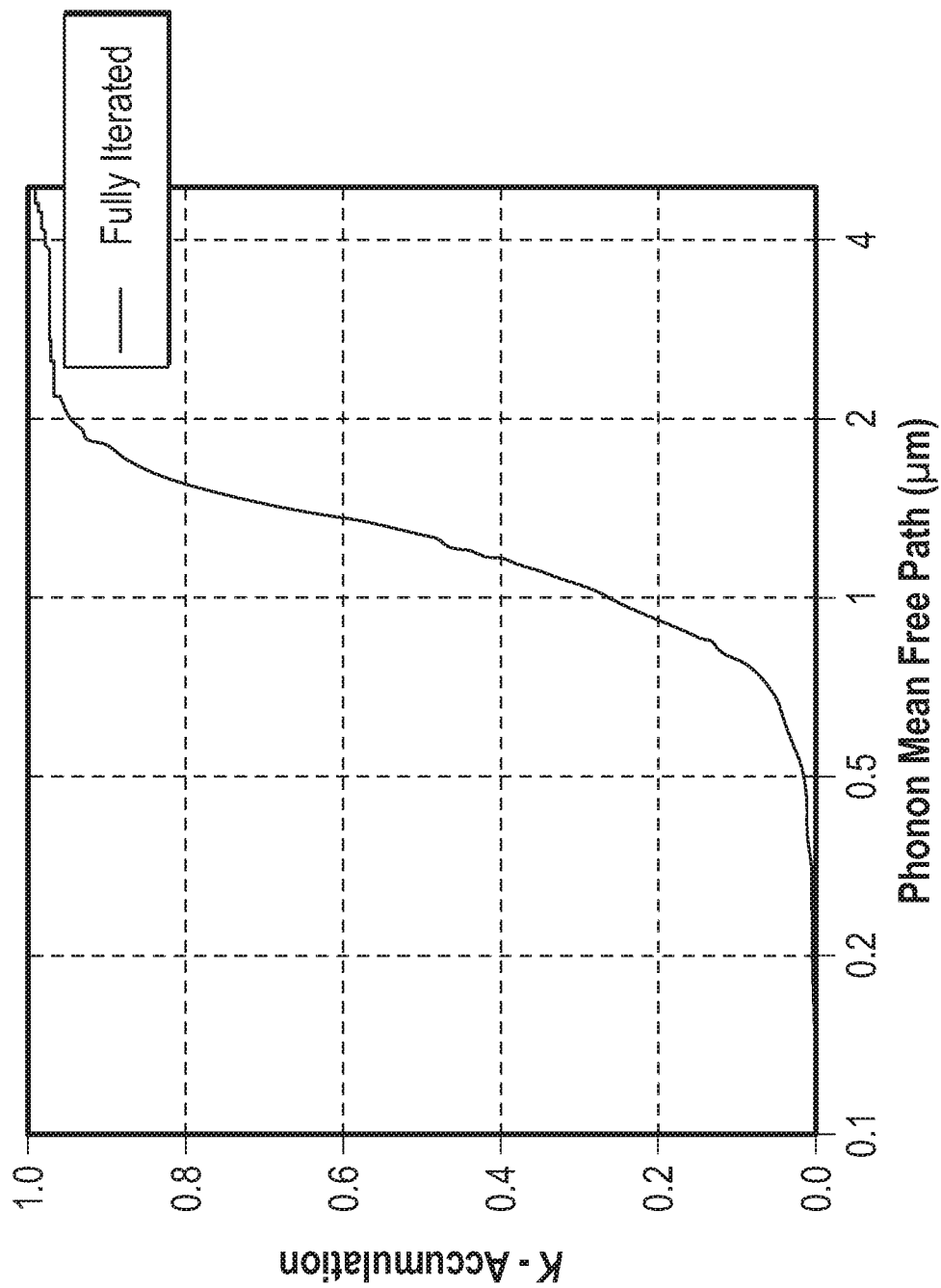
FIG. 36 provides calculated thermal conductivity accumulation vs. phonon mean free path for BAs at 300K.

FIG. 36 provides calculated thermal conductivity accumulation vs. phonon mean free path for BAs at 300K. The accumulation sums the contribution to thermal conductivity below a give mean free path (mfp). Three+four phonon scattering and phonon-isotope scattering are included. The plot of this data shows that there is almost no accumulation beyond 4 μm. The sharp transition region comes from phonons with large lifetimes in the 4-8 THz. This frequency region also has large phonon density of states so gives the dominant contribution to k (see Panel (B) of FIG. 30). These large phonon lifetimes and their corresponding velocities do not vary much in this region thus giving the narrow mfp accumulation.

Figure 37:
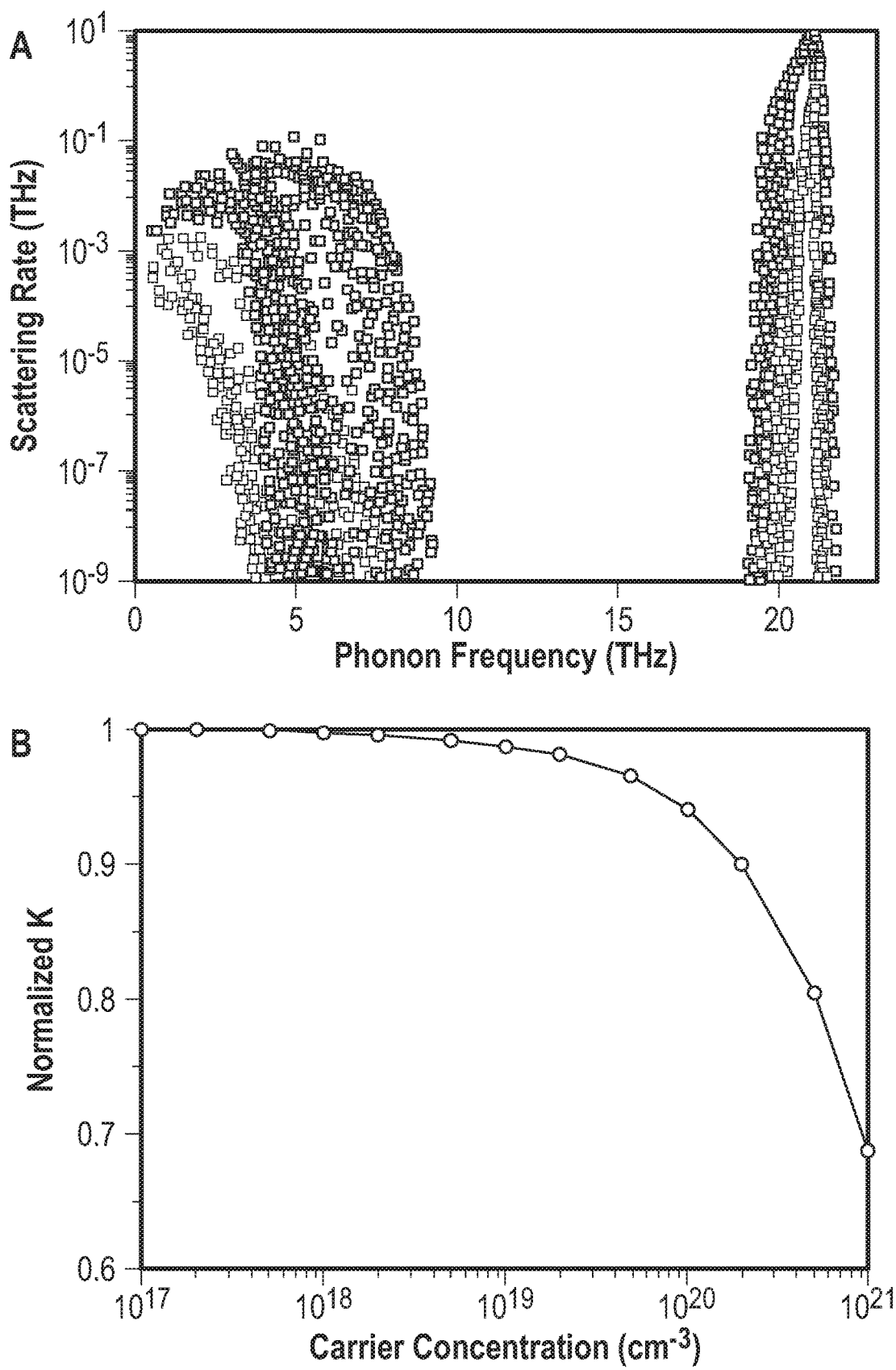
FIG. 37 provides phonon scattering rates arising from electron-phonon interaction at 300 K in Panel (A), and normalized thermal conductivities at 300 K with varying carrier concentrations in Panel (B).

In Panel (A), FIG. 37 provides phonon scattering rates arising from electron-phonon interaction at 300 K. The data are calculated with carrier concentrations of 1019 and 1021 cm$^{-3}$, respectively. Panel (B) of FIG. 37 shows normalized thermal conductivities at 300 K with varying carrier concentrations.

As noted above, Panel (A) of FIG. 37 shows the phonon scattering rates at two typical carrier concentrations, 1019 and 1021 cm$^{-3}$. Since only three-phonon scattering processes are included, normalized thermal conductivities ($\kappa_{ph-e}$+3-ph/$\kappa$3-ph) with varying carrier concentrations are presented in Panel (B) of FIG. 37. At room temperature, the phonon-electron scattering rates are several orders of magnitude smaller than the three-phonon scattering rates (see FIG. 30), and therefore the phonon-electron interaction has no substantial effect on the thermal transport. The figure shows that at 300 K, the thermal conductivity has only about 1.3% reduction at carrier concentration 1019 cm–3 when the phonon-electron interaction is taken into account. The percentage reduction of thermal conductivity will be even smaller if the four-phonon scattering is included.

Seeded Growth of BAs Single Crystals

In this example, larger-size and higher quality BAs single crystals were synthesized via placing tiny BAs single crystal seeds in an improved CVT system using pure B as the source material instead of traditional polycrystalline BAs precursors. First, pure As (Alfa Aesar, 99.999%) and isotopically enriched B (Alfa Aesar, 99.9%, >96%11 B) with an As:B molar ratio of 1.2:1 together with some iodine (I$_2$, Alfa Aesar, 99.999%, 50 mg per cm$^3$ tube volume) were sealed in a fused quartz tube under vacuum. Subsequently, the quartz tube was placed in a horizontal two-zone tube furnace. The mixture of the source materials was placed at the high temperature zone which was held at ~890° C. to avoid decomposition of BAs. Over the course of approximately two weeks (in embodiments, this time can be, for example, from one to 10 weeks for different crystal sizes), many aggregated BAs crystals with typical sizes of 200-400 □m were found in the low temperature zone which was held at ~800° C. These crystals were crushed into pieces. Several small (<20 □m), regularly shaped, and (111)-oriented single crystals were then carefully selected and placed at the crystal growth end of another quartz tube as seed crystals. By repeating the growth process, some larger single crystals were obtained with much better morphology and cleaner surface thanks to seeded nucleation as compared to spontaneous nucleation. It was found that excess As also forms As crystals at the cold end. Consequently, after the growth process, the crystals were collected and etched sequentially with concentrated nitric acid (70.0%) and aqua regia to remove all deposits on the surface of the BAs crystals. Finally, the crystals were cleaned with ethanol and de-ionized water for further characterizations.

Figure 38:
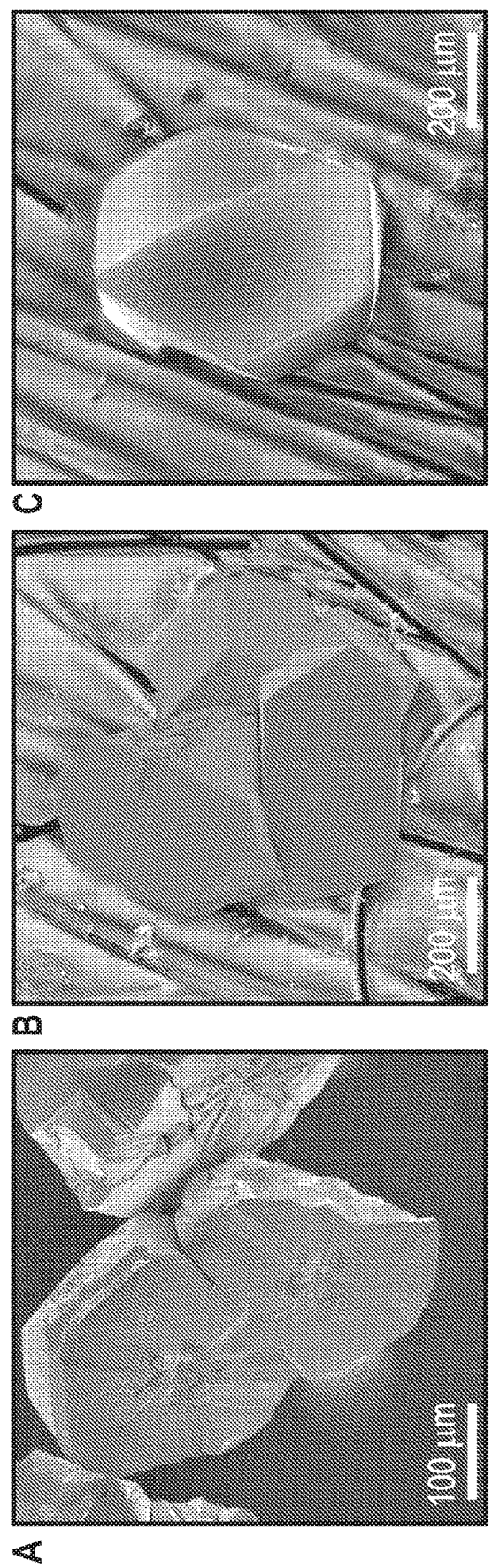
FIG. 38 illustrates SEM images of BAs crystals after cleaning with nitric acid and aqua regia. In Panel (a), BAs crystals with poor quality and central radiative cracks, irregular facets, and multi-domains by regular self-nucleation growth are shown. In Panels (b) and (c), as grown BAs crystals with clean and flat surfaces are shown using the seeding method as described herein.
Figure 39:
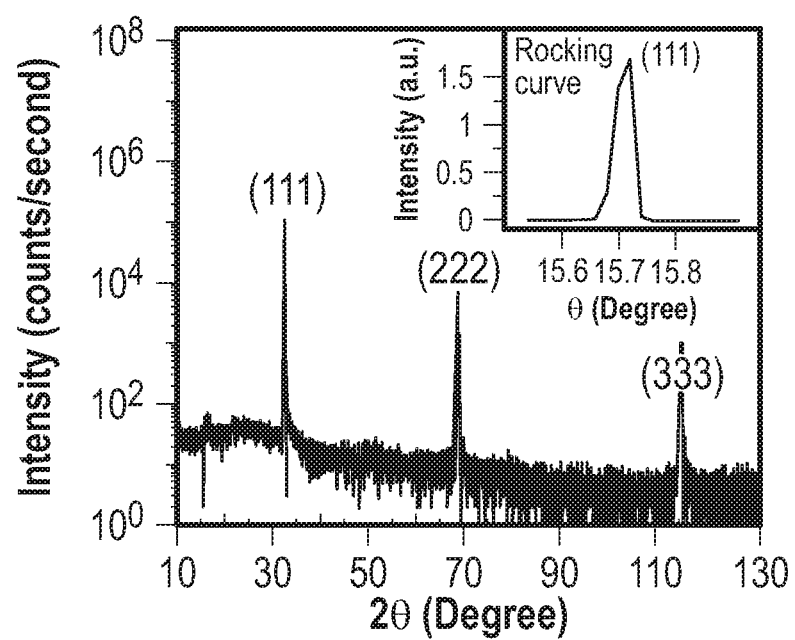
FIG. 39 illustrates an X-ray diffraction pattern taken from a shiny and flat surface with light grey metallic luster on a selected BAs single crystal.

The crystals grown without seeds were normally 200-400 □m in size and of relatively poor quality with cracks, irregular facets, and multiple domains as shown in FIG. 38(a). By contrast, crystals grown from the seeds were bigger with a typical size of 400-600 □m, much better morphology, and cleaner surface [FIGS. 38(b) and 38(c)]. Spontaneously grown crystals with a much smaller size (20-200 □m) were also found inside the quartz tube where no seeds were placed. X-ray diffraction analysis (Rigaku D-max IIIB X-Ray Diffractometer with a Cu K□ radiation source) was performed on the crystals for structural characterization (FIG. 39). The shiny flat surface with light grey metallic luster of the as grown crystals was found to be the (111) facet, the same as the seed crystals, thus confirming the effectiveness of the seeding technique for controlling nucleation and the direction of crystal growth. The rocking curve measurement of the (111) plane showed a full width at half maximum (FWHM) of ~0.056°, indicating relatively low crystal imperfection and high quality of as-grown crystals.

In our effort to improve the crystal quality, systematic experiments were performed with pure B, polycrystalline BAs powder with high As deficiency, and near-perfect (low As deficiency) polycrystalline BAs powder as the source material for CVT BAs crystal growth. BAs crystals were collected at the growth end with either pure B or high As deficiency BAs precursor as the source material, but no BAs crystals were found when the BAs precursor with low As deficiency were used. Although no experimental data for the Gibbs free energy of BAs are currently available, the conclusion that at around 900° C., I$_2$ can hardly react with near-perfect BAs can be drawn.

Figure 40:
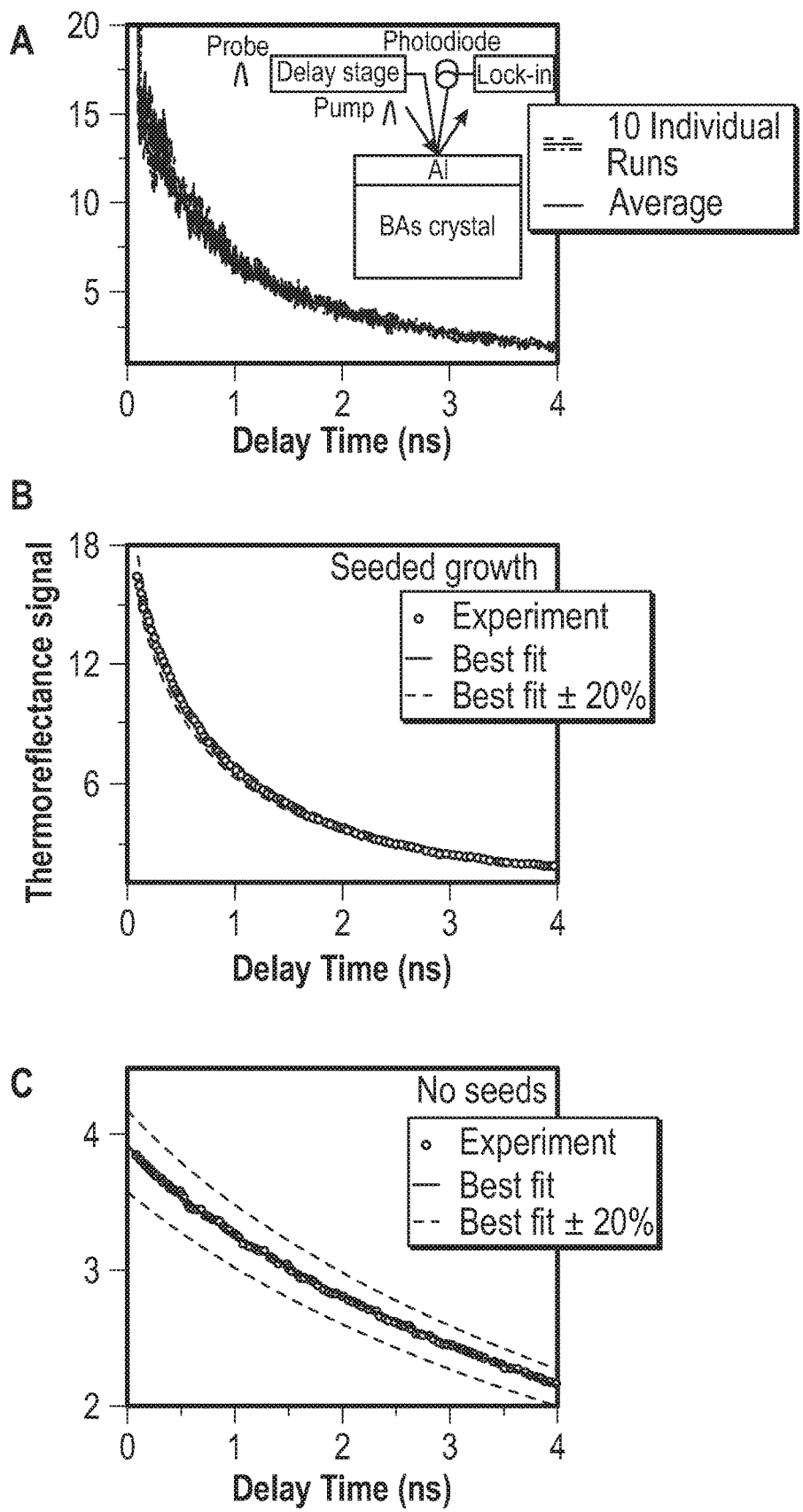
FIG. 40 illustrates the thermal conductivities of BAs crystals measured using TDTR. In Panel (a), ten representative thermoreflectance curves and their average is shown. Panel (b) illustrates the results of directly fitting (solid line)

The thermal conductivity of our sub-millimeter sized BAs crystals was measured using a noncontact optical pump-probe TDTR. In this method an aluminum-coated BAs crystal was heated using a high-power ultrashort (100 fs) pulsed pump laser and monitors the subsequent cooling process with a low-power probe pulse (100 fs, FIG. 40). The aluminum coating serves as both a laser absorber and a reflectance-based thermometer. The measured cooling curve was fitted to a Fourier heat conduction model to get the sample thermal conductivity. The pump power was usually modulated to increase the signal-to-noise ratio. This generates a complex thermoreflectance signal which was recorded using a lock-in amplifier. On the crystal shown in FIG. 38(c), thermal conductivities in the range of about 80 W m$^{-1}$K$^{-1}$ to over 300 W m$^{-1}$K$^{-1}$ were measured at different locations. Meanwhile, we observed variations in the surface conditions and Raman spectra across the sample, which might have contributed to large variations in the measured thermal conductivity. As an example, FIGS. 40(a) and 40(b) present the measured and fitted thermoreflectance curves (the ratio between the real and the imaginary part, or equivalently, the phase of the complex signal) at a select spot, which yields a thermal conductivity as high as 351±21 W m$^{-1}$K$^{-1}$. In comparison, the highest thermal conductivities of the crystals shown in FIGS. 38(a) and 38(b) were measured to be 55.9±0.3 W m$^{-1}$ K$^{-1}$ [see FIG. 40(c)] and 131±13 W m$^{-1}$K$^{-1}$, respectively. The interface thermal conductance between the aluminum coating and the BAs crystal [FIG. 38(c)] was simultaneously fitted to be 81±8 MW W m$^{-2}$ K$^{-1}$, indicating good interface quality. Changing the fitted thermal conductivity by 20% resulted in a large discrepancy between the computed and measured data, suggesting good experimental sensitivity. The fitted material properties lead to excellent agreement between computed and measured thermoreflectance signals in both the phase and the amplitude, further confirming the experimental reliability. Additionally, the electrical conductivity was measured to be about 164 S/m using the four-probe method, and the electron thermal conductivity as estimated by the Wiedemann-Franz relationship was on the order of 1 mW m$^{-1}$ K$^{-1}$. Although the measured thermal conductivity is an order-of-magnitude lower than the theoretical predictions for single crystal BAs, this value is higher than any of the previously reported values for single crystal BAs and comparable to the highest thermal conductivities from traditional heat conductors.

To summarize, compared with previous reports, BAs single crystals with a larger size (400-600 □m), better morphology, and higher quality were obtained by placing tiny BAs single crystals as seeds in an improved CVT system in this work. These higher quality single crystals indeed demonstrate a higher thermal conductivity of about 351 W m$^{-1}$ K$^{-1}$ at room temperature, which is about twice as high as previously reported experimental values for BAs crystals. The seeds played a key role in the growth process, especially for the crystal size and quality.

Mechanical Properties of BAs Single Crystals

In this example, the mechanical properties of BAs, i.e., bulk modulus (B), Young's modulus (E), hardness (H), fracture toughness (KIC), and elastic constants (Cij) were studied. Millimeter scale high-quality BAs single crystals were prepared by a seeded chemical vapor transport method as described herein. Vickers hardness (Hv) was measured with a standard square pyramidal diamond indenter on the {111} face of the BAs bulk single crystals by using a microhardness tester (KB 5 BVZ). The applied forces were 0.059, 0.078, 0.088, 0.196, 0.245, 0.294, 0.392, and 0.49 N, respectively. The loading and dwell times were both 20 s. Hv was determined from Hv=1854.4 F/L$^2$, where F is the applied load in Newtons and L is the mean of the two diagonals of the Vickers indentation in micrometers. At least five indentations obtained at each load were used to determine the asymptotic hardness value. Radial cracks formed on the crystal plane at the load of 0.49 N were used to determine the fracture toughness (KIC) using the equation KIC=0.016 (E/Hv)$^{0.5}$ F/C$^{1.5}$, where C (in micrometers) is the average length of the radial cracks and E is the Young's modulus (in gigapascals) of the BAs single crystals. The indentation hardness at the peak load and the Young's modulus (E) were derived from the load displacement curves established by the three-sided pyramidal Berkovich diamond indenter (Keysight Nano Indenter G200). The indenter parameters were calibrated by measuring a standard fused quartz piece. The applied loading time to the peak load, the holding time, and the unloading time were 15, 10, and 15 s, respectively. To obtain the pressure-volume (P-V) equation of state (EOS), room temperature compression was carried out by using a diamond anvil cell (DAC) device. The original BAs bulk single crystal was ground into fine BAs crystal powder, and then the powder was loaded into a symmetrical DAC with 200 □m diamond culets. The rhenium gasket was pre-indented to a thickness of ~30 □m and a 100 □m-diameter aperture was then drilled at the center. Silicone oil was used as the pressure-transmitting media, and the drilled hole served as the sample chamber during compression. The pressure inside the DAC was estimated by the pressure-induced peak shift of ruby fluorescence. The synchrotron X-ray diffraction (XRD) data were collected on the hard X-ray micro-focusing beamline BL15U1 at the Shanghai Synchrotron Radiation Facility (SSRF). This facility provides a monochromatic Xray beam with a wavelength of 0.6199 Å and a beam full width at half maximum (FWHM) of ~2×2 □m$^2$. CeO$_2$ powder was used as a standard sample to calibrate the beam parameters, and the two dimensional image plate patterns were integrated to one-dimensional patterns by using Fit2D software. The resulting diffraction patterns were fitted via Rietveld refinement through a GSASII software package. The pressure-induced volume change and elastic constants were also calculated by using density functional theory (DFT) within the Perdew-Burke-Ernzerhof (PBE) function of the generalized gradient approximation (GGA), as implemented in the CASTEP code. Ultrasoft pseudopotentials were used to describe the interactions between the atomic cores and the valence electrons, where the valence electron configurations for B and As are 2s$^2$2p$^1$ and 4s$_2$4p$^3$, respectively. The theoretical hardness was estimated using the semiempirical hardness model for covalent crystals:

$$Hv(GPa) = 350\frac{N_e^{2/3}e^{-1.191 f_i}}{d^{2.5}}$$

where Hv is the Vickers hardness, d is the bond length between the B and As atoms, $N_e$ is the electron density expressed as the number of valence electrons per cubic angstrom, and $f_i$ is the Phillips ionicity of a crystal composed of B—As bonds. FIGS. 41(a) and 41(b) present the morphology and the X-ray diffraction (XRD) patterns of the large surface of millimeter scale high quality BAs single crystals, respectively. It is clear that most of the single crystals grow with the {111} face as the largest surface when they grow into a plate-like shape. The only two apparent diffraction peaks observed from the {111} and {222} crystal planes, respectively, reflect the good crystallization of the raw BAs single crystals used in this example. The Vickers hardness (Hv) on the {111} crystal plane of BAs single crystals was tested with a four-sided pyramidal diamond indenter. The variations of $H_v$ vs applied loads were recorded, and are shown in FIG. 42(a). An asymptotic hardness of 22.2 GPa was obtained at loads of more than 0.3 N. This is comparable to that of 20 GPa for aluminum oxide (Al$_2$O$_3$) and higher than that of most regular Group III-V binary compounds like aluminum nitride (AlN) and gallium arsenide (GaAs). By using a semiempirical hardness model, the theoretical hardness of the BAs crystal was estimated. With the B—As bond length d=2.086 Å, the valence electron density $N_e$=0.286, and Phillips ionicity $f_i$=0.002, the calculated hardness of BAs is 24.14 GPa, which is consistent with the experimental value of 22 GPa. The measured $H_v$ for the {111} crystal plane of BAs single crystals is over 20 GPa, suggesting that BAs belongs to the class of hard materials. Considering that the {111} crystal plane is the cleavage surface of the cubic structure, the average $H_v$ for the whole BAs single crystal is much higher than the current value. In addition, based on the radial cracks generated from the Vickers hardness test [see the inset in FIG. 42(a)], an average fracture toughness KIC=1.18 MPa m$^{0.5}$ was also estimated, indicating that BAs is brittle. Based on this data, BAs is much more brittle than SiC, BN, and AlN, but it is much more ductile than Si, Ge, GaN, and GaAs.

Figure 43:
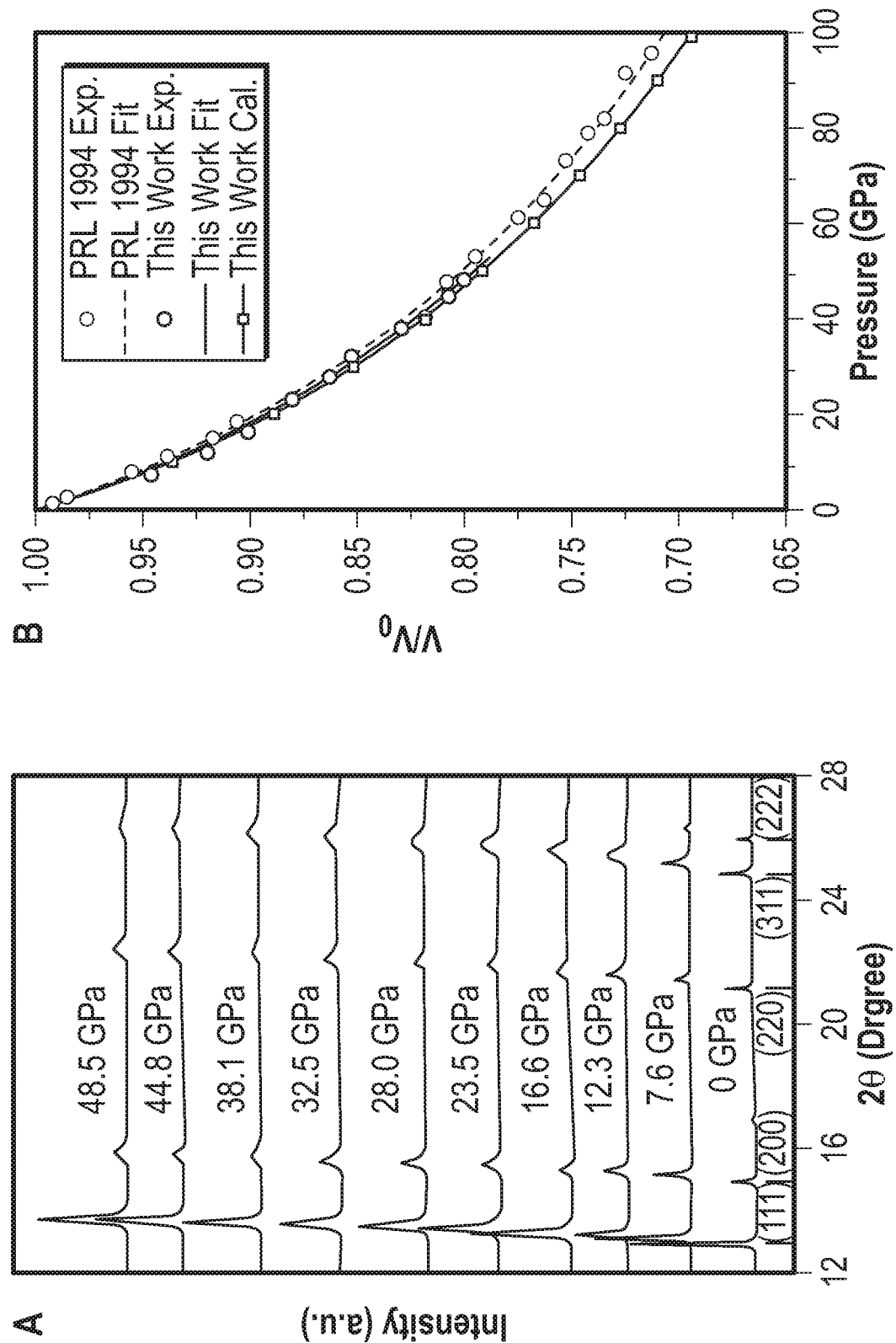

To check the accuracy of the measured Vickers hardness, the indentation hardness values at peak load and reduced modulus ($E_r$) were also measured by a standard three-sided pyramidal Berkovich indenter, based on the load-displacement relationship according to the Oliver-Pharr model. In this method, the indentation hardness was estimated by the peak load and the projected area of indentation was determined by the indenter displacement (that is, indentation depth) at peak load and by the indenter geometries. The load displacement curve is shown in FIG. 42(b), from which the indentation hardness of 26.9 GPa at a peak load of 29.4 mN was obtained, a value comparable to that of the Vickers hardness. $E_r$ can be determined by the contact stiffness and the projected area, which are related to the Young's modulus E and the Poisson's ratio of the specimen. By using the calculated Poisson's ratio of 0.11, the obtained Young's modulus E on the {111} crystal plane of the BAs single crystal is 388 GPa, which is close to that of 390 GPa of BP and is only lower than that of SiC and BN. Synchrotron X-ray diffraction was then performed on BAs powder made from these BAs single crystals and was used to determine the volume change ($V/V_0$) of BAs under hydrostatic pressure (P) in a diamond anvil cell (DAC) device, as shown in FIG. 43. With increasing pressure, no additional peak appears, which suggests that there is no phase transition within the studied pressure range at room temperature. As expected, the shift of all of the diffraction peaks to higher angles under pressure indicates compression of the crystal lattice [FIG. 43(a)]. By analyzing the refined diffraction patterns, the equation of state (EOS) for high-quality BAs crystals was obtained and is presented in FIG. 43(b), along with the fitted curve to a Birch third order EOS with the isothermal bulk modulus at zero pressure ($B_0$) and its pressure derivative $B'_0$ $$P = \frac{3}{2}B_0\left(x^{\frac{7}{3}} - x^{\frac{5}{3}}\right)\left[1 + \frac{3}{4}(B'_0 - 4)\left(x^{\frac{2}{3}} - 1\right)\right]$$

where $x = V_0/V$. In order to obtain an accurate modulus, only the volume data below 50 GPa were adopted and fitted, since 50 GPa is the highest hydrostatic pressure under which silicone oil remains a pressure-transmitting medium. The fitting finally results in $B_0 = 142 \pm 5$ GPa and $B'_0 = 3.9 \pm 0.2$, which are in good agreement with the reported values for BAs polycrystalline powders ($148 \pm 6$ GPa and $3.9 \pm 0.3$, respectively). By using first-principles calculations, the lattice parameter of the zinc-blende BAs crystal at 1 atm obtained from EOS is 4.817 Å, close to the values of 4.789 Å from XRD refinement and 4.777 Å from the literature. The simulated pressure-induced variation of volume is also presented for comparison with the experimental data [FIG. 42(b)]. It can be seen that the calculated results are in good agreement with current and previous experimental data below 50 GPa, above which there is a small deviation from the previous experimental data due to the removal of hydrostatic pressure in this experiment.

The elastic constants of the ideal zinc-blende BAs crystals can be obtained from the elastic stress-strain relationship through first principles calculations. For zinc-blende structures, only three independent terms, $C_{11}$, $C_{12}$, and $C_{44}$, are considered, representing deformation due to stress along different directions. The calculated $C_{11}$, $C_{12}$, and $C_{44}$ are 263, 62, and 143 GPa, respectively. The derived bulk, shear, and Young's moduli, i.e., B, G, and E, respectively, for hypothetical isotropic BAs polycrystalline aggregates are 131.9, 132.9, and 298.5 GPa, respectively, calculated by adopting the Voigt-Reuss-Hill (VRH) approximation. Although slightly smaller, the B value resulting from our calculation nearly matches that of the previous report by Daoud et al. in 2015 and the experimental B value. The large difference in E between theory and experiment might be due to the experiment being done on the {111} face of the zinc-blende BAs single crystal. To calculate the E on the {111} face, the cubic structure had to be reconstructed into one with an ABCABC atomic-layer arrangement in order to make the {111} planes of the cubic lattice become the planes along the x- and y-coordinate axes of the reconstructed lattice. E along the z axis of the reconstructed lattice, i.e., E on the {111} face of the BAs crystal, could then be directly calculated, resulting in a value of 345.68 GPa, which is then comparable to the experimental value of 388 GPa derived from indentation measurements.

As a Group III-V cubic compound that has re-attracted scientists' attention very recently, BAs benefits greatly from its moderate bandgap of less than 2.0 eV and its high calculated carrier mobility of more than 1000 $cm^2$ $V^{-1}$ $s^{-1}$, as well as its high thermal conductivity. It is hence very interesting to compare the basic mechanical properties of BAs with those of other important semiconductors. It is noted that BAs has superior properties, with hardness clearly higher than those of Si, AlN, and GaAs, which are widely used and studied for their semiconducting features. Furthermore, BAs crystals also have a high Young's modulus, indicating their high stiffness and only slight shape change under elastic loads. All of the other mechanical properties of BAs studied are also higher or at least comparable to those of the representative semiconductors except cubic SiC. These characteristics potentially enhance not only the fabrication processes of BAs, but also its usage and applications. Combined with its remarkable ultrahigh thermal conductivity and semiconducting nature, the good mechanical performance parameters make BAs quite suitable for application in smaller, more powerful, and more efficient modern electronic devices. In summary, the basic mechanical properties of zinc-blende BAs single crystals were studied by experimental tests and theoretical calculations. Parameters such as bulk modulus, Young's modulus, shear modulus, fracture toughness, and hardness were investigated using high-quality samples. The good agreement between the measurements and the calculations confirms the reliability of our data. The realized ultrahigh thermal conductivity, the calculated semiconducting band structure, and the measured good mechanical performance of zinc-blende BAs guarantee that it can serve as an option for future industrial upgrades and designs for electronic devices.

Having described various methods, systems, and product, certain embodiments can include, but are not limited to:

In a first embodiment, a method for growing bulk boron arsenide (BA) crystals comprises utilizing a seeded chemical vapor transport (CVT) growth mechanism to produce single BAs crystals which are used for further CVT growth, wherein a sparsity of nucleation centers is controlled during the further CVT growth.

A second embodiment can include the method of the first embodiment, wherein the single BAs crystals have a lateral dimension of less than or equal to 5, 4, 3, 2, or 1 micrometer.

A third embodiment can include the method of the first embodiment, further comprising increasing a CVT growth time to increase the crystal size of the bulk BAs crystals.

A fourth embodiment can include the method of the first embodiment, wherein the bulk BAs crystals have a size sufficient for evaluation via transport measurement techniques.

A fifth embodiment can include the method of the first embodiment, wherein the bulk BAs crystals have a size of at least about 4×2×1 millimeters.

A sixth embodiment can include the method of the first embodiment, wherein the seeded CVT growth mechanism further comprises growing the single BAs crystals in a tube furnace with a temperature gradient for vapor transport.

A seventh embodiment can include the method of the sixth embodiment, wherein the seeded CVT growth mechanism further comprises positioning source materials comprising boron and arsenic at one end or 'source material side' of a fused quartz tube and the single BAs crystals at the other end or 'seed side' of the tube to serve as seed crystals.

An eighth embodiment can include the method of the seventh embodiment, wherein the source materials comprise pure boron bulk particles, arsenic lumps, and iodine powder.

A ninth embodiment can include the method of the eighth embodiment, wherein the ratio of arsenic to iodine (As:I) is about 5:1 to 50:1; 20:1.

A tenth embodiment can include the method of the seventh embodiment, further comprising sealing the quartz tube under vacuum and placing the sealed quartz tube in a tube furnace.

An eleventh embodiment can include the method of the ninth embodiment, wherein the vacuum comprises a pressure of about 10-4 Torr.

A twelfth embodiment can include the method of the ninth embodiment, wherein the tube furnace is a horizontal tube furnace.

A thirteenth embodiment can include the method of the seventh embodiment, further comprising establishing and maintaining the temperature gradient by setting the seed side of the tube at 650° C. to 900° C. or 780° C. and the source material side at 890° C. or 800° C.-1000° C.

A fourteenth embodiment can include the method of the thirteenth embodiment, further comprising growing the single BAs crystals during a first growth period, and utilizing the resulting BAs crystals from the seed side of the quartz tube to seed a second growth period.

A fifteenth embodiment can include the method of the fourteenth embodiment, further comprising optimizing seed crystal quality and distribution during the second growth period to obtain the bulk BAs crystals.

A sixteenth embodiment can include the method of the fourteenth embodiment, wherein utilizing the resulting BAs crystals from the seed side of the quartz tube to seed the second growth period comprises removing single BAs crystals from the seed side after the first growth period, cleaning the removed BAs crystals, and selecting highest quality BAs crystals for positioning on the seed side of the quartz tube during the second growth period.

A seventeenth embodiment can include the method of the sixteenth embodiment, wherein cleaning the BAs crystals comprises washing with aqua regia, rinsing with deionized water, or both.

An eighteenth embodiment can include the method of the fourteenth embodiment, wherein the first growth period, the second growth period, or both comprise a time duration of about 1-100 or 14 days.

A nineteenth embodiment can include the method of the fourteenth embodiment, wherein utilizing the resulting BAs crystals from the seed side of the quartz tube to seed the second growth period comprises selecting less than about 5, 4, 3, 2, or 1 of the single BAs crystals from the seed side of the quartz tube as seeds during the second growth period.

A twentieth embodiment can include the method of the nineteenth embodiment, wherein the single BAs crystals from the seed side of the quartz tube that are utilized as seeds for the second growth period are positioned a specific distance apart on the seed side of the quartz tube for the second growth period.

A twenty first embodiment can include the method of the twentieth embodiment, wherein two of the single BAs crystals from the seed side of the quartz tube obtained via the first growth period are utilized as seeds for the second growth period.

A twenty second embodiment can include the method of the twenty first embodiment, wherein the specific distance apart comprises about 1 centimeter (cm).

A twenty third embodiment can include the method of the first embodiment, wherein the CVT growth mechanism includes a first growth period for a first time duration, or both a first growth period for a first time duration and a second growth period for a second time duration.

A twenty fourth embodiment can include the method of the twenty third embodiment, wherein the first time duration, the second time duration, or both comprise from about one to about one hundred (1 to 100) days.

In a twenty fifth embodiment, bulk BAs crystals can be produced via the method of any one of the first to twenty fourth embodiments.

A twenty sixth embodiment can include the bulk BAs crystals of the twenty fifth embodiment, wherein the bulk BAs crystals exhibit peak and average thermal conductivity ($\kappa$) values that show a rapid decrease with increasing temperature, evidence of lattice anharmonicity/dominant anharmonic phonon-phonon scattering.

A twenty seventh embodiment can include the bulk BAs crystals of the twenty fifth embodiment, having a local room temperature thermal conductivity exceeding 1000 W m−1 $K^{-1}$, an average bulk thermal conductivity of about 900 W m−1 $K^{-1}$, or both.

While various exemplary embodiments have been shown and described, modifications thereof can be made by one skilled in the art without departing from the spirit and teachings of the disclosure. The embodiments described herein are exemplary only, and are not intended to be limiting. Many variations and modifications of the subject matter disclosed herein are possible and are within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_L$ and an upper limit, $R_U$ is disclosed, any number falling within the range is specifically disclosed. In particular, the following numbers within the range are specifically disclosed: $R=R_L+k*(R_U-R_L)$, wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present disclosure. Thus, the claims are a further description and are an addition to the embodiments of the present disclosure. The discussion of a reference is not an admission that it is prior art to the present disclosure, especially any reference that may have a publication date after the priority date of this application. The disclosures of all patents, patent applications, and publications cited herein are hereby incorporated by reference, to the extent that they provide exemplary, procedural, or other details supplementary to those set forth herein.

ADDITIONAL DESCRIPTION

The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Alternative embodiments that result from combining, integrating, and/or omitting features of the embodiment(s) are also within the scope of the disclosure. While compositions and methods are described in broader terms of "having", "comprising," "containing," or "including" various components or steps, the compositions and methods can also "consist essentially of" or "consist of" the various components and steps. Use of the term "optionally" with respect to any element of a claim means that the element is required, or alternatively, the element is not required, both alternatives being within the scope of the claim.

Numbers and ranges disclosed above may vary by some amount. Whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an", as used in the claims, are defined herein to mean one or more than one of the element that it introduces. If there is any conflict in the usages of a word or term in this specification and one or more patent or other documents, the definitions that are consistent with this specification should be adopted.

While preferred embodiments of the invention have been shown and described, modifications thereof can be made by one skilled in the art without departing from the teachings of this disclosure. The embodiments described herein are exemplary only, and are not intended to be limiting. Many variations and modifications of the invention disclosed herein are possible and are within the scope of the invention.

Numerous other modifications, equivalents, and alternatives, will become apparent to those skilled in the art once the above disclosure is fully appreciated. It is intended that the following claims be interpreted to embrace all such modifications, equivalents, and alternatives where applicable. Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the detailed description of the present invention. The disclosures of all patents, patent applications, and publications cited herein are hereby incorporated by reference. Unless expressly stated otherwise, the steps in a method claim may be performed in any order and with any suitable combination of materials and processing conditions.

The invention claimed is:

1. A method for growing bulk boron arsenide (BAs) crystals, the method comprising:
   utilizing a seeded chemical vapor transport (CVT) growth mechanism to produce single BAs crystals,
   using at least a portion of the single BAs crystals for further CVT growth to produce a bulk BAs crystal, wherein a sparsity of nucleation centers is controlled during the further CVT growth.

2. The method of claim 1, wherein the single BAs crystals have a lateral dimension of less than or equal to 5 micrometers.

3. The method of claim 1, further comprising: increasing a CVT growth time to increase the crystal size of the bulk BAs crystal.

4. The method of claim 1, wherein the bulk BAs crystal has a size sufficient for evaluation via transport measurement techniques.

5. The method of claim 1, wherein the bulk BAs crystal has a size of at least about 4×2×1 millimeters.

6. The method of claim 1, further comprising: growing the single BAs crystals in a tube furnace with a temperature gradient for vapor transport.

7. The method of claim 6, further comprising: positioning source materials comprising boron and arsenic at one end of a fused quartz tube and the single BAs crystals at the other end of the tube to serve as seed crystals.

8. The method of claim 7, wherein the source materials comprise pure boron bulk-particles, arsenic lumps, and iodine powder.

9. The method of claim 8, wherein the ratio of arsenic to iodine (As:I) is about 5:1 to 50:1.

10. The method of claim 7, further comprising: sealing the quartz tube under vacuum and placing the sealed quartz tube in the tube furnace.

11. The method of claim 9, wherein the vacuum comprises a pressure of less than or equal to $10^{-4}$ Torr.

12. The method of claim 9, wherein the tube furnace is a horizontal tube furnace.

13. The method of claim 7, further comprising: establishing and maintaining the temperature gradient by setting the seed side of the tube at a temperature between 650° C. to 900° C. and the source material side at a temperature between 800° C. and 1000° C.

14. The method of claim 13, further comprising: growing the single BAs crystals during a first growth period, and utilizing the resulting BAs crystals from the seed side of the quartz tube to seed a second growth period to produce the bulk BAs crystal.

15. The method of claim 14, further comprising: optimizing seed crystal quality and distribution during the second growth period to obtain the bulk BAs crystals.

16. The method of claim 14, wherein utilizing the resulting BAs crystals from the seed side of the quartz tube to seed the second growth period comprises:
   removing single BAs crystals from the seed side after the first growth period;
   cleaning the removed BAs crystals; and
   selecting highest quality BAs crystals for positioning on the seed side of the quartz tube during the second growth period.

17. The method of claim 16, wherein cleaning the BAs crystals comprises:
   washing with nitric acid, aqua regia, or both; and
   rinsing with an alcohol, deionized water, or both.

18. The method of claim 14, wherein the first growth period, the second growth period, or both comprise a time duration of about 1-100 days.

19. The method of claim 14, wherein utilizing the resulting BAs crystals from the seed side of the quartz tube to seed the second growth period comprises selecting less than about 5 of the single BAs crystals from the seed side of the quartz tube as seeds during the second growth period.

20. The method of claim 19, wherein the single BAs crystals from the seed side of the quartz tube that are utilized as seeds for the second growth period are positioned a specific distance apart on the seed side of the quartz tube for the second growth period.

21. The method of claim 20, wherein two of the single BAs crystals from the seed side of the quartz tube obtained via the first growth period are utilized as seeds for the second growth period.

22. The method of claim 21, wherein the specific distance apart comprises about 1 centimeter (cm).

23. The method of claim 1, wherein the CVT growth mechanism includes a first growth period for a first time duration, or both a first growth period for a first time duration and a second growth period for a second time duration.

24. The method of claim 23, wherein the first time duration, the second time duration, or both comprise from about one to about one hundred days.

25. The method of claim 1, wherein the bulk BAs crystal has at least one dimension greater than 2 mm.

26. The method of claim 25, wherein the bulk BAs crystal exhibits peak and average thermal conductivity ($\kappa$) values that show a rapid decrease with increasing temperature, evidence of lattice anharmonicity/dominant anharmonic phonon-phonon scattering.

27. The method of claim 25, wherein a local room temperature thermal conductivity is equal to or greater than 1000 W $m^{-1}$ $K^{-1}$, an average bulk thermal conductivity is equal to or greater than 900 W $m^{-1}$ $K^{-1}$, or both.

* * * * *